(12) United States Patent
Oyama et al.

(10) Patent No.: US 11,337,348 B2
(45) Date of Patent: May 17, 2022

(54) COMPONENT FEEDING DEVICE AND METHOD

(71) Applicant: YAMAHA HATSUDOKI KABUSHIKI KAISHA, Iwata (JP)

(72) Inventors: Kazuyoshi Oyama, Shizuoka (JP); Haruyasu Fujita, Shizuoka (JP); Ryouta Masuda, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 136 days.

(21) Appl. No.: 16/629,281

(22) PCT Filed: Aug. 1, 2017

(86) PCT No.: PCT/JP2017/027922
§ 371 (c)(1),
(2) Date: Jan. 7, 2020

(87) PCT Pub. No.: WO2019/026185
PCT Pub. Date: Feb. 7, 2019

(65) Prior Publication Data
US 2020/0214183 A1    Jul. 2, 2020

(51) Int. Cl.
*H05K 13/04* (2006.01)
*H05K 13/02* (2006.01)

(52) U.S. Cl.
CPC ......... *H05K 13/0419* (2018.08); *H05K 13/02* (2013.01)

(58) Field of Classification Search
CPC ............................ H05K 13/02; H05K 13/0419
See application file for complete search history.

(56) References Cited

U.S. PATENT DOCUMENTS 4,586,670 A * 5/1986 Vancelette ......... H05K 13/0419
                                                    156/750
5,588,614 A * 12/1996 Takada ............... H05K 13/0417
                                                    242/538.2
(Continued)

FOREIGN PATENT DOCUMENTS

JP           4291866 B2 *  7/2009
JP        2011-155181 A    8/2011
(Continued)

OTHER PUBLICATIONS

International Search Report issued in PCT/JP2017/027922; dated Oct. 31, 2017.

*Primary Examiner* — Carl J Arbes
(74) *Attorney, Agent, or Firm* — Studebaker & Brackett PC

(57) ABSTRACT

A component feeding device includes a cover tape lifting portion that carries out a lifting process of lifting a cover tape of a component storage tape, which travels along first guide surface portions, and a cover tape post-processing portion that carries out post-processing. The first guide surface portions are formed into curved shapes. The cover tape lifting portion includes a lifting extent adjusting portion that continuously increases an extent of lifting of the cover tape off a carrier tape. The cover tape post-processing portion includes an upper regulating portion that pushes the cover tape having been subjected to the lifting process outward in a tape width direction. The gap between the first guide surface portions and the upper regulating portion is determined such that the gap becomes narrower as the gap extends from the upstream side to the downstream side in the tape send-off direction.

20 Claims, 30 Drawing Sheets

(56) References Cited

U.S. PATENT DOCUMENTS 6,202,913 B1 * 3/2001 Takada .............. H05K 13/0417
226/120
6,402,452 B1 6/2002 Miller et al.

FOREIGN PATENT DOCUMENTS

| JP | 2011-155182 A | 8/2011 |
| JP | 2012-009579 A | 1/2012 |
| JP | 2014-154691 A | 8/2014 |
| JP | 2014-157933 A | 8/2014 |
| JP | 2015-115412 A | 6/2015 |

* cited by examiner

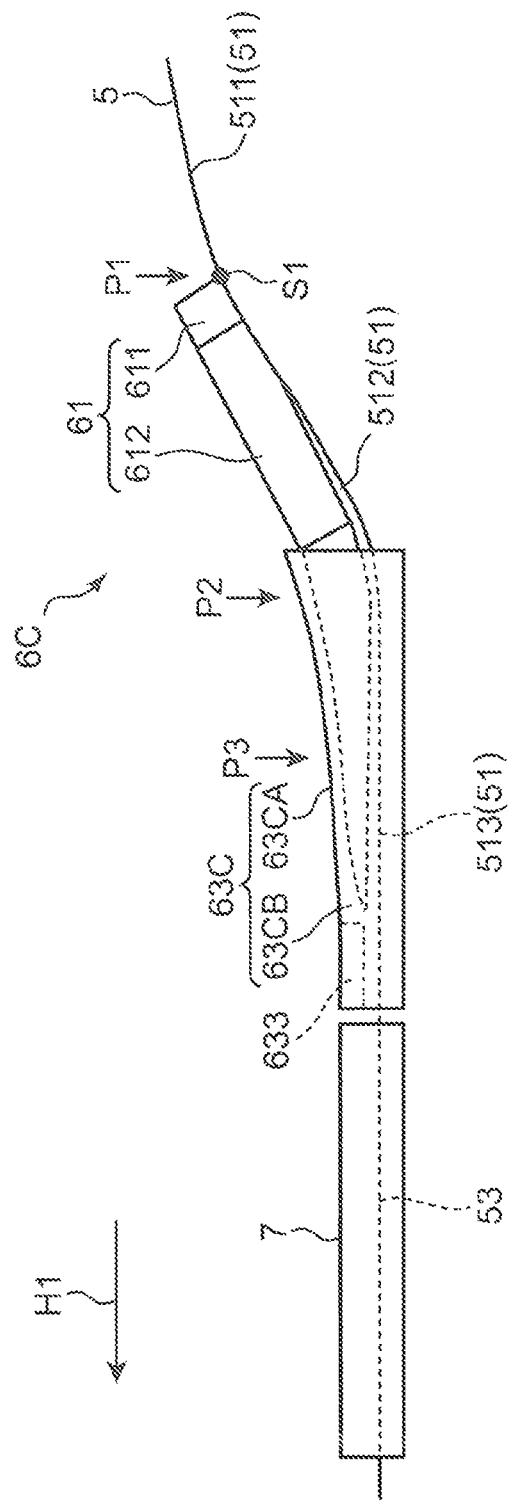

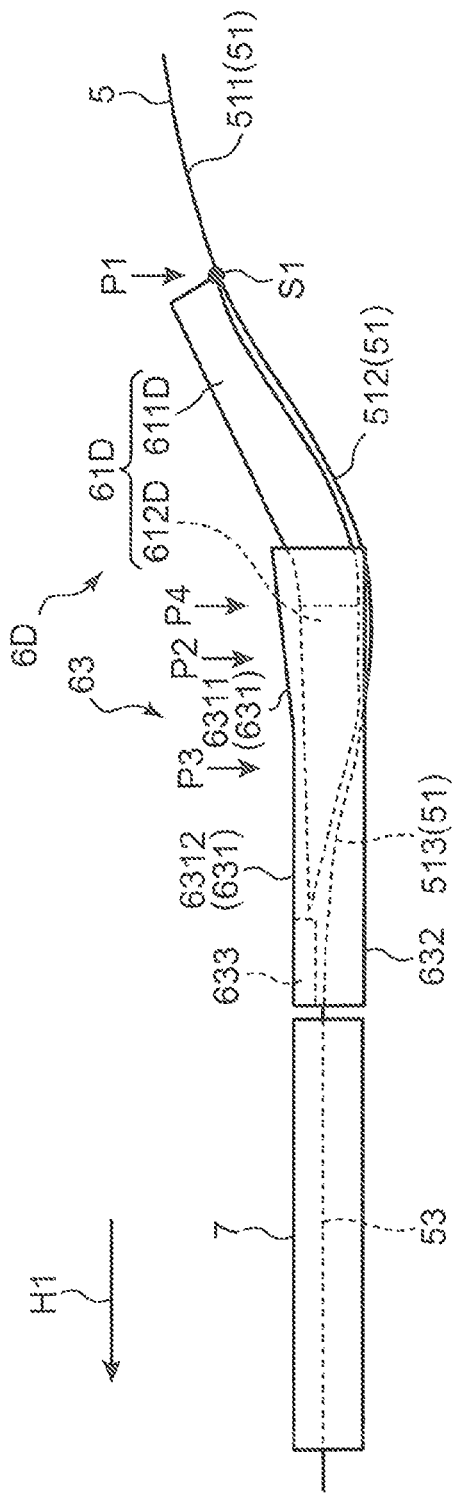

COMPONENT FEEDING DEVICE AND METHOD

CROSS-REFERENCE TO RELATED APPLICATION

This application is a National Stage of International Patent Application No. PCT/JP2017/027922, filed Aug. 1, 2017, the entire content of which is incorporated herein by reference.

BACKGROUND

Technical Field

The present disclosure relates to a component feeding device and a component feeding method for feeding components stored in a component storage tape, and to a component mounter having the component feeding device.

Background Art

A component mounter for mounting (packaging) electronic components (which will hereinafter be simply referred to as "components") on a board, such as a printed wiring board, is equipped with a component feeding device that supplies a component to a component take-out position. As the component feeding device, a device that uses a component storage tape storing components therein is known. The component storage tape is composed of a carrier tape having component storage portions in which components are stored, and a cover tape that is pasted on the carrier tape in such a way as to cover the component storage portions. The component feeding device of this type is disclosed, for example, in JP-A-2011-155181.

The component feeding device (feeder) disclosed in JP-A-2011-155181 includes a tape chute serving as a traveling path for a component storage tape, and a guide mechanism. This guide mechanism has a cutter that cuts the cover tape of the component storage tape that travels on the tape chute, a cover tape guide that guides the cut cover tape, and an upper lid that covers the tape chute and the cover tape guide from above. The tape chute is formed into a recessed shape along which the component storage tape travels downward and then travels upward.

According to the above component feeding device disclosed in JP-A-2011-155181, the cover tape of the component storage tape, which travels on the tape chute of the recessed shape, is cut by the cutter as a cut part of the cover tape is lifted by the cover tape guide and is pushed outward by the upper lid. This exposes a component in the component storage portion of the component storage tape so that the component can be taken out.

In some cases, on the component storage tape, the carrier tape buckles or deforms when a cut part of the cover tape is lifted and pushed outward to expose the component. An extent of buckling or deformation of the carrier tape tends to increase as a length in a width direction of the component storage tape increases and, consequently, a lifted area of the cover tape gets wider. The extent of buckling or deformation of the carrier tape tends to increase also as a traveling distance that is traveled by the component storage tape when the cut part of the cover tape is lifted and pushed outward gets shorter.

According to the above conventional component feeding device, the tape chute serving as the traveling path for the component storage tape is formed into the recessed shape. This increases the traveling distance that is traveled by the component storage tape when the cut part of the cover tape is lifted and pushed outward by the cover tape guide and the upper lid. In view of the above tendency of the extent of buckling or deformation of the carrier tape, therefore, it may be concluded that preventing the buckling or deformation of the carrier tape may be possible.

However, in the conventional component feeding device, the area of recessed shape of the tape chute has an uppermost upstream end and a lowermost downstream end in a tape send-off direction of the component storage tape and these uppermost upstream end and lowermost downstream end are at the same height. In such a configuration, when the component storage tape travels downward and then travels upward along the tape chute of the recessed shape, a tensile stress develops on the lifted part of the cover tape lifted by the cover tape guide, the tensile stress acting in a direction of heading from a downstream end in the tape send-off direction toward a lifting starting point (point at which the cover tape guide starts its contact with the cover tape). When the tensile stress acts on the lifted part of the cover tape, this stress causes the carrier tape to buckle or deform. Buckling or deformation of the carrier tape leads to the deterioration of traveling performance of the component storage tape, thus resulting in a drop in the efficiency of transferring the component to a component take-out position by the component feeding device.

In the conventional component feeding device, a gap between the area of recessed shape of the tape chute and the upper lid becomes wider gradually between the uppermost upstream end and a lowermost point and becomes narrower gradually between the lowermost point and the lowermost downstream end. In such a configuration, the lifted part of the cover tape lifted by the cover tape guide cannot be pushed outward effectively by the upper lid, and, consequently, an extent of outward spread of the lifted part of the cover tape becomes smaller. A smaller extent of outward spread of the lifted part of the cover tape leads to difficulty in taking out the component at the component take-out position, which leads to a drop in the efficiency of component feeding by the component feeding device.

SUMMARY

The present disclosure has been conceived in view of the above circumstances, and therefore provides a component feeding device capable of efficiently transferring a component stored in a component storage tape to a component take-out position, a component feeding method capable of efficiently feeding the component, and a component mounter having the component feeding device.

A component feeding device according to an aspect of the present disclosure is a component feeding device that transfers a component to a component take-out position, using a component storage tape including a carrier tape having a plurality of component storage portions each storing the component therein, the component storage portions being arranged at given intervals, and a cover tape having both ends in a width direction joined to the carrier tape such that the cover tape covers the component storage portions. The component feeding device includes: a tape send-off unit that sends off the component storage tape having the cover tape on an upper surface side of the component storage tape toward the component take-out position; a pair of guide walls including guide surfaces having sloped portions of curved shapes that guide both lower surface ends of the component storage tape sent off by the tape send-off unit, respectively, the lower surface ends being both ends of a lower surface of the component storage tape in a tape width direction perpendicular to a tape send-off direction, and that have lowermost downstream ends located on a lower side relative to uppermost upstream ends in the tape send-off direction; a lifting portion disposed between the pair of guide walls, the lifting portion coming in contact with the cover tape of the component storage tape that travels as the lower surface ends thereof are guided by the sloped portions of the guide surfaces, and carrying out a lifting process of lifting the cover tape off the carrier tape; and a post-processing portion that carries out post-processing on the cover tape lifted by the lifting portion. The lifting portion includes: a lifting start portion having a contact starting point at which contact with the cover tape starts, the lifting start portion starting lifting of the cover tape off the carrier tape, from the contact starting point; and a lifting extent adjusting portion continuous with a downstream end in the tape send-off direction of the lifting start portion, the lifting extent adjusting portion continuously increasing an extent of lifting of the cover tape off the carrier tape as the component storage tape travels. The post-processing portion includes an upper regulating portion disposed above and facing the sloped portions of the guide surfaces across a gap, the post-processing portion carrying out first post-processing of pushing a lifted part of the cover tape lifted by the lifting portion to outside of a side edge in the tape width direction of the component storage tape while regulating an upward movement of the lifted part to make the component storage portion open to the outside. The gap between the guide surfaces and the upper regulating portion is determined such that the gap becomes narrower as the gap extends from an upstream side to a downstream side in the tape send-off direction.

A component feeding method according to another aspect of the present disclosure is a component feeding method of sending off a component storage tape having a cover tape on an upper surface side of the component storage tape, the component storage tape including a carrier tape having a plurality of component storage portions each storing the component therein, the component storage portions being arranged at given intervals, and the cover tape pasted to the carrier tape in such a way as to cover the component storage portions, to feed the components. The component feeding method includes a tape send-off step of sending off the component storage tape toward a component take-out position while guiding both lower surface ends of the component storage tape, the lower surface ends being both ends in a tape width direction of a lower surface of the component storage tape, respectively, by guide surfaces having sloped portions of curved shapes that have lowermost downstream ends located on a lower side relative to uppermost upstream ends in a tape send-off direction; a lifting step of carrying out a lifting process of lifting the cover tape off the carrier tape, using a lifting portion, such that an extent of lifting of the cover tape off the carrier tape increases continuously on the component storage tape that is sent off as the lower surface ends of the component storage tape are guided by the sloped portions of the guide surfaces; and a post-processing step of carrying out post-processing of pushing a lifted part of the cover tape lifted by the lifting portion to outside of a side edge in the tape width direction of the component storage tape while regulating an upward movement of the lifted part by an upper regulating portion, to make the component storage portion open to outside, using a post-processing portion including the upper regulating portion disposed above and facing the sloped portions of the guide surfaces across a gap. The gap between the guide surfaces and the upper regulating portion is determined such that the gap becomes narrower as the gap extends from an upstream side to a downstream side in the tape send-off direction.

A component mounter according to still another aspect of the present disclosure includes: a component feeding section that feeds a component; and a head unit having a holding piece that holds the component fed by the component feeding section. In the component feeding section, a plurality of the above component feeding devices are arranged.

Objects, features, and advantages of the present disclosure will be clarified through the following detailed description and the accompanying drawings.

BRIEF DESCRIPTION OF THE DRAWINGS

FIG. 21 is a side view of a principle part of a component exposing unit provided as a first modification;

FIG. 22 is a side view of a principle part of a component exposing unit provided as a second modification;

DETAILED DESCRIPTION

A component feeding device and a component mounter according to embodiments of the present disclosure will now be described with reference to drawings. In the following description, the X-axis, the Y-axis, and the Z-axis in the rectangular coordinate system are used to explain directional relations. The X-axis direction is the direction parallel with a horizontal plane, the Y-axis direction is the direction perpendicular to the X-axis direction on a horizontal plane, and the Z-axis direction is the vertical direction perpendicular to both the X and Y directions. One side of the X-axis direction is referred to as "+X-side", and the other side of the same that is opposite to the one side is referred to as "−X-side". One side of the Y-axis direction is referred to as "+Y-side", and the other side of the same that is opposite to the one side is referred to as "−Y-side". One side, i.e., the upper side of the Z-axis direction is referred to as "+Z-side", and the other side, i.e., the lower side of the same that is opposite to the one side is referred to as "−Z-side".

[Configuration of Component Mounter]

Figure 1:
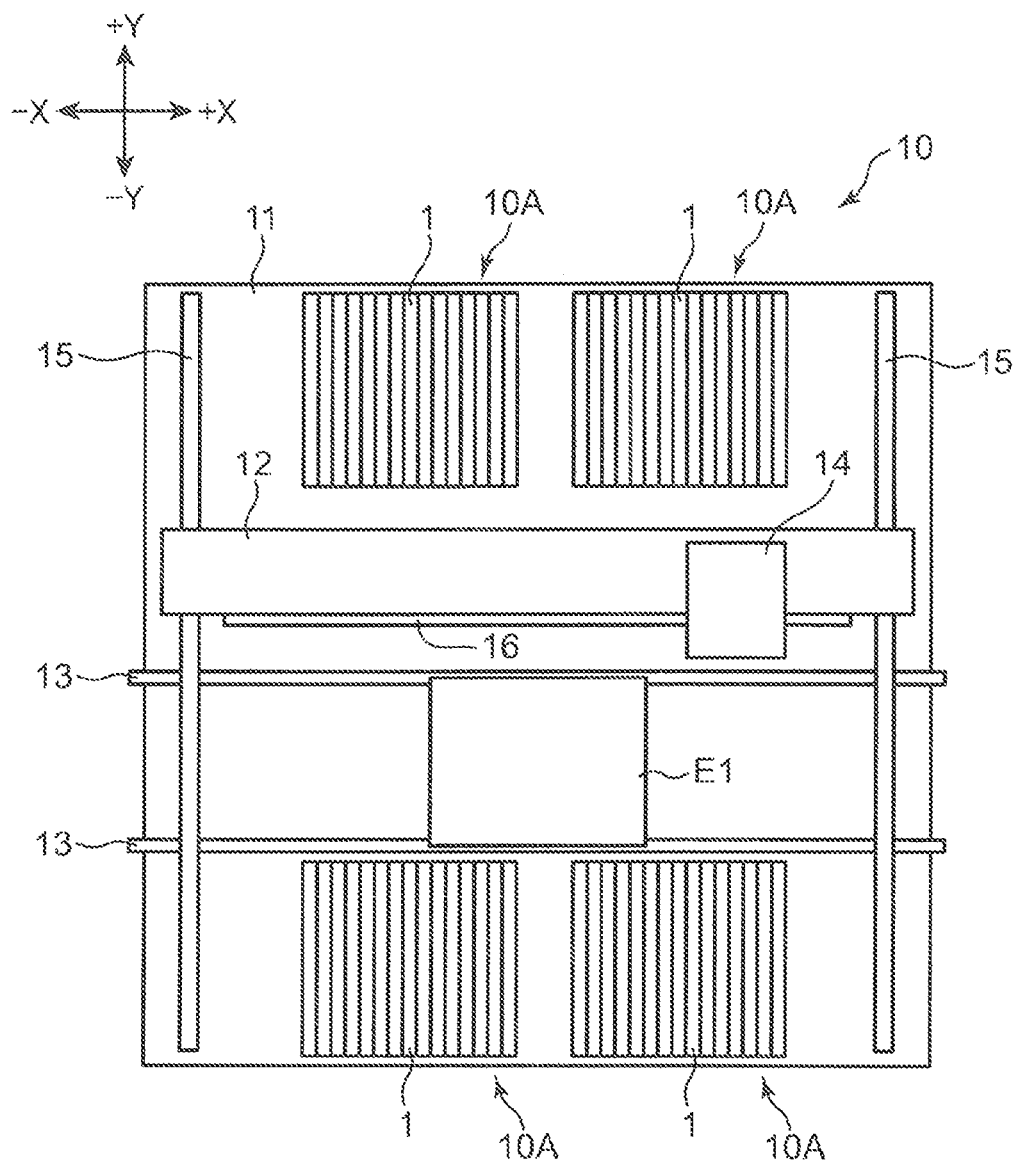
FIG. 1 is a top plan view of a component mounter according to one embodiment of the present disclosure.

FIG. 1 is a top plan view of a component mounter 10 according to one embodiment of the present disclosure. The component mounter 10 is an apparatus that mounts (packages) components on a board E1 to manufacture an electronic circuit board (component-carrying board). The component mounter 10 includes a component feeding section 10A, in which a plurality of component feeding devices 1 are arranged in the X-axis direction, a body frame 11, a mobile frame 12, conveyors 13, a head unit 14, first drive mechanisms 15, and a second drive mechanism 16.

The body frame 11 is a structure in which units making up the component mounter 10 are arranged. The body frame 11 is formed into a substantially rectangular shape in a plan view in the Z-axis direction. The conveyors 13 extend in the X-axis direction and are arranged in the body frame 11. The conveyors 13 transfer the board E1 in the X-axis direction. The board E1 on the conveyors 13 is transferred by the conveyors 13 to a given work location (component mounting location where a component is mounted on the board E1), where the board E1 is positioned.

The mobile frame 12 extends in the X-axis direction, and is supported by the body frame 11 such that the mobile frame 12 is allowed to move in a given direction (Y-axis direction). The mobile frame 12 carries the head unit 14. The head unit 14 is mounted on the mobile frame 12 such that the head unit 14 is allowed to move in the X-axis direction. In other words, the head unit 14 can be moved in the Y-axis direction as a result of movement of the mobile frame 12 in the Y-axis direction and can independently move in the X-axis direction along the mobile frame 12. The head unit 14 can move between the component feeding device 1 and the given work location to which the board E1 is transferred by the conveyors 13. The head unit 14 takes out a component, which is supplied to a component take-out position by the component feeding device 1, and mounts (packages) the taken out component on the board E1.

The head unit 14 has a suction nozzle, which is a holding piece capable of sucking and holding the component to be mounted on the board E1. The suction nozzle can communicate with any one of a negative pressure generator, a positive pressure generator, and the fresh air, via an electric selector valve. Specifically, supplying a negative pressure to the suction nozzle allows the nozzle to suck/hold the component (to take out the component). Afterward, supplying a positive pressure to the suction nozzle causes the nozzle to release the component. According to this embodiment, a holding piece different from the suction nozzle may be adopted. For example, a chuck that grips and holds a component may be used in place of the suction nozzle.

The first drive mechanisms 15 are disposed on a +X-side end and a −X-side end of the body frame 11, respectively. The first drive mechanisms 15 are mechanisms that move the mobile frame 12 in the Y-axis direction. Each first drive mechanism 15 includes a drive motor, a ball screw shaft extending in the Y-axis direction and connected to the drive motor, and a ball nut disposed on the mobile frame 12 and screwed on the ball screw shaft. According to the first drive mechanism 15 configured in this manner, as a result of the rotation of the ball screw shaft caused by the drive motor, the ball nut moves back and forth along the ball screw shaft, which causes the mobile frame 12 to move in the Y-axis direction.

The second drive mechanism 16 is disposed on the mobile frame 12. The second drive mechanism 16 is a mechanism that moves the head unit 14 in the X-axis direction along the mobile frame 12. Similar to the first drive mechanism 15, the second drive mechanism 16 includes, for example, a drive motor, a ball screw shaft extending in the X-axis direction and connected to the drive motor, and a ball nut disposed on the head unit 14 and screwed on the ball screw shaft. According to the second drive mechanism 16 configured in this manner, as a result of the rotation of the ball screw shaft caused by the drive motor, the ball nut moves back and forth along the ball screw shaft, which causes the head unit 14 to move in the X-axis direction.

[Configuration of Component Feeding Device]

Figure 2:
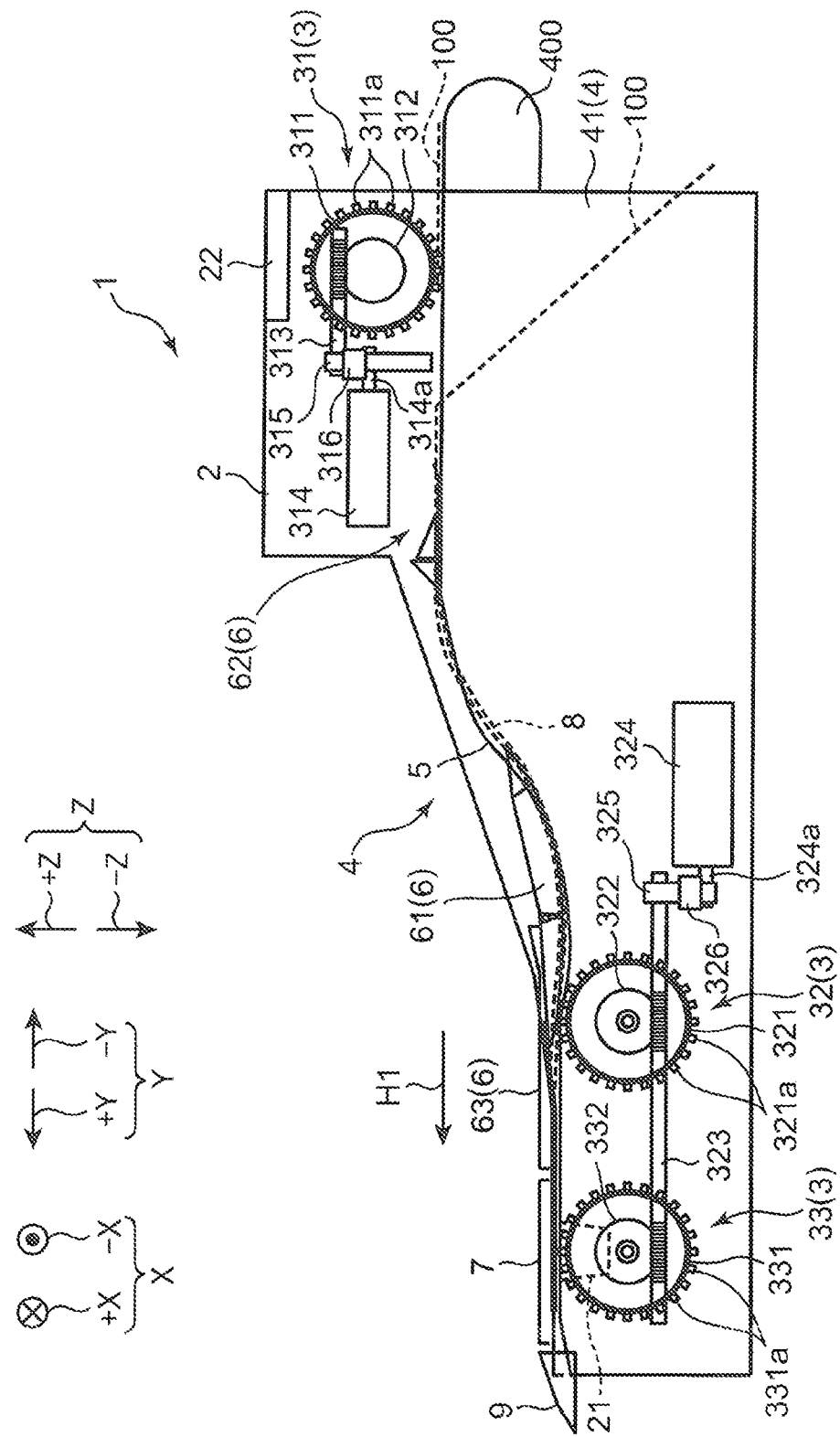
FIG. 2 is a side view of a component feeding device included in the component mounter.

FIG. 2 is a side view of a component feeding device 1 included in the component mounter 10. The component feeding device 1 is a device that executes a component feeding method of sending off a component storage tape 100, which stores components therein, in a tape send-off direction H1 to supply a component to a component take-out position 21. The component supplied to the component take-out position 21 by the component feeding device 1 is taken out from the component storage tape 100 by the head unit 14 included in the component mounter 10, and then is mounted on the board E1.

Figure 3A:
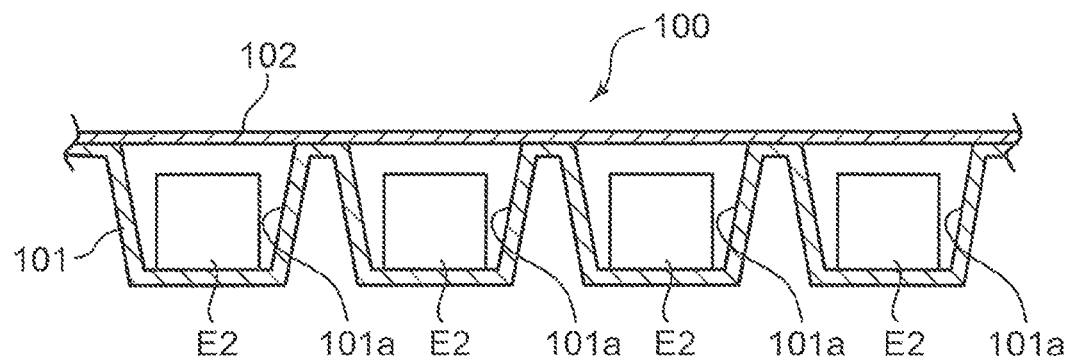
FIGS. 3A and 3B show configuration diagrams of the component storage tape used in the component feeding device.
Figure 3B:
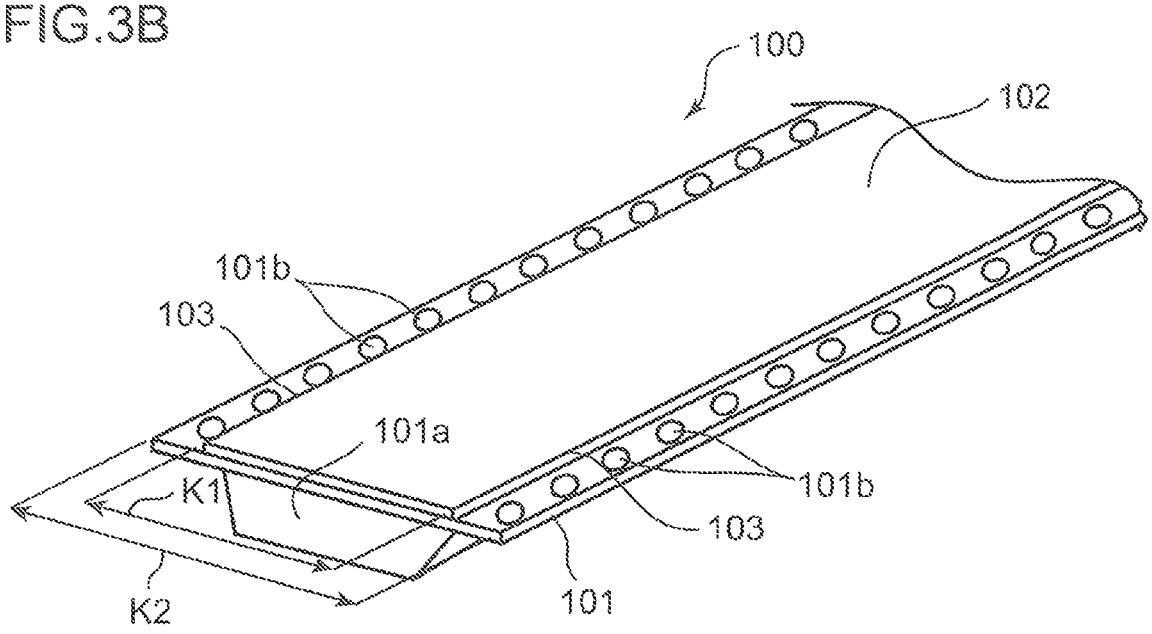

Before description of a configuration of the component feeding device 1, the component storage tape 100 will be described with reference to FIGS. 3A and 3B. FIGS. 3A and 3B show configuration diagrams of the component storage tape 100 used in the component feeding device 1. FIG. 3A is a sectional view showing a section of the component storage tape 100 cut along the tape send-off direction H1. FIG. 3B is a perspective view of the component storage tape 100.

The component storage tape 100 includes a carrier tape 101 and a cover tape 102, and is attached to the component feeding device 1. The carrier tape 101 is a tape having a plurality of component storage portions 101a storing components E2 therein, the component storage portions 101a being arranged at given intervals. The carrier tape 101 has holes 101b arranged at given intervals on its both ends in a width direction. These holes 101b are fitted to teeth of first sprockets 311, second sprockets 321, and third sprockets 331 of a tape send-off unit 3, which will be described later. "The holes 101b of the component storage tape 100 are fitted to the teeth of the first sprockets 311, the second sprockets 321, and the third sprockets 331" indicates a state in which the teeth are fitted in the holes 101b to allow sending off the component storage tape 100 in a motion interlocked with the rotation of the first sprockets 311, the second sprockets 321, and the third sprockets 331.

The cover tape 102 is a tape pasted on the carrier tape 101 in such a way as to cover the component storage portions 101a. The cover tape 102 is pasted on the carrier tape 101 by joining both ends in the width direction of the cover tape 102 to the carrier tape 101. As a result, on the component storage tape 100, joined portions 103, which result from the cover tape 102 being joined to the carrier tape 101, are formed respectively on both ends in the width direction of an upper surface of the carrier tape 101 such that the joined portions 103 extend linearly along edges in the width direction of the cover tape 102. In the width direction of the carrier tape 101, the joined portions 103 are located inward relative to the holes 101b.

According to the component storage tape 100 configured in the above manner, a length K1 between the joined portions 103 formed respectively on both ends in the width direction of the carrier tape 101 is substantially equal to a length in the width direction of the cover tape 102. A length K2 in the width direction (tape width) of the component storage tape 100 is equal to a length in the width direction of the carrier tape 101. The component storage tape 100 is a tape with a large width, having the tape width K2 of, for example, 32 mm or more.

Figure 4:
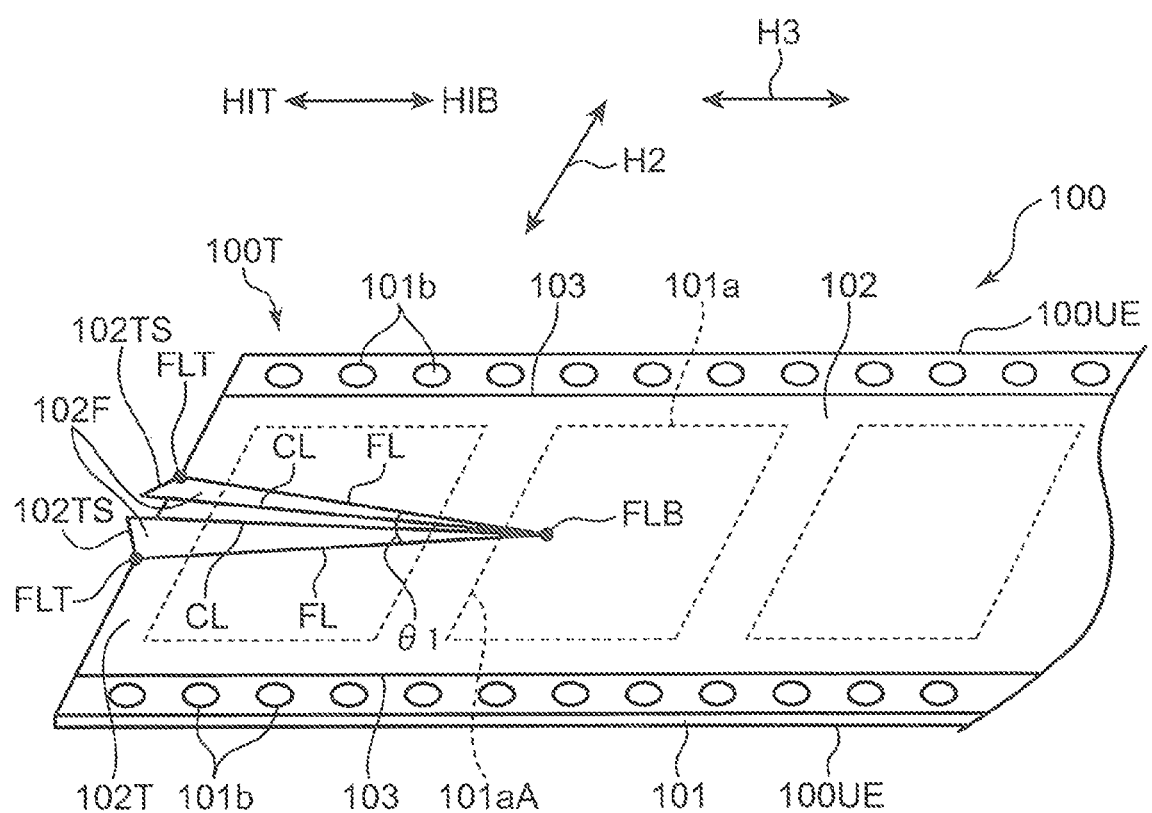
FIG. 4 is a perspective view showing a state of a tip end of the component storage tape.

According to this embodiment, before being attached to the component feeding device 1, the component storage tape 100 has its tip end 100T subjected to processing of a tip end of a tape, as shown in FIG. 4. The processing of a tip end of a tape will be summarized as follows. A tip end 102T of the cover tape 102 is cut along a longitudinal direction H3, from a given position (e.g., central position) between both ends in a tape width direction H2, the given position being on a tip edge 102TS of the cover tape 102. As a result, a pair of cut parts are formed on the tip end 102T of the cover tape 102, the cut parts being divided parts formed on both sides in the tape width direction H2 across a cut line CL. Subsequently, the pair of cut parts are lifted such that respective tip edges 102TS of the cover tape 102 on the pair of cut parts are separated upward from the carrier tape 101. A pair of lifted parts are thus formed. The pair of lifted parts are then each folded along a fold FL. This creates a pair of triangular fold pieces 102F each formed of the tip edge 102TS, the cut line CL, and the fold FL serving as three sides.

By the above processing of a tip end of a tape, the pair of right-triangular fold pieces 102F each having the fold FL serving as an oblique side are formed on the tip end 102T of the cover tape 102 as a result of lifting the cover tape 102 off the carrier tape 101 and folding lifted parts of the cover tape 102. On the tip end 102T of the cover tape 102, end points FLB on the rear end side H1B of respective folds FL of the pair of fold pieces 102F coincide to form a single end point FLB located at a midpoint in the tape width direction H2. In contrast, end points FLT on the tip end side H1T of respective folds FL of the pair of fold pieces 102F are separated from each other in the tape width direction H2 and are located slightly offset to the midpoint to be closer to both ends in the tape width direction H2. The folds FL of the pair of fold pieces 102F extend linearly from the end points FLT on the tip end side H1T to the end point FLB on the rear end side H1B in such a way as to be inwardly diagonal in the tape width direction H2 relative to a longitudinal direction H3. An angle θ1 made by respective folds FL of the pair of fold pieces 102F is an acute angle.

As shown in FIG. 2, the component feeding device 1 includes a device body 2, the tape send-off unit 3, a tape traveling path forming unit 4, a component exposing unit 6, a tape traveling guide unit 7, a lid member 8, and a tape ejection guide unit 9. The device body 2 is an enclosure in which units making up the component feeding device 1 are housed. To the device body 2, an operation unit 22 is annexed. The operation unit 22 is a unit to which an instruction to cause the component feeding device 1 to operate is input by an operator.

Figure 5:
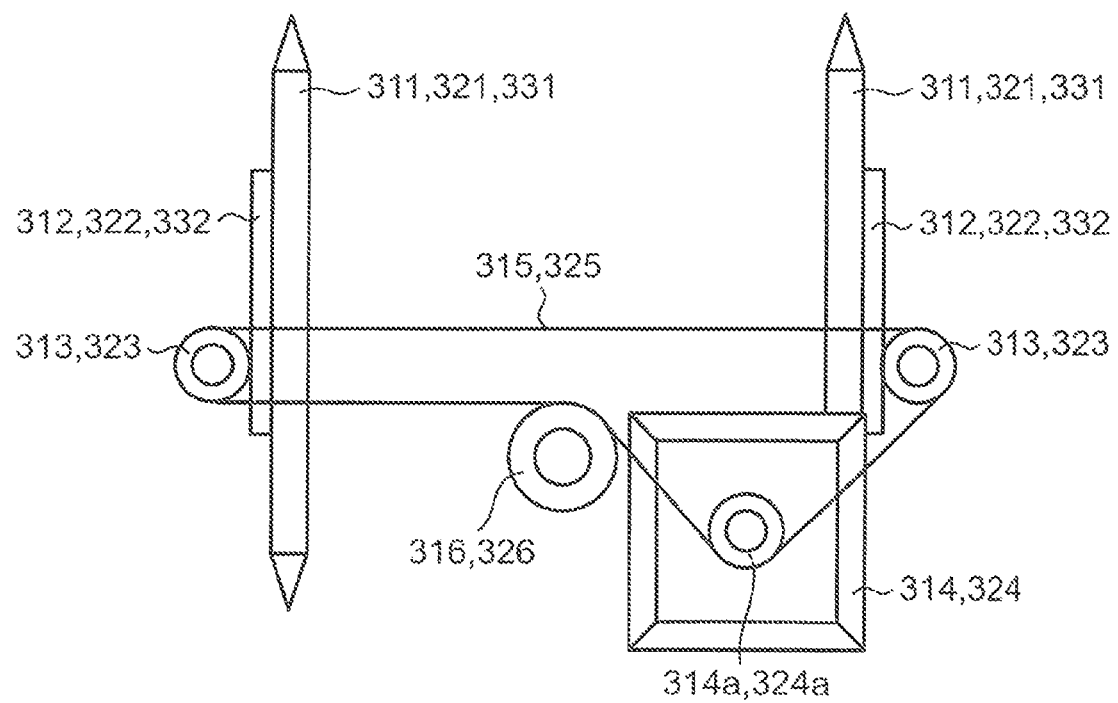
FIG. 5 is a view of a tape send-off unit seen in a tape send-off direction, the tape send-off unit being included in the component feeding device.
Figure 6:
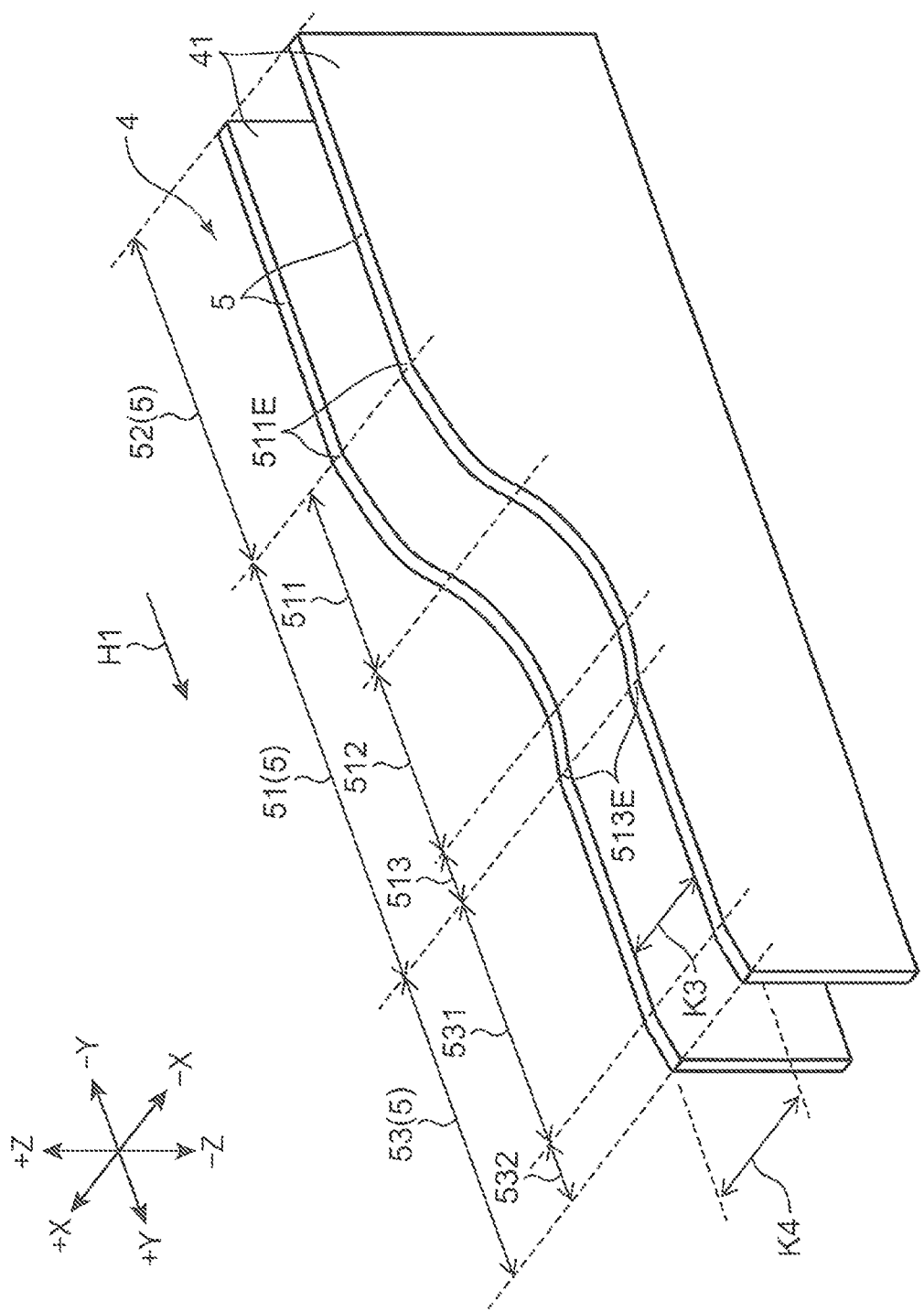
FIG. 6 is a perspective view of a configuration of a tape traveling path forming unit included in the component feeding device.

FIG. 5 is a schematic diagram of a configuration of the tape send-off unit 3 included in the component feeding device 1, showing a view of the tape send-off unit 3 seen in the tape send-off direction H1. FIG. 6 is a perspective view of a configuration of the tape traveling path forming unit 4 included in the component feeding device 1.

The tape send-off unit 3 executes a tape send-off step of a component feeding process to send off the component storage tape 100, which has the cover tape 102 located on its upper surface side, in the given tape send-off direction H1 along the direction of arrangement of the component storage portions 101a, toward the component take-out position 21. The tape send-off direction H1, in which the component storage tape 100 is sent off by the tape send-off unit 3 toward the component take-out position 21, is the direction of heading from the −Y-side to the +Y-side. The tape send-off unit 3 intermittently sends off the component storage tape 100 in the tape send-off direction H1 so that the component storage portions 101a reach the component take-out position 21 one by one at given time intervals. The tape send-off unit 3 is configured to be capable of executing a loading operation of sending off the component storage tape 100 in the tape send-off direction H1 toward the component take-out position 21 and an unloading operation of sending off the component storage tape 100 in a direction of heading from the +Y-side to the −Y-side, which is opposite to the tape send-off direction H1.

The tape traveling path forming unit 4 forms a traveling path through which the component storage tape 100 sent off by the tape send-off unit 3 travels to reach the component take-out position 21. As shown in FIGS. 2 and 6, the tape traveling path forming unit 4 includes a pair of guide walls 41.

The pair of guide walls 41 are a pair of walls arranged counter to each other across a given gap in the X-axis direction and extending in the Y-axis direction in the device body 2. The component storage tape 100 sent off by the tape send-off unit 3 has lower surface ends 100UE (see FIG. 4), which are both ends in a tape width direction H2 (X-axis direction) of a lower surface of the component storage tape 100. These lower surface ends 100UE are guided respectively by guide surfaces 5, which are upper end faces of the pair of guide walls 41. In other words, the traveling path for the component storage tape 100 is formed along the guide surfaces 5 of the pair of guide walls 41. From the pair of guide walls 41, areas are cut out, the areas being occupied by a pair of second sprockets 321 of a second tape send-off portion 32 of the tape send-off unit 3 and a pair of third sprockets 331 of a third tape send-off portion 33 of the same. These second and third sprockets 321 and 331 will be described later.

A distance K3 between respective inner surfaces of the pair of guide walls 41, the inner surfaces being counter to each other, is determined to be substantially equal with the length K1 between joined portions 103 of the component storage tape 100. A distance K4 between respective outer surfaces of the pair of guide walls 41 is determined to be substantially equal with the tape width K2 of the component storage tape 100.

Each of the guide surfaces 5 of the pair of guide walls 41, the guide surfaces 5 guiding the lower surface ends 100UE of the component storage tape 100, includes a first guide surface portion 51, a second guide surface portion 52, and a third guide surface portion 53, as shown in FIG. 6. The first guide surface portion 51 of the guide surface 5 makes up a sloped portion of a curved shape. The first guide surface portion 51 is formed into a curved shape in which a lowermost downstream end in the tape send-off direction H1 is located on the lower side (−Z-side) relative to an uppermost upstream end. The first guide surface portion 51 has a first curved area 511 on the uppermost upstream side in the tape send-off direction H1, a second curved area 512 continuous with the downstream side in the tape send-off direction H1 of the first curved area 511, and a third curved area 513 continuous with the downstream side in the tape send-off direction H1 of the second curved area 512.

The first curved area 511 of the first guide surface portion 51 is formed into an upward curved shape in a view in the X-axis direction. The second curved area 512 of the first guide surface portion 51 is formed into a downward curved shape in a view in the X-axis direction. The third curved area 513 of the first guide surface portion 51 is formed into an upward curved shape in a view in the X-axis direction. In this third curved area 513, a lowermost downstream end 513E in the tape send-off direction H1 is located on the lower side (−Z-side) relative to an uppermost upstream end 511E in the tape send-off direction H1 of the first curved area 511 and is at the same height in the vertical direction (Z-axis direction) as the height of the component take-out position 21.

The second guide surface portion 52 of the guide surface 5 is continuous with the upstream side in the tape send-off direction H1 of the first guide surface portion 51. According to this embodiment, the second guide surface portion 52 is formed in such a way as to extend horizontally from the upstream side to the downstream side in the tape send-off direction H1.

The third guide surface portion 53 of the guide surface 5 is continuous with the downstream side in the tape send-off direction H1 of the first guide surface portion 51, and extends to reach the component take-out position 21. According to this embodiment, the third guide surface portion 53 has a horizontal area 531 and a sloped area 532. The horizontal area 531 is an area that is continuous with the lowermost downstream end 513E of the third curved area 513 of the first guide surface portion 51 and that extends horizontally along the tape send-off direction H1. A downstream end in the tape send-off direction H1 of the horizontal area 531 of the third guide surface portion 53 matches the component take-out position 21 in the tape send-off direction H1. In this manner, the component take-out position 21 is located in the horizontal area 531, which is the horizontal area of the third guide surface portion 53. This configuration improves the accuracy of a process of taking out a component E2 from the component storage tape 100 at the component take-out position 21. The sloped area 532 is an area that is continuous with the downstream side in the tape send-off direction H1 of the horizontal area 531 and that slopes downward in the forward direction.

A configuration of the tape send-off unit 3 will be described specifically with reference to FIGS. 2 and 5. The tape send-off unit 3 includes a first tape send-off portion 31, a second tape send-off portion 32, and a third tape send-off portion 33.

The first tape send-off portion 31 is disposed on upstream ends in the tape send-off direction H1 of the second guide surface portions 52 of the guide surfaces 5. The first tape send-off portion 31 sends off the component storage tape 100 with its tip end provided as a free end, thereby causing the component storage tape 100 to travel on the second guide surface portions 52 and the first guide surface portions 51. The first tape send-off portion 31 includes the pair of first sprockets 311, a pair of first worm wheel 312, a pair of first worms 313, a first servomotor 314, a first belt 315, and a first tension roller 316.

The pair of first sprockets 311 are disc-shaped sprockets that are supported on the device body 2 in such a way as to be capable of rotating respectively around an axis extending in the X-axis direction (tape width direction H2). The pair of first sprockets 311 have a plurality of teeth 311a arranged circumferentially at given intervals. Respective sets of teeth 311a of the pair of first sprockets 311 can be fitted in respective groups of holes 101b formed on both ends in the tape width direction H2 of the carrier tape 101 of the component storage tape 100. The pair of first sprockets 311 each have a built-in one-way clutch that transmits a torque in one direction only.

The pair of first worm wheels 312 are worm gears that are arranged coaxial respectively with the pair of first sprockets 311. The pair of first worms 313 are screw gears that engage respectively with the pair of first worm wheels 312.

The first servomotor 314 is a driving source that generates a driving force that causes the pair of first sprockets 311 to rotate. The first servomotor 314 has a motor output shaft 314a that outputs the driving force. The first belt 315 is an endless belt which is stretched with a tension between the motor output shaft 314a and the pair of first worms 313. The first belt 315 runs through a looped path as a result of the rotation of the first servomotor 314. The first tension roller 316 is a roller that is in contact with the peripheral surface of the first belt 315 to give a tension to the first belt 315.

According to the first tape send-off portion 31 configured in the above manner, the rotation driving force of the first servomotor 314 is transmitted to the pair of first worm wheels 312 via the first belt 315 and the pair of first worms 313, thus causing the pair of first worm wheels 312 to rotate. When the pair of first worm wheels 312 rotate, their rotation causes the pair of first sprockets 311 to rotate in an interlocked motion. As the pair of first sprockets 311 rotate, the first sprockets 311 send off the component storage tape 100 including the carrier tape 101 having the holes 101b in which the teeth 311a of the first sprockets 311 are fitted.

The second tape send-off portion 32 is disposed on the downstream side in the tape send-off direction H1 of the first tape send-off portion 31. The second tape send-off portion 32 is disposed on downstream ends in the tape send-off direction H1 of the first guide surface portions 51 of the guide surfaces 5, that is, disposed on upstream ends in the tape send-off direction H1 of the third guide surface portions 53. The second tape send-off portion 32 receives the component storage tape 100, which is sent off by the first tape send-off portion 31 to travel on the first guide surface portions 51, and sends off the component storage tape 100 toward the component take-out position 21. The second tape send-off portion 32 thus causes the component storage tape 100 to travel on the third guide surface portions 53.

Similar to the first tape send-off portion 31, the second tape send-off portion 32 includes the pair of second sprockets 321, a pair of second worm wheel 322, a pair of second worms 323, a second servomotor 324, a second belt 325, and a second tension roller 326.

The pair of second sprockets 321 are disc-shaped sprockets that are supported on the device body 2 in such a way as to be capable of rotating respectively around an axis extending in the X-axis direction (tape width direction H2). The pair of second sprockets 321 have a plurality of teeth 321a arranged circumferentially at given intervals. On the pair of second sprockets 321, teeth 321a located on the +Z-side in the Z-axis direction are exposed from the guide surfaces 5 of the pair of guide walls 41. Respective sets of teeth 321a of the pair of second sprockets 321 can be fitted in respective groups of holes 101b formed on both ends in the tape width direction H2 of the carrier tape 101 of the component storage tape 100.

The pair of second worm wheels 322 are worm gears that are arranged coaxial respectively with the pair of second sprockets 321. The pair of second worms 323 are screw gears that engage respectively with the pair of second worm wheels 322.

The second servomotor 324 is a driving source that generates a driving force that causes the pair of second sprockets 321 to rotate. The second servomotor 324 has a motor output shaft 324a that outputs the driving force. The second belt 325 is an endless belt which is stretched with a tension between the motor output shaft 324a and the pair of second worms 323. The second belt 325 runs through a looped path as a result of the rotation of the second servomotor 324. The second tension roller 326 is a roller that is in contact with the peripheral surface of the second belt 325 to give a tension to the second belt 325.

According to the second tape send-off portion 32 configured in the above manner, the rotation driving force of the second servomotor 324 is transmitted to the pair of second worm wheels 322 via the second belt 325 and the pair of second worms 323, thus causing the pair of second worm wheels 322 to rotate. When the pair of second worm wheels 322 rotate, their rotation causes the pair of second sprockets 321 to rotate in an interlocked motion. As the pair of second sprockets 321 rotate, the second sprockets 321 send off the component storage tape 100 including the carrier tape 101 having the holes 101b in which the teeth 321a of the second sprockets 321 are fitted.

When the tip end 100T of the component storage tape 100 sent off by the first tape send-off portion 31 reaches the pair of second sprockets 321 and, at the tip end 100T of the component storage tape 100, the holes 101b of the carrier tape 101 are fitted to the teeth 321a of the pair of second sprockets 321, the first servomotor 314 comes to a stop. When the first servomotor 314 stops in this manner, a rotating shaft of the first sprockets 311 stops. However, the one-way clutch interposed between the rotating shaft and each of the first sprockets 311 allows the first sprockets 311 to rotate in a motion interlocked with the travel of the component storage tape 100, which is sent off by the rotation of the pair of second sprockets 321, even when the rotating shaft does not rotate.

The third tape send-off portion 33 is disposed on downstream ends in the tape send-off direction H1 of the horizontal areas 531 of the third guide surface portions 53 of the guide surfaces 5. In other words, the third tape send-off portion 33 is disposed close to the component take-out position 21 on the downstream side in the tape send-off direction H1 of the second tape send-off portion 32. The third tape send-off portion 33 sends off the component storage tape 100 as the third tape send-off portion 33 makes an interlocked motion with the second tape send-off portion 32. The third tape send-off portion 33 receives the component storage tape 100, which is sent off by the second tape send-off portion 32 to travel on the third guide surface portions 53, and sends off the component storage tape 100 to cause it to pass the component take-out position 21. In the above configuration in which the third tape send-off portion 33 is disposed close to the component take-out position 21 and receives the component storage tape 100 in such a location, the component storage tape 100 can be sent off in a state in which the component storage tape 100 is positioned highly accurately relative to the component take-out position 21.

The third tape send-off portion 33 includes the pair of third sprockets 331, and a pair of third worm wheels 332. The above expression "the third tape send-off portion 33 is disposed close to the component take-out position 21" means that, in a view in the X-axis direction, the third tape send-off portion 33 is disposed such that the component take-out position 21 is in an area occupied by the pair of third sprockets 331 in the tape send-off direction H1. In a view in the X-axis direction, the component take-out position 21 may be directly above the top (uppermost end) of the pair of third sprockets 331 or may be at a position shifted in the Y-axis direction from the position directly above the top of the pair of third sprockets 331. When the component take-out position 21 is determined to be a position shifted in the Y-axis direction from the position directly above the top of the pair of third sprockets 331, it is preferable that the component take-out position 21 be shifted not toward the downstream side but toward the upstream side in the tape send-off direction H1. The reason for preferring this arrangement is that, at the position shifted toward the upstream side, an area of component storage tape 100 that passes the component take-out position 21, the component storage tape 100 being sent off by the pair of third sprockets 331 of the third tape send-off portion 33, is in a state of being pulled and therefore hardly deforms, in which case the component storage tape 100 is positioned highly accurately relative to the component take-out position 21.

The pair of third sprockets 331 are disc-shaped sprockets that are supported on the device body 2 in such a way as to be capable of rotating respectively around an axis extending in the X-axis direction (tape width direction H2). The pair of third sprockets 331 have a plurality of teeth 331a arranged circumferentially at given intervals. On the pair of third sprockets 331, teeth 331a located on the +Z-side are exposed from the guide surfaces 5 of the pair of guide walls 41. Respective sets of teeth 331a of the pair of third sprockets 331 can be fitted in respective groups of holes 101b formed on both ends in the tape width direction H2 of the carrier tape 101 of the component storage tape 100.

The pair of third worm wheels 332 are worm gears that are arranged coaxial respectively with the pair of third sprockets 331. The pair of third worm wheels 332 engage respectively with the pair of second worms 323.

According to the third tape send-off portion 33 configured in the above manner, which operates in the same manner as the second tape send-off portion 32 does, the rotation driving force of the second servomotor 324 is transmitted to the pair of third worm wheels 332 via the second belt 325 and the pair of second worms 323, thus causing the pair of third worm wheels 332 to rotate. When the pair of third worm wheels 332 rotate, their rotation causes the pair of third sprockets 331 to rotate in an interlocked motion. As the pair of third sprockets 331 rotate, the third sprockets 331 send off the component storage tape 100 including the carrier tape 101 having the holes 101b in which the teeth 331a of the third sprockets 331 are fitted.

The component feeding device 1 can be equipped with a plurality of reels (not depicted) around which component storage tapes 100 are wound respectively. A component feeding operation by the component feeding device 1 will be described with reference to FIG. 2, as follows. An operator, as preparation work, first attaches a reel around which a component storage tape 100 preceding in component feeding by the component feeding device 1 (preceding component storage tape) is wound, to the component feeding device 1. The operator then fits a tip end of the preceding component storage tape 100 to the first sprockets 311. Subsequently, the operator operates the operation unit 22 to enter an instruction to rotate the first sprockets 311. As a result, the preceding component storage tape 100 is sent off and its tip end is fitted to the second sprockets 321.

At a point at which the above preparation work is over, the component feeding device 1 starts its component feeding operation. In the component feeding device 1, the second sprockets 321 rotate, thus sending off the preceding component storage tape 100. At this time, the first sprockets 311 are left idling. The rotating second sprockets 321 thus send off the preceding component storage tape 100.

In a state in which the preceding component storage tape 100 is sent off by the second sprockets 321, the operator operates a tape switching device 400, which is disposed on the uppermost upstream side of the guide surfaces 5, to cause a part of preceding component storage tape 100 that is on the upstream side to shift its position downward (toward the −Z-side). As a result, the preceding component storage tape 100 is disengaged from the first sprockets 311. At this point of time, the preceding component storage tape 100 is already fitted to the second sprockets 321. When disengaged from the first sprockets 311, therefore, the preceding component storage tape 100 is kept sent off by the second sprockets 321.

In a state in which the preceding component storage tape 100 is sent off by the second sprockets 321, the operator attaches a reel around which a component storage tape 100 that follows the preceding component storage tape 100, i.e., following component storage tape 100 is wound, to the component feeding device 1. The operator then fits a tip end of the following component storage tape 100 to the first sprockets 311. In this manner, before components in the preceding component storage tape 100 are all taken out, the reel around which the following component storage tape 100 is wound can be attached to the component feeding device 1. Subsequently, at a point of time at which the preceding component storage tape 100 is completely reeled out, sending off the following component storage tape 100 is automatically started.

Figure 7:
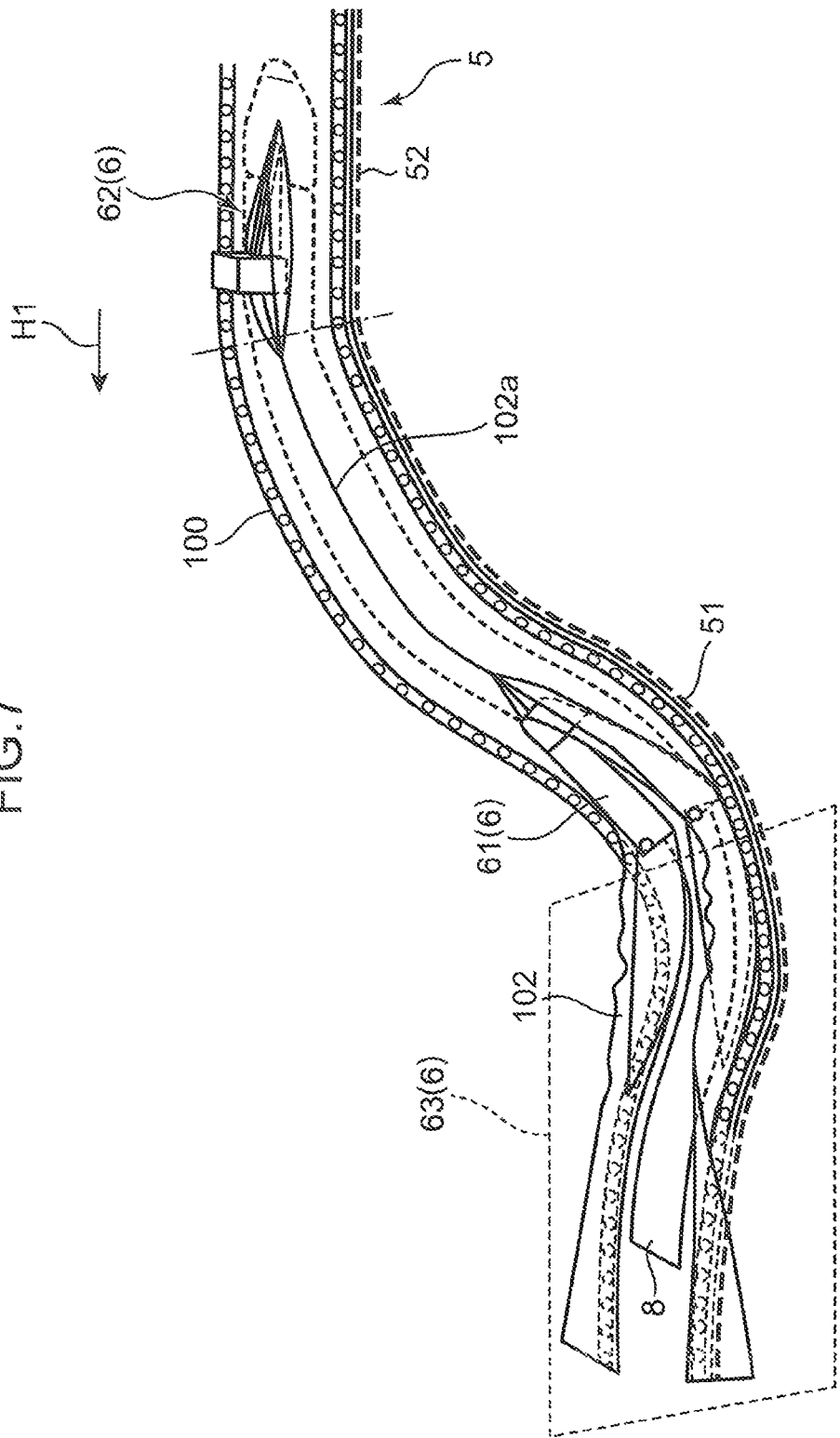
FIG. 7 is a perspective view of a configuration of a component exposing unit included in the component feeding device.

FIG. 7 is a perspective view of a configuration of the component exposing unit 6 included in the component feeding device 1. The component exposing unit 6 carries out a component exposing process of lifting the cover tape 102 of the component storage tape 100, which is sent off as its both lower surface ends 100UE are guided by the guide surfaces 5 of the pair of guide walls 41, along the joined portions 103 serving as starting points, where the cover tape 102 is joined to the carrier tape 101, and pushing lifted parts of the cover tape 102 to outside of the side edges in the tape width direction H2 of the component storage tape 100 while folding the lifted parts downward (toward the −Z-side) to expose the component E2 in the component storage portion 101a. The component exposing unit 6 includes a cover tape lifting portion 61, a cover tape pre-processing portion 62, and a cover tape post-processing portion 63.

The cover tape lifting portion 61 is disposed between the pair of guide walls 41 such that the cover tape lifting portion 61 corresponds to the first guide surface portions 51 of the guide surfaces 5. The cover tape lifting portion 61 carries out a lifting process of lifting the cover tape 102 off the carrier tape 101 such that an extent of lifting the cover tape 102 off the carrier tape 101 increases continuously on the component storage tape 100, which travels as its lower surface ends 100UE are guided by the first guide surface portions 51 of the guide surfaces 5 of the pair of guide walls 41. The cover tape lifting portion 61 carries out the lifting process of lifting the cover tape 102, thereby executing a lifting step included in the component feeding process.

The cover tape pre-processing portion 62 is disposed between the pair of guide walls 41 such that the cover tape pre-processing portion 62 corresponds to the second guide surface portions 52 of the guide surfaces 5. Before the cover tape lifting portion 61 carries out the lifting process, the cover tape pre-processing portion 62 carries out pre-processing of cutting the cover tape 102. The cover tape pre-processing portion 62 carries out the pre-processing on the cover tape 102, thereby executing a pre-processing step included in the component feeding process.

The cover tape post-processing portion 63 is disposed on the upper side (+Z-side) relative to the cover tape lifting portion 61 such that the cover tape post-processing portion 63 corresponds to the first guide surface portions 51 of the guide surfaces 5. The cover tape post-processing portion 63 carries out post-processing of pushing lifted parts of the cover tape 102 lifted by the cover tape lifting portion 61 to outside of respective side edges in the tape width direction H2 of the component storage tape 100 while folding the lifted parts downward (toward the −Z-side) to make the component storage portion 101a open to the outside. The cover tape post-processing portion 63 carries out the post-processing on the cover tape 102, thereby executing a post-processing step included in the component feeding process. The cover tape lifting portion 61, the cover tape pre-processing portion 62, and the cover tape post-processing portion 63 of the component exposing unit 6 will be described in detail later.

Figure 8:
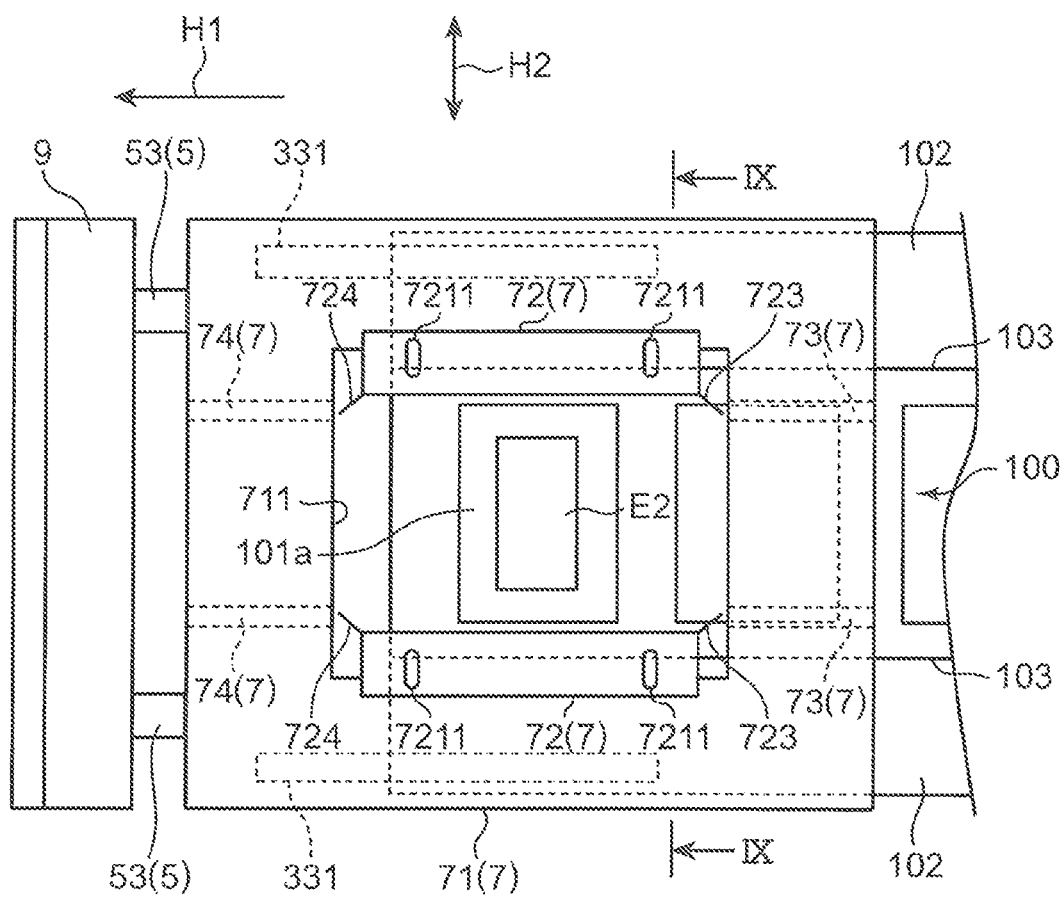
FIG. 8 is a top plan view of a tape traveling guide unit included in the component feeding device.
Figure 9:
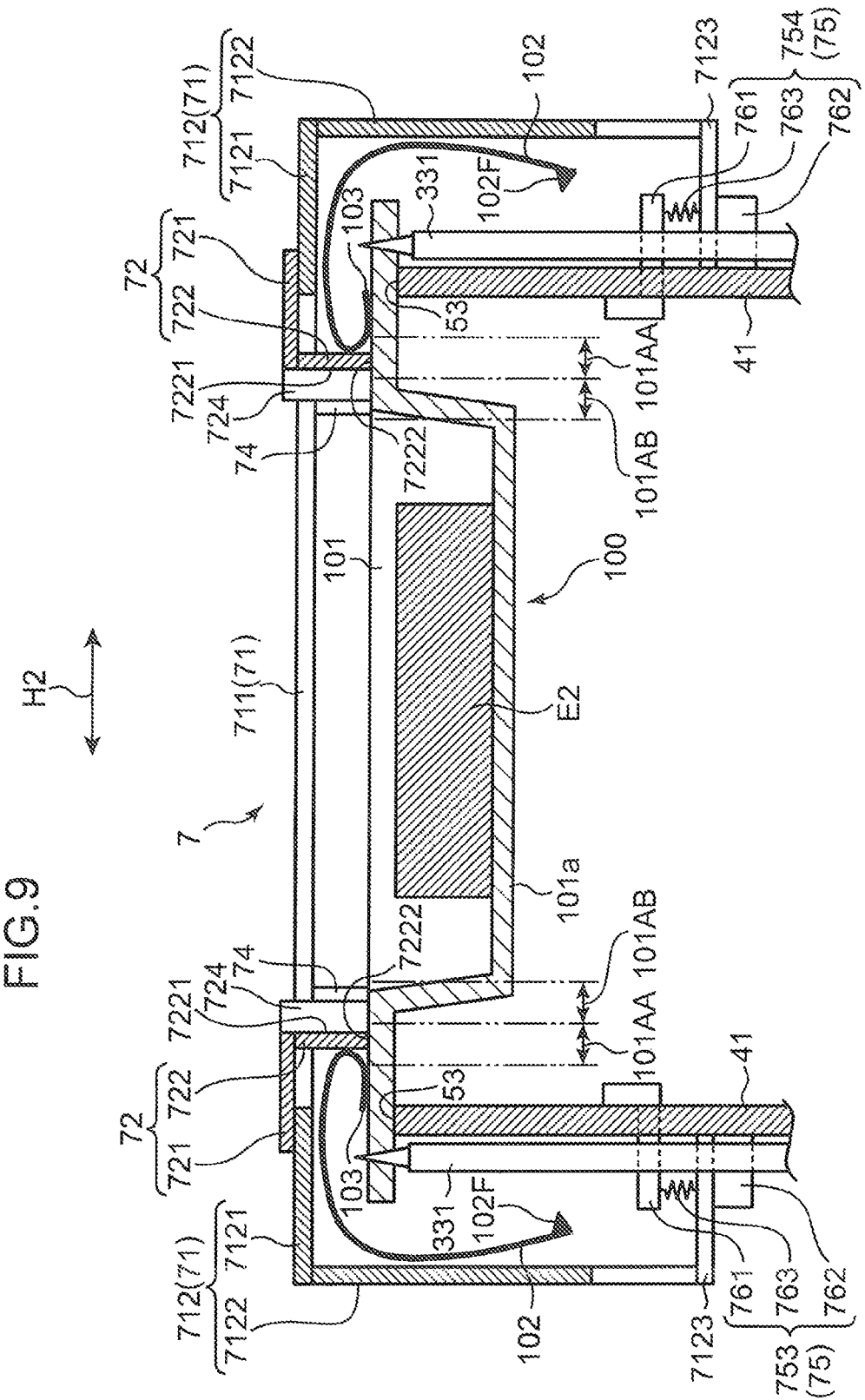
FIG. 9 is a sectional view of the tape traveling guide unit of FIG. 8, the sectional view being taken along a IX-IX section line.
Figure 10:
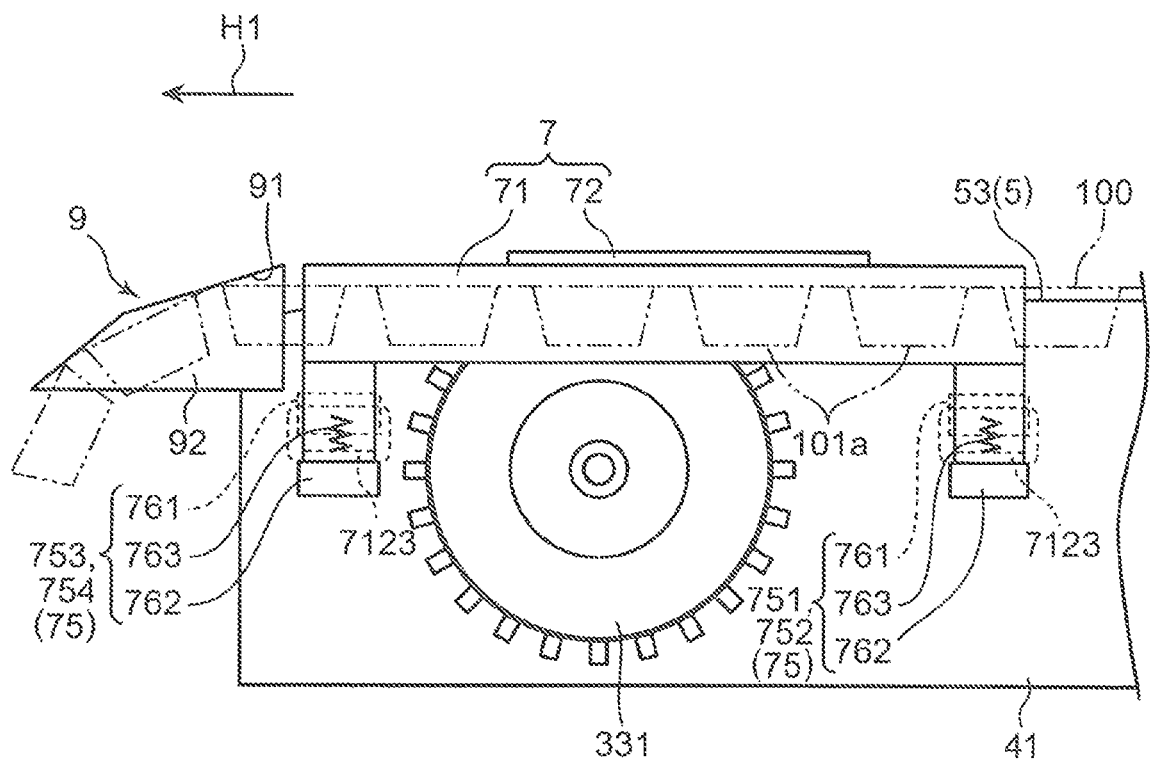
FIG. 10 is a side view of the tape traveling guide unit.

FIG. 8 is a top plan view of the tape traveling guide unit 7 included in the component feeding device 1. FIG. 9 is a sectional view of the tape traveling guide unit 7 of FIG. 8, the sectional view being taken along a IX-IX section line. FIG. 10 is a side view of the tape traveling guide unit 7. At the downstream side in the tape send-off direction H1 of the component exposing unit 6, the tape traveling guide unit 7 is disposed on the horizontal areas 531 of the third guide surface portions 53 of the guide surfaces 5. In other words, the tape traveling guide unit 7 is located close to the component take-out position 21. The tape traveling guide unit 7 guides the component storage tape 100 having been subjected to the component exposing process by the component exposing unit 6 to help the component storage tape 100 in traveling on the third guide surface portions 53 toward the component take-out position 21. The tape traveling guide unit 7 includes a guide body 71 and opening width defining members 72.

On the tape traveling guide unit 7, the guide body 71 makes up the body of the tape traveling guide unit 7, and has an opening 711 and a cover tape path demarcating portion 712. On the component storage tape 100 traveling on the third guide surface portions 53, the opening 711 faces the component storage portion 101a made open to the outside by the component exposing process by the component exposing unit 6. The opening 711 is formed into a rectangular shape having a given length in the tape send-off direction H1. The opening 711 is located underneath the component take-out position 21. In other words, the head unit 14 of the component mounter 10 takes out the component E2, which is transferred to the component take-out position 21 by the component feeding device 1, through the opening 711.

The cover tape path demarcating portion 712 of the guide body 71 is disposed outside the opening 711 in the tape width direction H2. As shown in FIG. 9, on the component storage tape 100 that travels on the third guide surface portions 53 after being subjected to the component exposing process by the component exposing unit 6, the cover tape path demarcating portion 712 defines cover tape paths through which the lifted parts of the cover tape 102 travel, the lifted parts being pushed outward in the tape width direction H2 along the joined portions 103 serving as starting points, where the cover tape 102 is joined to the carrier tape 101, and being folded downward. The cover tape path demarcating portion 712 has upper counter portions 7121, which face the cover tape 102 from a location above the third guide surface portions 53 of the pair of guide walls 41, and side counter portions 7122, which face the cover tape 102 from a location outside the pair of guide walls 41 in the tape width direction H2. The upper counter portions 7121 are plate-like structures extending outward horizontally from both opening edges in the tape width direction H2 of the opening 711. The side counter portions 7122 are plate-like structures extending downward from outside edges of the upper counter portions 7121.

On the tape traveling guide unit 7, the opening width defining members 72 are fitted respectively to both opening edges in the tape width direction H2 of the opening 711 of the guide body 71, and define the opening width in the tape width direction H2 of the opening 711. As shown in FIG. 9, on the component storage tape 100 that travels on the third guide surface portions 53, each opening width defining member 72 comes in contact with a first specific area 101AA of the upper surface of the carrier tape 101, the first specific area 101AA being between the component storage portion 101a and the joined portion 103 in the tape width direction H2. Each opening width defining member 72 thus applies a downward pressure to the first specific area 101AA of the upper surface of the carrier tape 101.

Specifically, each opening width defining member 72 has a base 721 and an extended piece 722 extended downward from the base 721. The base 721 is formed into a rectangular plate-like shape extending along the opening edge in the tape width direction H2 of the opening 711, and is fitted to the upper counter portion 7121. In a top plan view, an inner edge in the tape width direction H2 of the base 721 is located within the opening 711. The extended piece 722 is formed into a rectangular plate-like shape, whose one long side is connected to the inner edge in the tape width direction H2 of the base 721. The extended piece 722 is extended downward from the inner edge of the base 721 and is inserted in the opening 711. In a state in which the extended piece 722 is inserted in the opening 711, a surface (surface located inside in the tape width direction H2) of the extended piece 722 serves as a defining surface 7221 (see FIG. 9) that defines the opening width in the tape width direction H2 of the opening 711. In the state in which the extended piece 722 is inserted in the opening 711, a lower end face of the extended piece 722 serves as a pressure-applying surface 7222 (see FIG. 9) that applies a pressure to the first specific area 101AA of the upper surface of the carrier tape 101. The extended piece 722 has also a function of regulating the inward displacement of the cover tape 102 in the tape width direction H2.

On the component storage tape 100 that travels on the third guide surface portions 53 after being subjected to the component exposing process by the component exposing unit 6, as described above, the lifted parts of the cover tape 102 are pushed outward in the tape width direction H2 relative to the carrier tape 101 and are folded downward. Because the cover tape 102 is in this state, when the component storage tape 100 traveling on the third guide surface portions 53 passes the tape traveling guide unit 7, a force that causes the cover tape 102 to rise acts on the tape traveling guide unit 7. When the cover tape path demarcating portion 712 of the guide body 71 applies an excessive force to the cover tape 102 to prevent it from rising, it may impair the steadiness of traveling of the component storage tape 100 on the third guide surface portions 53 and may also create a resistive force against traveling, which raises a possibility that the traveling performance of the component storage tape 100 may deteriorate.

To avoid such a case, on the tape traveling guide unit 7, each opening width defining member 72, which defines the opening width of the opening 711 serving as the opening for taking out the component E2, applies a downward pressure to the first specific area 101AA of the upper surface of the carrier tape 101. This ensures that the component storage tape 100 travels steadily on the third guide surface portions 53. Meanwhile, on the tape traveling guide unit 7, the cover tape path demarcating portion 712 of the guide body 71 does not put constraint on the cover tape 102 but rather allows the cover tape 102 to rise to some extent, thereby demarcating a path that embraces the cover tape 102. This reduces the traveling resistance that arises when the component storage tape 100 travels on the third guide surface portions 53, and improves the traveling performance of the component storage tape 100.

On the component storage tape 100, the length of the component storage portion 101a in the tape width direction H2 is determined in accordance with the size of the component E2 stored in the component storage portion 101a. In other words, on the component storage tape 100, the length of the component storage portion 101a in the tape width direction H2 varies depending on the size of the component E2 even when the tape width K2 remains the same. For this reason, it is necessary for each opening width defining member 72 to define the opening width of the opening 711 in accordance with the length of the component storage portion 101a in the tape width direction H2. To meet this requirement, as shown in FIG. 8, the base 721 of each opening width defining member 72 is fitted to the upper counter portion 7121 via fitting portions 7211 of elongated holes extending in the tape width direction H2. These fitting portions 7211 allow changing the position of the defining surface 7221 of the extended piece 722, which is extended downward from the base 721, in the tape width direction H2. Thus, the opening width defining member 72 can define the opening width of the opening 711 in accordance with the length of the component storage portion 101a in the tape width direction H2, using the defining surface 7221 of the extended piece 722.

As shown in FIGS. 8 and 9, the tape traveling guide unit 7 further includes a pair of tape guide-in portions 73 and a pair of tape guide-out portions 74. Each of the pair of tape guide-in portions 73 is a bar-like member extending along the tape send-off direction H1. The pair of tape guide-in portions 73 are fitted to a part of guide body 71 that is on the upstream side in the tape send-off direction H1 of the opening 711 such that the tape guide-in portions 73 are separated in the tape width direction H2 across a gap. Each of the pair of tape guide-in portions 73 comes in contact with a second specific area 101AB located inward in the tape width direction H2 relative to the first specific area 101AA with which the pressure-applying surface 7222 of the extended piece 722 comes in contact, the second specific area 101AB being an area of the upper surface of the carrier tape 101. In this configuration, each of the pair of tape guide-in portions 73 guides the lifted part of the cover tape 102 into the cover tape path demarcated by the cover tape path demarcating portion 712 while regulating the inward displacement of the cover tape 102 in the tape width direction H2.

Each of the pair of tape guide-out portions 74 is a bar-like member extending along the tape send-off direction H1. The pair of tape guide-out portions 74 are fitted to a part of guide body 71 that is on the downstream side in the tape send-off direction H1 of the opening 711 such that the tape guide-out portions 74 are separated in the tape width direction H2 across a gap. Each of the pair of tape guide-out portions 74 comes in contact with the second specific area 101AB of the upper surface of the carrier tape 101. In this configuration, each of the pair of tape guide-out portions 74 guides the lifted part of the cover tape 102 out of the cover tape path demarcated by the cover tape path demarcating portion 712 while regulating the inward displacement of the cover tape 102 in the tape width direction H2.

As shown in FIGS. 8 and 9, each opening width defining member 72 further has a first projection 723 projecting from an upstream end in the tape send-off direction H1 of the extended piece 722, and a second projection 724 projecting from a downstream end in the tape send-off direction H1 of the extended piece 722. The first projection 723 extends slantly toward a downstream end in the tape send-off direction H1 of the tape guide-in portion 73. The second projection 724 extends slantly toward an upstream end in the tape send-off direction H1 of the tape guide-out portion 74.

On the component storage tape 100 having traveled on the third guide surface portions 53 and passed the pair of tape guide-in portions 73, the lifted parts of the cover tape 102 come in contact with respective first projections 723 of the opening width defining members 72 and are guided into the cover tape paths defined by the cover tape path demarcating portion 712. In this manner, the lifted parts of the cover tape 102 of the component storage tape 100 having passed the pair of tape guide-in portions 73 are guided smoothly into the cover tape path demarcating portion 712.

Then, on the component storage tape 100 traveling on the third guide surface portion 53, the lifted parts of the cover tape 102 having passed through the cover tape path demarcating portion 712 come in contact with respective second projections 724 of the opening width defining members 72 and are guided to the tape guide-out portions 74. In this manner, the lifted parts of the cover tape 102 having passed through the cover tape path demarcating portion 712 can smoothly be guided out of the cover tape path demarcating portion 712.

As shown in FIGS. 9 and 10, the tape traveling guide unit 7 further includes a coupling mechanism 75 that couples the guide body 71 to the pair of guide walls 41 such that the guide body 71 can shift in position in the vertical direction (Z-axis direction). The coupling mechanism 75 has a first coupling portion 751 and a second coupling portion 752, and a third coupling portion 753 and a fourth coupling portion 754. The first coupling portion 751 and the second coupling portion 752 couple both ends in the tape width direction H2 of the guide body 71, the ends being on the upstream side in the tape send-off direction H1, to the pair of guide walls 41, respectively. The third coupling portion 753 and the fourth coupling portion 754 couple both ends in the tape width direction H2 of the guide body 71, the ends being on the downstream side in the tape send-off direction H1, to the pair of guide walls 41, respectively.

Each of the first coupling portion 751, the second coupling portion 752, the third coupling portion 753, and the fourth coupling portion 754 has an upper limit stopper 761, a lower limit stopper 762, and a biasing member 763. The upper limit stopper 761 is fitted to each of the pair of guide walls 41 and determines an upper limit position of the guide body 71 that shifts in position vertically (in the Z-axis direction). The lower limit stopper 762 is fitted to each of the pair of guide walls 41 in such a way as to be under the upper limit stopper 761 and determines a lower limit position of the guide body 71 that shifts in position vertically (in the Z-axis direction). The fitting position of the lower limit stopper 762 on each of the pair of guide walls 41 in the vertical direction (Z-axis direction) is determined so that the component storage tape 100 is allowed to travel on the third guide surface portions 53 as the upper surface of the carrier tape 101 is kept in contact with the extended pieces 722, the first projections 723, the second projections 724, the tape guide-in portions 73, and the tape guide-out portions 74. In other words, in a state in which the guide body 71 is stopped at its lower limit position by the lower limit stopper 762, a gap slightly larger than the thickness of the carrier tape 101 is formed between the extended pieces 722, the first projections 723, the second projections 724, the tape guide-in portions 73, and the tape guide-out portions 74 and the third guide surface portions 53.

The biasing member 763 is disposed between the upper limit stopper 761 and the lower limit stopper 762 and applies a downward pressure to the guide body 71 to allow it to shift in position vertically (in the Z-axis direction). The biasing member 763 is provided as, for example, a compression coil spring. The biasing member 763 has one end fixed to the upper limit stopper 761 and the other end fixed to a pressurized portion 7123 of the guide body 71. The pressurized portion 7123 is a projection projecting inward from a lower edge of the side counter portion 7122 of the cover tape path demarcating portion 712 of the guide body 71. The pressurized portion 7123 is disposed between the upper limit stopper 761 and the lower limit stopper 762 and receives a pressure applied by the biasing member 763.

On the tape traveling guide unit 7, the guide body 71 is coupled to the pair of guide walls 41 via the coupling mechanism 75 such that the guide body 71 can shift in position vertically. In this configuration, it is ensured that the component storage tape 100 travels steadily on the third guide surface portions 53 as the upper surface of the carrier tape 101 is kept in contact with the extended pieces 722, the first projections 723, the second projections 724, the tape guide-in portions 73, and the tape guide-out portions 74.

When the component E2 transferred to the component take-out position 21 is taken out by the head unit 14 through the opening 711 of the guide body 71, the component storage tape 100 is ejected out of the component feeding device 1. The component storage tape 100 having passed through the tape traveling guide unit 7 droops down when ejected out of the component feeding device 1. At this time, the component storage tape 100 is folded at the storage portion connection area between adjacent component storage portions 101a of the carrier tape 101 and droops down as a consequence. In this manner, the component storage tape 100 folded at the area between adjacent component storage portions 101a shows a tendency to bulge upward.

It is difficult to suppress an upward bulging motion of the component storage tape 100 by the downward pressure that the opening width defining members 72 of the tape traveling guide unit 7 applies to the carrier tape 101. Given this fact, it is possible that the upward bulging of the component storage tape 100 ejected out of the component feeding device 1 may lift the guide body 71 up. It is conceivable that to regulate such an upward positional shift of the guide body 71 caused by the upward bulging of the component storage tape 100, the downward pressure that the biasing members 763 of the coupling mechanism 75 apply to the guide body 71 may be increased. In this case, however, the increased downward pressure creates traveling resistance that hampers traveling of the component storage tape 100 on the third guide surface portions 53.

To avoid such a case, according to this embodiment, the component storage tape 100 is ejected out of the component feeding device 1 through the tape ejection guide unit 9. As shown in FIG. 10, on the downstream side in the tape send-off direction H1 of the tape traveling guide unit 7, the tape ejection guide unit 9 is fitted to downstream side ends in the tape send-off direction H1 of the pair of guide walls 41. The tape ejection guide unit 9 guides the component storage tape 100 having passed the tape traveling guide unit 7 to eject the component storage tape 100 on the downstream side. The tape ejection guide unit 9 includes an upper surface regulating portion 91 and side surface regulating portions 92.

On the tape ejection guide unit 9, the upper surface regulating portion 91 comes in contact with the upper surface of the component storage tape 100 having passed the tape traveling guide unit 7, thereby regulating an upward motion of the component storage tape 100. On the tape ejection guide unit 9, the side surface regulating portions 92 come in contact with side end faces of the component storage tape 100 having passed the tape traveling guide unit 7, thereby regulating a lateral motion of the component storage tape 100. In this manner, the upward bulging of the component storage tape 100 ejected out of the component feeding device 1 is suppressed.

[Detailed Configuration of Component Exposing Unit]

Figure 11:
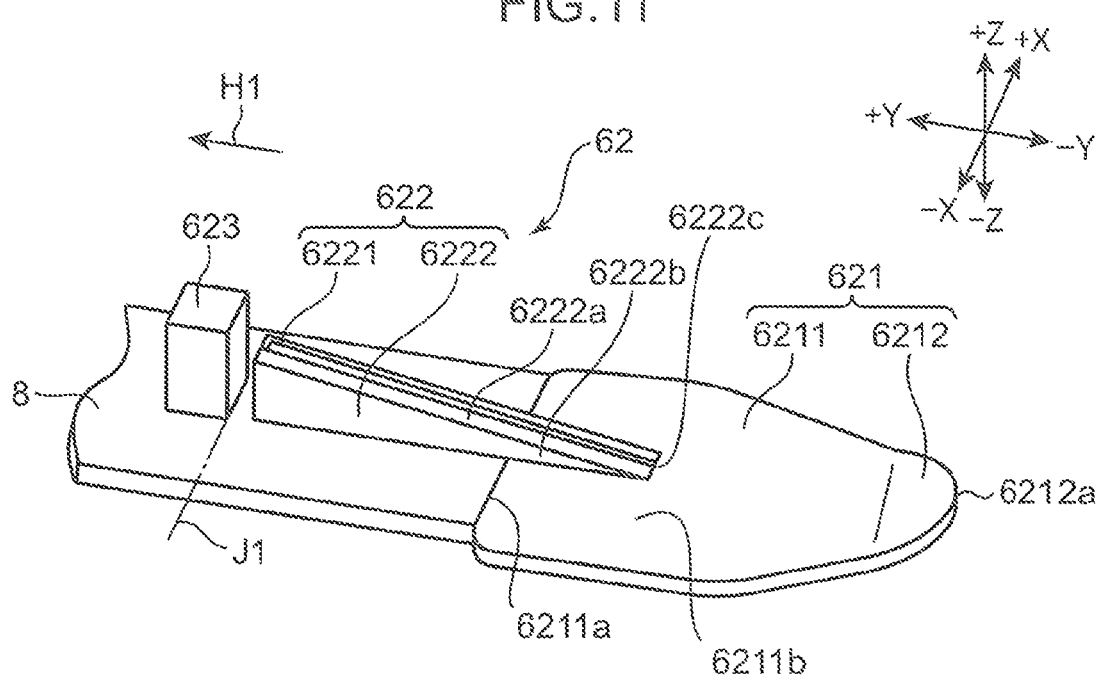
FIG. 11 is a perspective view of a configuration of a cover tape pre-processing portion of the component exposing unit.
Figure 12:
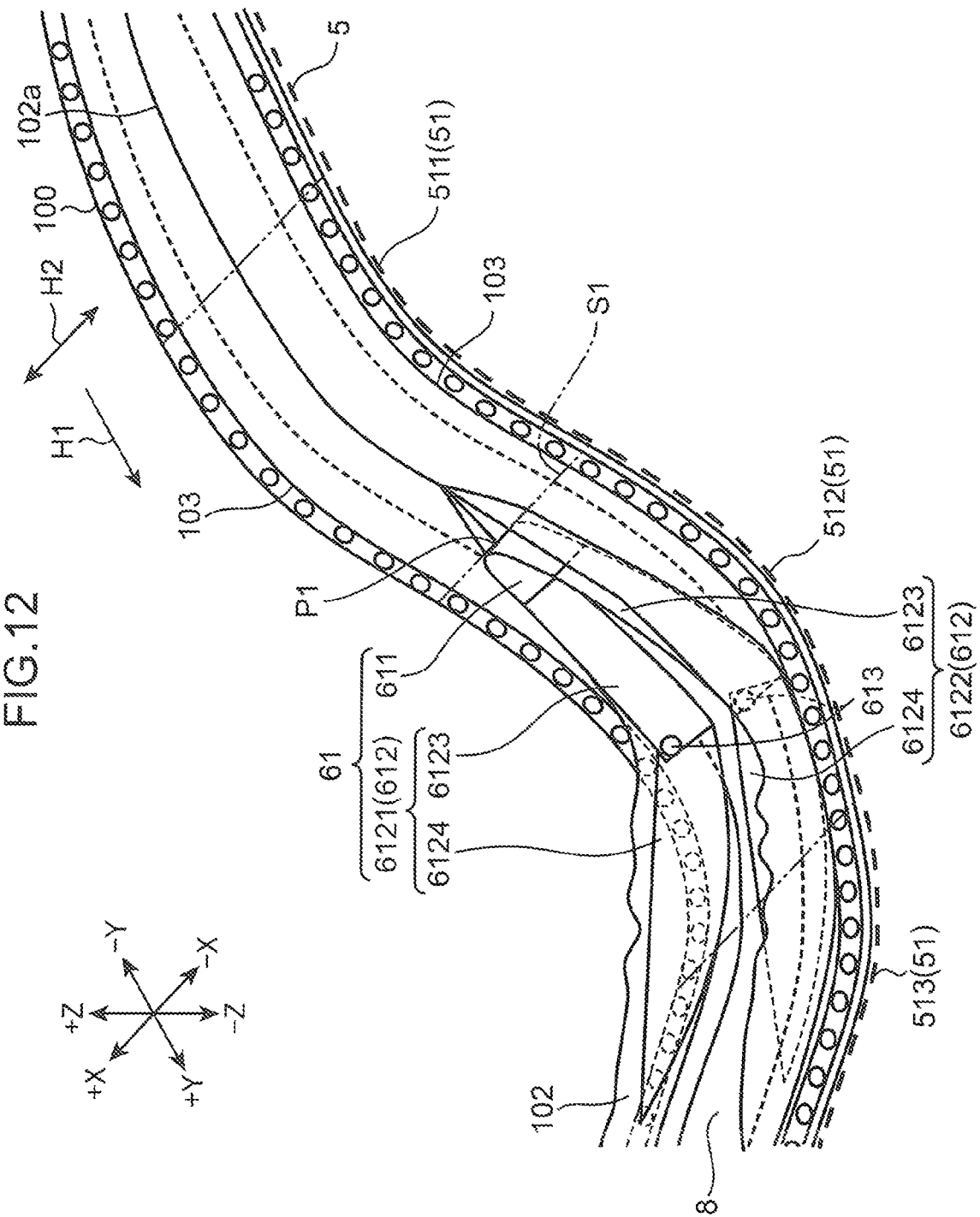
FIG. 12 is a perspective view of a configuration of a cover tape lifting portion of the component exposing unit.
Figure 13:
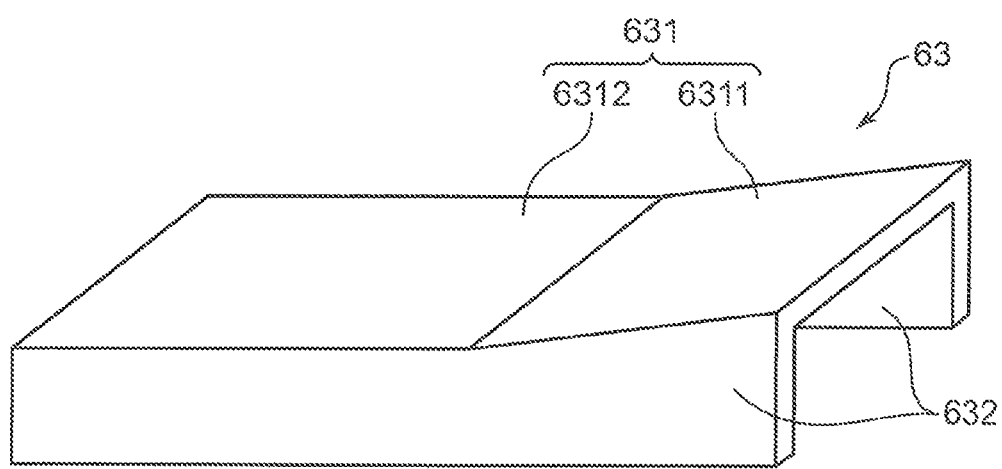
FIG. 13 is a perspective view of a configuration of a cover tape post-processing portion of the component exposing unit.
Figure 14:
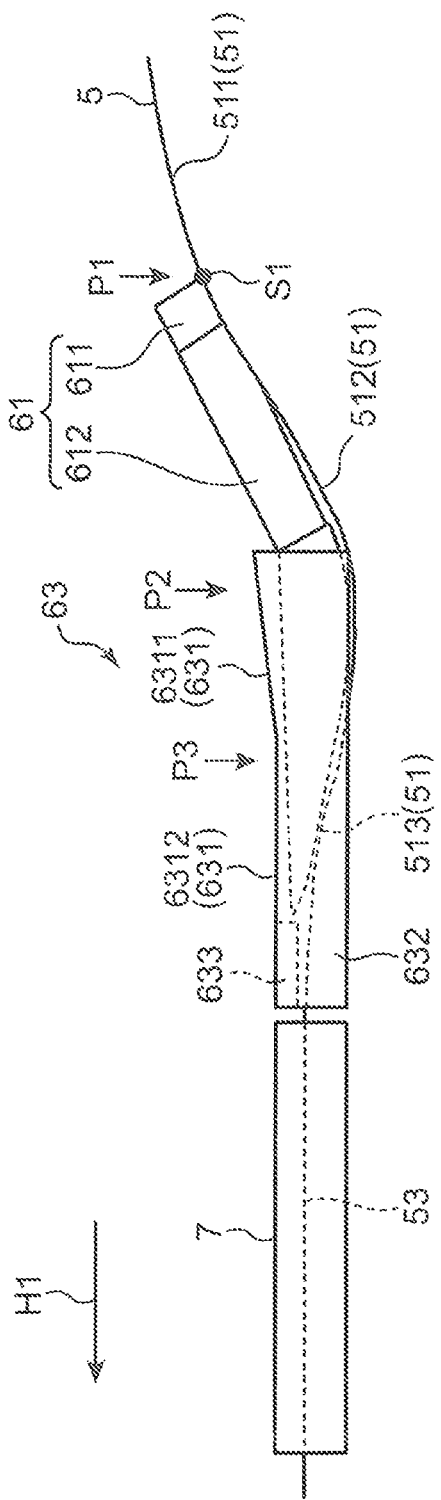
FIG. 14 is a side view of the cover tape post-processing portion.
Figure 15:
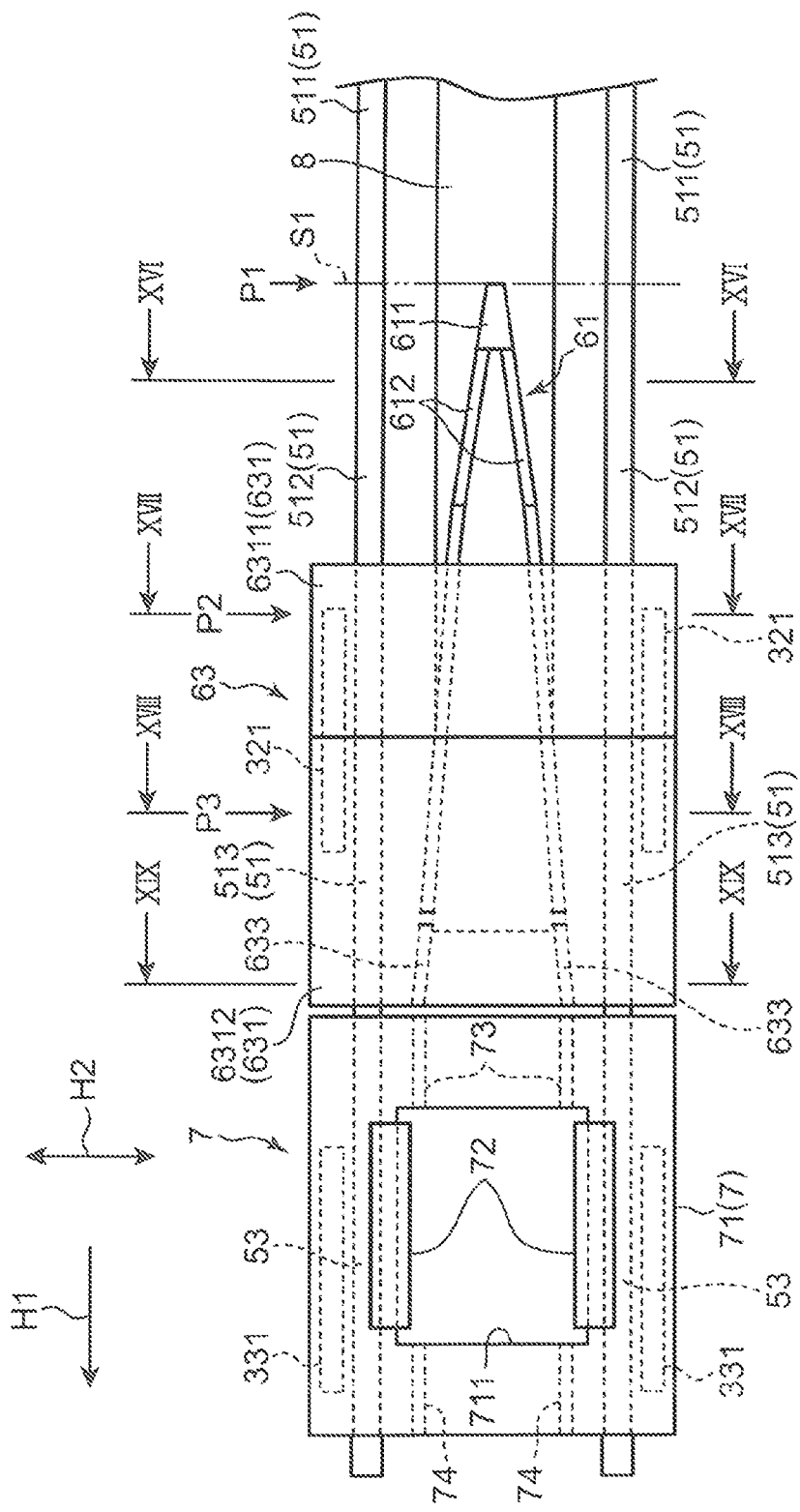
FIG. 15 is a top plan view of the cover tape post-processing portion.
Figure 16:
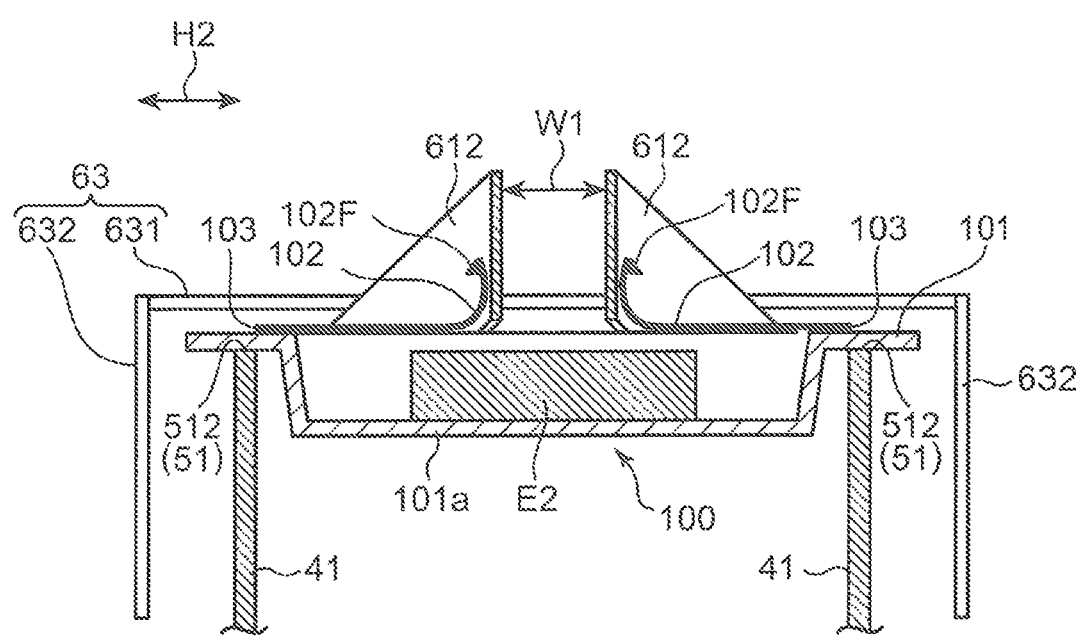
FIG. 16 is a sectional view of the cover tape post-processing portion of FIG. 15, the sectional view being taken along a XVI-XVI section line.
Figure 17:
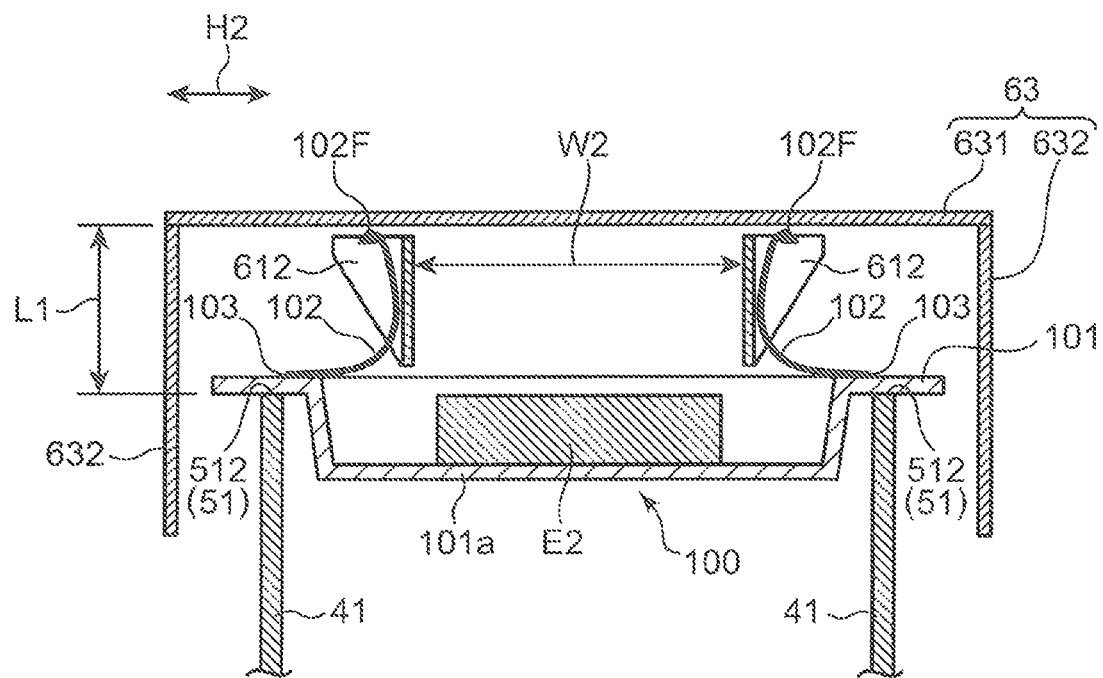
FIG. 17 is a sectional view of the cover tape post-processing portion of FIG. 15, the sectional view being taken along a XVII-XVII section line.
Figure 18:
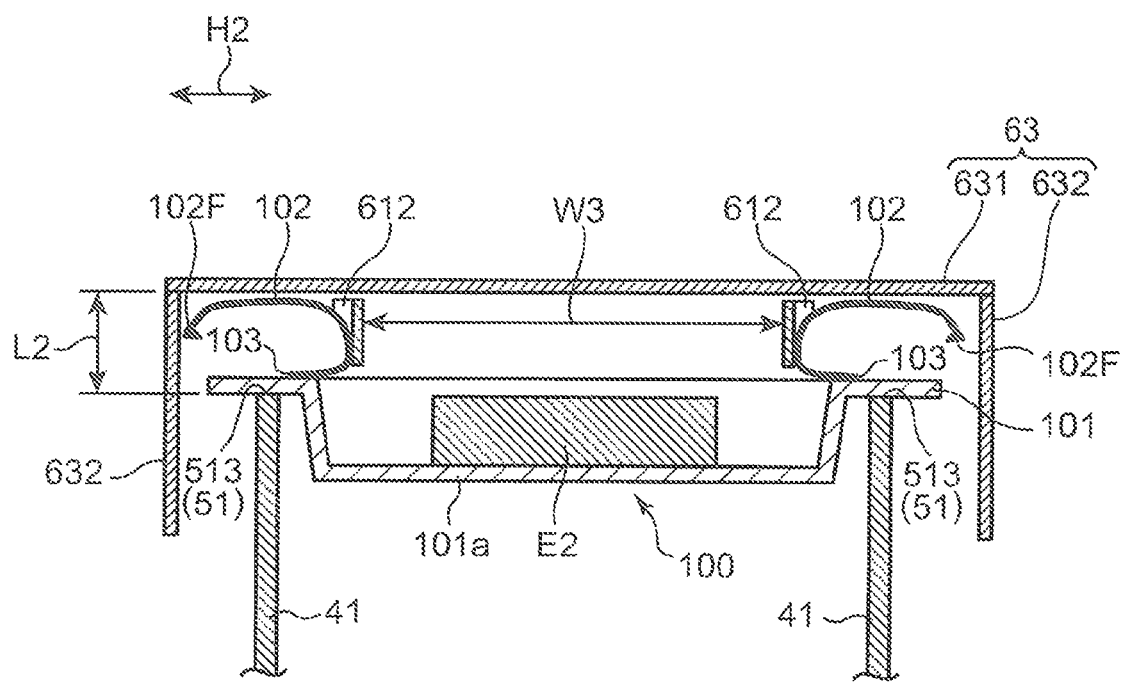
FIG. 18 is a sectional view of the cover tape post-processing portion of FIG. 15, the sectional view being taken along a XVIII-XVIII section line.
Figure 19:
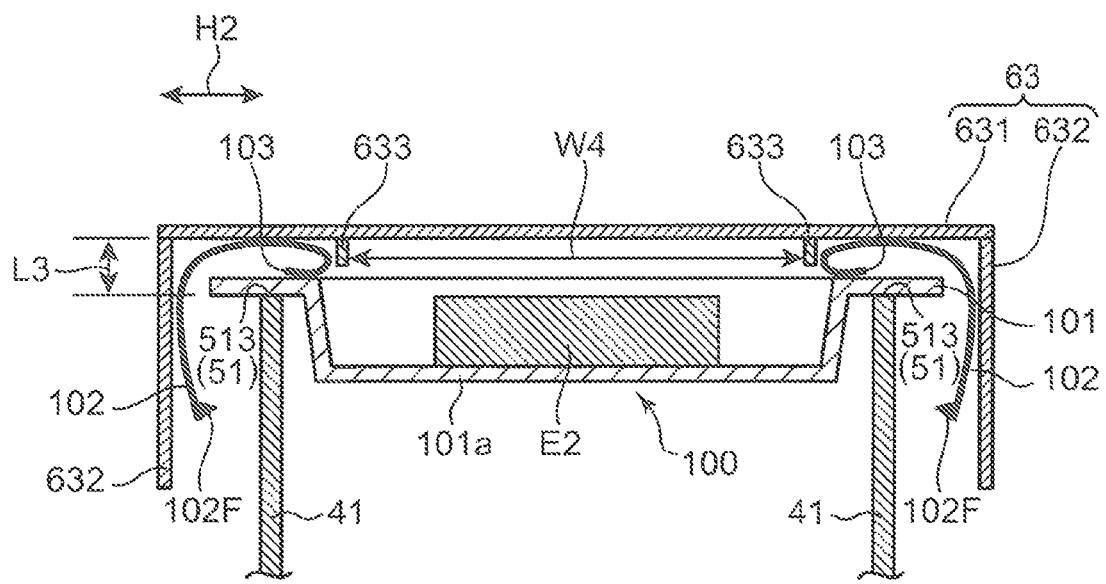
FIG. 19 is a sectional view of the cover tape post-processing portion of FIG. 15, the sectional view being taken along a XIX-XIX section line.

A detailed configuration of the component exposing unit 6 included in the component feeding device 1 will then be described with reference to FIG. 7 and FIGS. 11 to 19. FIG. 11 is a perspective view of a configuration of the cover tape pre-processing portion 62 of the component exposing unit 6. FIG. 12 is a perspective view of a configuration of the cover tape lifting portion 61 of the component exposing unit 6. FIG. 13 is a perspective view of a configuration of the cover tape post-processing portion 63 of the component exposing unit 6. FIG. 14 is a side view of the cover tape post-processing portion 63. FIG. 15 is a top plan view of the cover tape post-processing portion 63. FIG. 16 is a sectional view of the cover tape post-processing portion 63 of FIG. 15, the sectional view being taken along a XVI-XVI section line. FIG. 17 is a sectional view of the cover tape post-processing portion 63 of FIG. 15, the sectional view being taken along a XVII-XVII section line. FIG. 18 is a sectional view of the cover tape post-processing portion 63 of FIG. 15, the sectional view being taken along a XVIII-XVIII section line. FIG. 19 is a sectional view of the cover tape post-processing portion 63 of FIG. 15, the sectional view being taken along a XIX-XIX section line. Positions at which the cover tape post-processing portion 63 is cut to take the sectional views of FIGS. 16 to 19 are in the order of heading from the upstream side toward the downstream side in the tape send-off direction H1, that is, FIG. 16, FIG. 17, FIG. 18, and FIG. 19 represent the sectional views taken in order at those positions.

As described above, the cover tape pre-processing portion 62 is disposed between the pair of guide walls 41 such that the cover tape pre-processing portion 62 corresponds to the second guide surface portions 52 of the guide surfaces 5. Before the cover tape lifting portion 61 carries out the lifting process of lifting the cover tape 102, the cover tape pre-processing portion 62 carries out the pre-processing of cutting the cover tape 102 on the component storage tape 100, which is sent off by the first tape send-off portion 31 and travels on the second guide surface portions 52 as the tip end of the component storage tape 100 is provided as a free end. As shown in FIG. 11, the cover tape pre-processing portion 62 includes an insertion member 621, a cover tape cutting portion 622, and a support portion 623.

The insertion member 621 is a member that is inserted between the cover tape 102 and the carrier tape 101 of the component storage tape 100, which is sent off by the first tape send-off portion 31 and travels on the second guide surface portions 52 as the tip end of the component storage tape 100 is provided as a free end. The insertion member 621 is formed into a plate-like shape. The insertion member 621 has a base portion 6211, and an insertion front end 6212 continuous with an upstream end in the tape send-off direction H1 of the base portion 6211. To a downstream end 6211a in the tape send-off direction H1 of the base portion 6211 of the insertion member 621, a lid member 8, which will be described later, is connected.

In the insertion member 621, the insertion front end 6212 slopes upward against the base portion 6211 such that the insertion front end 6212 tilts upward (toward the +Z-side) from its part connected to the base portion 6211 toward a front edge 6212a, which is an upstream end in the tape send-off direction H1. In other words, in a state in which the insertion member 621 is inserted between the cover tape 102 and the carrier tape 101, the base portion 6211 is substantially parallel with the cover tape 102, and the insertion front end 6212 slopes upward in such a way as to separate from the carrier tape 101 across a gap and head to the cover tape 102.

The insertion front end 6212 of the insertion member 621 is made into the above sloped structure. This prevents a case where when the component storage tape 100 with the insertion member 621 being inserted between the cover tape 102 and the carrier tape 101 is sent off by the first tape send-off portion 31, the insertion front end 6212 comes in contact with a storage portion connection area located between adjacent component storage portions 101a of the carrier tape 101. As a result, smooth traveling of the component storage tape 100 is maintained to allow efficient transfer of the component E2 to the component take-out position 21.

The insertion front end 6212 of the insertion member 621 is formed into a tapered shape such that the insertion front end 6212 tapers off toward its front edge 6212a to reduce in width. On the component storage tape 100 in which the insertion member 621 is inserted, triangular fold pieces 102F are formed on a tip end 102T of the cover tape 102, as shown in FIG. 4. These fold pieces 102F facilitate insertion of the insertion member 621 between the cover tape 102 and the carrier tape 101.

The insertion member 621 is supported by the support portion 623. According to this embodiment, the support portion 623 is disposed on an upper surface of the lid member 8 (which will be described later) connected to the downstream end 6211a in the tape send-off direction H1 of the base portion 6211 of the insertion member 621, and is fixed to the device body 2. In this configuration, the support portion 623 supports the insertion member 621 via the lid member 8.

The cover tape cutting portion 622 cuts the cover tape 102 of the component storage tape 100, which is sent off by the first tape send-off portion 31 and travels on the second guide surface portions 52 as the tip end of the component storage tape 100 is provided as a free end. The cover tape cutting portion 622 cuts the cover tape 102 at a given position (e.g., central position) between both ends in the width direction of the cover tape 102. A cut part 102a (see FIG. 7) of the cover tape 102 cut by the cover tape cutting portion 622 extends linearly along the guide surfaces 5.

The cover tape cutting portion 622 includes a cutter 6221 that cuts the cover tape 102, and a holding portion 6222. The holding portion 6222 has a holding surface 6222a that holds the cutter 6221 in such a way as to expose its cutter edge.

The cover tape cutting portion 622 is supported by the support portion 623 via the lid member 8 such that, in an area 6222b of the holding portion 6222, the area 6222b at least being on the upstream side in the tape send-off direction H1, a surface opposite to the holding surface 6222a is in contact with an upper surface 6211b of the base portion 6211 of the insertion member 621. On the cover tape cutting portion 622, the cutter 6221 held by the holding surface 6222a of the holding portion 6222 faces upward (the +Z-side). According to this configuration, when the component storage tape 100 traveling on the second guide surface portions 52 passes the cover tape cutting portion 622, the insertion member 621 is interposed between an upstream end 6222c of the cover tape cutting portion 622 and the carrier tape 101. This prevents the upstream end 6222c of the cover tape cutting portion 622 from coming in contact with the component E2 stored in the component storage portion 101a of the carrier tape 101. A case where the component E2 is damaged by the cover tape cutting portion 622 coming in contact therewith, therefore, is prevented.

It is preferable that on the holding portion 6222 of the cover tape cutting portion 622, the holding surface 6222a be a sloped surface sloping downward from the downstream side to the upstream side in the tape send-off direction H1. In this configuration, when the component storage tape 100 travels on the second guide surface portions 52 and passes the cover tape cutting portion 622, the component storage tape 100 is guided along the holding surface 6222a of the holding portion 6222, the holding surface 6222a being formed as a sloped surface. As a result, traveling resistance that arises when the component storage tape 100 passes the cover tape cutting portion 622 can be reduced.

The insertion member 621 may be supported by the support portion 623 via the lid member 8 such that the insertion member 621 can be rocked around a given axis J1 extending in the X-axis direction (tape width direction H2). To allow the cover tape cutting portion 622 to rock in a motion interlocked with the rocking of the insertion member 621, the area 6222b of the holding portion 6222, the area 6222b at least being on the upstream side in the tape send-off direction H1, is set in contact with the upper surface 6211b of the base portion 6211 of the insertion member 621. Because of this configuration, for example, when the component storage tape 100 with a warp travels on the guide surfaces 5, the insertion member 621 and the cover tape cutting portion 622, which are inserted between the cover tape 102 and the carrier tape 101, are allowed to rock in response to the warp of the component storage tape 100. Thus, the case where the insertion front end 6212 of the insertion member 621 comes in contact with the storage portion connection area of the carrier tape 101 can be prevented in a steady manner.

As shown in FIG. 12, the cover tape lifting portion 61 is disposed between the pair of guide walls 41 such that the cover tape lifting portion 61 corresponds to the first guide surface portions 51 of the guide surfaces 5. On the component storage tape 100 traveling on the first guide surface portions 51, the cover tape lifting portion 61 comes in contact with the cut part 102a of the cover tape 102 cut by the cover tape cutting portion 622, thereby lifting the cover tape 102 off the carrier tape 101. The cover tape lifting portion 61 includes a lifting start portion 611 and a lifting extent adjusting portion 612.

The lifting start portion 611 makes up an upstream part in the tape send-off direction H1 of the cover tape lifting portion 61. The lifting start portion 611 has a contact starting point P1 at which contact with the cover tape 102 starts, and starts lifting of the cover tape 102 off the carrier tape 101 from the contact starting point P1. The cover tape lifting portion 61 is disposed such that the contact starting point P1 of the lifting start portion 611 is located at the midpoint between the pair of guide walls 41. In other words, the contact starting point P1 of the lifting start portion 611 is on the cut part 102a of the cover tape 102 cut by the cover tape cutting portion 622. On the cover tape lifting portion 61, the lifting start portion 611 is fixed to the lid member 8 described later.

On the tip end 102T of the cover tape 102, the tip end 102T being in contact with the contact starting point P1 of the lifting start portion 611, the triangular fold pieces 102F are formed, as shown in FIG. 4. This helps the lifting start portion 611 smoothly start the lifting of the cover tape 102.

On the cover tape lifting portion 61, the lifting extent adjusting portion 612 is continuous with a downstream end in the tape send-off direction H1 of the lifting start portion 611. The lifting extent adjusting portion 612 continuously increases an extent of lifting of the cover tape 102 off the carrier tape 101 as the component storage tape 100 travels on the first guide surface portions 51. As shown in FIG. 12, the lifting extent adjusting portion 612 is composed of a pair of lifting adjusting pieces 6121 and 6122. Each of the pair of lifting adjusting pieces 6121 and 6122 is a plate-like member that extends from a connection part, where the lifting adjusting piece is connected to the lifting start portion 611, to approach each of the guide walls 41. Downstream ends in the tape send-off direction H1 of the pair of lifting adjusting pieces 6121 and 6122 are in contact respectively with the joined portions 103 where the cover tape 102 is joined to the carrier tape 101, the joined portions 103 being formed on both ends in the tape width direction H2 of the cover tape 102.

On the lifting extent adjusting portion 612, a separation distance between the pair of lifting adjusting pieces 6121 and 6122 in the tape width direction H2 increases gradually from the upstream side toward the downstream side in the tape send-off direction H1. It is understood by referring to FIGS. 16 to 18 that the separation distance between the pair of lifting adjusting pieces 6121 and 6122 increases from the upstream side toward the downstream side in the tape send-off direction H1 in the order of a separation distance W1 (FIG. 16), a separation distance W2 (FIG. 17), and a separation distance W3 (FIG. 18). The pair of lifting adjusting pieces 6121 and 6122 making up the lifting extent adjusting portion 612 allow the continuous increase of the extent of lifting of the cover tape 102 off the carrier tape 101.

As described above, the first guide surface portions 51 of the guide surfaces 5, the first guide surface portions 51 bearing the cover tape lifting portion 61 placed thereon, are of curved shapes. Because of this, compared with a case of placing the cover tape lifting portion 61 on guide surfaces extending horizontally along the tape send-off direction H1, for example, the traveling distance of the component storage tape 100 that travels along the first guide surface portions 51 and passes the cover tape lifting portion 61 is increased. Besides, on the first guide surface portions 51, the lowermost downstream ends 513E in the tape send-off direction H1 are located below the uppermost upstream ends 511E. As a result, on the cover tape 102 having been subjected to the lifting process by the cover tape lifting portion 61, the development of a tensile stress acting in a direction of heading from the downstream end in the tape send-off direction H1 to the contact starting point P1 of the lifting start portion 611 is inhibited. Thus, buckling/deformation of the carrier tape 101 caused by the tensile stress of the cover tape 102 is prevented when the cover tape lifting portion 61 carries out the lifting process on the cover tape 102. As a result, smooth traveling of the component storage tape 100 is maintained to allow efficient transfer of the component E2 to the component take-out position 21.

As shown in FIG. 12, each of the pair of lifting adjusting pieces 6121 and 6122 making up the lifting extent adjusting portion 612 has a first adjusting piece 6123 and a second adjusting piece 6124 connected to a downstream end in the tape send-off direction H1 of the first adjusting piece 6123 via a connection member 613. The second adjusting piece 6124 is connected to the first adjusting piece 6123 in such a way as to be capable of rocking on the connection member 613. The pair of the lifting adjusting pieces 6121 and 6122 each having the first adjusting piece 6123 and the second adjusting piece 6124 are thus capable of rocking in response to a change in traveling behavior of the component storage tape 100 on the first guide surface portions 51. Thus, a drop in the steadiness of the lifting process of lifting the cover tape 102 by the pair of the lifting adjusting pieces 6121 and 6122 is prevented.

As described above, the first guide surface portions 51, on which the cover tape lifting portion 61 is placed, have the first curved areas 511 on the uppermost upstream side in the tape send-off direction H1, the second curved areas 512 continuous with the downstream side in the tape send-off direction H1 of the first curved areas 511, and the third curved areas 513 continuous with the downstream side in the tape send-off direction H1 of the second curved areas 512.

In a view in the X-axis direction (tape width direction H2), the curve of the first guide surface portions 51 in the Z-axis direction (vertical direction) in the first curved areas 511 and the same in the second curved areas 512 are different from each other. The sign of a curvature, therefore, changes in these curved areas 511 and 512. When the component storage tape 100 travels along such first guide surface portions 51, a force of causing the component storage tape 100 to warp in the Z-axis direction (vertical direction) acts on the component storage tape 100 and this force acts in opposite directions respectively in the first curved areas 511 and the second curved areas 512 when the component storage tape 100 passes these curved areas. For this reason, for example, when the cover tape lifting portion 61 is placed on the first guide surface portions 51 to lie across the first curved areas 511 and the second curved areas 512, it raises a possibility that the steadiness of the lifting process of lifting the cover tape 102 by the cover tape lifting portion 61 may drop.

To prevent such a case, the cover tape lifting portion 61 is disposed such that the contact starting point P1 of the lifting start portion 611 is located on a boundary S1 between the first curved areas 511 and the second curved areas 512 or located close to the boundary S1, as shown in FIG. 12. In such a configuration, the cover tape lifting portion 61 has the contact starting point P1 located on the boundary S1 between the first curved areas 511 and the second curved areas 512 or located close to the boundary S1, the contact starting point P1 being the uppermost upstream end of the cover tape lifting portion 61. The cover tape lifting portion 61, therefore, does not lie across the first curved areas 511 and the second curved areas 512 but lies on the second curved areas 512. Thus, a drop in the steadiness of the lifting process of lifting the cover tape 102 by the cover tape lifting portion 61 is prevented. On the cover tape lifting portion 61, the pair of lifting adjusting pieces 6121 and 6122 extend across the second curved areas 512 and the third curved areas 513 of the first guide surface portions 51 in the tape send-off direction H1.

When traveling on the first curved areas 511 and the second curved areas 512 of the first guide surface portions 51, the component storage tape 100 warps while traveling. The component storage tape 100 travels on the first guide surface portions 51 in a case where the component storage tape 100 is sent off by the first tape send-off portion 31 disposed on the upstream side of the first guide surface portions 51 and in another case where the component storage tape 100 is sent off by the second tape send-off portion 32 disposed on the downstream side of the first guide surface portions 51. In both cases, the direction of warp of the component storage tape 100 during traveling changes when the component storage tape 100 passes a point of curvature change, i.e., a boundary between the first curved areas 511 and the second curved areas 512, and, consequently, traveling behavior of the component storage tape 100 on the first guide surface portions 51 changes. Specifically, the component storage tape 100 sent off by the first tape send-off portion 31 warps upward (toward the +Z-side) on the first curved areas 511 and warps downward (toward the −Z-side) on the second curved areas 512. The component storage tape 100 sent off by the second tape send-off portion 32, on the other hand, warps downward (toward the −Z-side) on the first curved areas 511 and warps upward (toward the +Z-side) on the second curved areas 512.

As described above, according to the cover tape lifting portion 61 of this embodiment, only the lifting start portion 611 is fixed to the lid member 8, which will be described later, and the second adjusting pieces 6124 are connected to the first adjusting pieces 6123 in such a way as to be capable of rocking on the connection members 613, respectively. Because of this configuration, the cover tape lifting portion 61 can rock in response to a change in traveling behavior of the component storage tape 100 on the first guide surface portions 51. Thus, a drop in the steadiness of the lifting process of lifting the cover tape 102 by the cover tape lifting portion 61 is prevented.

On the first guide surface portions 51, the third curved areas 513 continuous with the downstream side in the tape send-off direction H1 of the second curved areas 512, on which the cover tape lifting portion 61 is placed, are formed into upward curved shapes. On the lowermost downstream ends in the tape send-off direction H1 of the third curved areas 513, as described above, the second tape send-off portion 32 having the pair of second sprockets 321 is disposed. The third curved areas 513 are formed into the upward curved shapes so that when the holes 101*b* of the carrier tape 101 are fitted to the teeth 321*a* of the pair of second sprockets 321 on the tip end of the component storage tape 100, which is sent off by the first tape send-off portion 31 and travels on the third curved areas 513, fitting the holes 101*b* to the teeth 321*a* is facilitated.

The lid member 8 included in the component feeding device 1 will then be described. The lid member 8 is a member that covers at least a part of each of openings of the component storage portions 101*a* of the component storage tape 100 having been subjected to the exposing process by the component exposing unit 6, the exposing process being carried out to expose the component E2 in the component storage portion 101*a*. In a configuration in which the component feeding device 1 includes the lid member 8, the lid member 8 prevents the component E2 from leaping out of the component storage portion 101*a* when the component storage tape 100 having been subjected to the exposing process is sent off by the tape send-off unit 3. The component feeding device 1, therefore, is allowed to steadily perform transfer of the component to the component take-out position 21.

According to this embodiment, the lid member 8 extends from the downstream end 6211*a* in the tape send-off direction H1 of the base portion 6211 of the insertion member 621 to the component take-out position 21 along the guide surfaces 5. The lid member 8, which is connected to the downstream end 6211*a* of the base portion 6211 of the insertion member 621, is inserted between the cover tape 102 and the carrier tape 101 of the component storage tape 100 sent off by the tape send-off unit 3. In this state, the lid member 8 covers the component storage portion 101*a* along the guide surfaces 5. The lid member 8 thus has a function of guiding the component storage tape 100 in its traveling, the component storage tape 100 being sent off by the tape send-off unit 3, while being inserted between the cover tape 102 and the carrier tape 101.

As mentioned above, when the component storage tape 100 travels on the first curved areas 511 and the second curved areas 512 of the first guide surface portions 51, the component storage tape 100 warps while traveling. This raises a possibility that, on the component storage tape 100 traveling on the first curved areas 511 and the second curved areas 512 of the first guide surface portions 51, a frictional force created by contact between the lid member 8, which covers the component storage portion 101*a*, and the carrier tape 101 may increase.

It is therefore preferable that the lid member 8 be a member having flexibility. In a configuration in which the lid member 8 is a flexible member, when the component storage tape 100 warps while traveling on the first curved areas 511 and the second curved areas 512 of the first guide surface portions 51, the lid member 8 warps in response to the warp of the component storage tape 100. As a result, on the component storage tape 100 traveling on the first curved areas 511 and the second curved areas 512 of the first guide surface portions 51, an increase in the frictional force created by contact between the lid member 8, which covers the component storage portion 101*a*, and the carrier tape 101 can be suppressed. Traveling resistance that arises when the component storage tape 100 travels on the guide surfaces 5, therefore, can be reduced. It is also preferable that the lid member 8 be made of a metal so that no static electricity is generated by the lid member 8. The lid member 8 may be of a structure in which a conductive layer is formed on the surface of a base material made of plastic or the like.

On the component exposing unit 6, the cover tape post-processing portion 63 is disposed on the upper side (+Z-side) relative to the cover tape lifting portion 61. The cover tape post-processing portion 63 pushes lifted parts of the cover tape 102 lifted by the cover tape lifting portion 61 to outside of respective side edges in the tape width direction H2 of the component storage tape 100 while folding the lifted parts downward (toward the −Z-side) to make the component storage portion 101*a* open to the outside. As shown in FIGS. 13 to 19, the cover tape post-processing portion 63 includes an upper regulating portion 631 and side regulating portions 632.

On the cover tape post-processing portion 63, the upper regulating portion 631 is set above and facing the first guide surface portions 51 of the guide surfaces 5 across a gap. The upper regulating portion 631 carries out first post-processing of regulating the upward movement of lifted parts of the cover tape 102 lifted by the cover tape lifting portion 61 while pushing the lifted parts of the cover tape 102 to outside of respective side edges in the tape width direction H2 of the component storage tape 100 to make the component storage portion 101*a* open to the outside. The gap between the upper regulating portion 631 and the first guide surface portions 51 of the guide surfaces 5 is determined such that the gap becomes narrower as it extends from the upstream side to the downstream side in the tape send-off direction H1. It is understood by referring to FIGS. 17 to 19 that the gap between the upper regulating portion 631 and the first guide surface portions 51 becomes narrower to take three forms of gaps L1 (FIG. 17), L2 (FIG. 18), and L3 (FIG. 19) in the size decreasing order as the gap extends from the upstream side to the downstream side in the tape send-off direction H1. In this configuration, the upper regulating portion 631 can push the lifted parts of the cover tape 102 to the outside such that an extent of outward movement of the lifted parts toward respective side edges in the tape width direction H2 of the cover tape 102 increases in response to a continuous increase in an extent of lifting by the lifting extent adjusting portion 612. As a result, the component storage portion 101*a* can be opened to the outside effectively, which facilitates taking out the component E2 at the component take-out position 21.

The upper regulating portion 631 has an upper regulation starting point P2 (see FIGS. 14 and 15), which serves as a point of starting regulation of the upward movement of the cover tape 102 lifted by the cover tape lifting portion 61. On the tip end 102T of the cover tape 102, the tip end 102T coming in contact with the upper regulation starting point P2 of the upper regulating portion 631, the triangular fold pieces 102F (see FIG. 4) are formed, as shown in FIG. 17.

This allows the upper regulating portion 631 to smoothly push outward the lifted parts of the cover tape 102 lifted by the cover tape lifting portion 61.

According to this embodiment, as shown in FIGS. 13 and 14, the upper regulating portion 631 has a first upper regulating area 6311 and a second upper regulating area 6312. The first upper regulating area 6311 is counter to the second curved areas 512 of the first guide surface portions 51 and extends from the upstream side to the downstream side in the tape send-off direction H1, as a downward slope. The second upper regulating area 6312 is continuous with the downstream side in the tape send-off direction H1 of the first upper regulating area 6311. The second upper regulating area 6312 is counter to the third curved areas 513 of the first guide surface portions 51 and extends horizontally along the tape send-off direction H1. In this configuration, a gap between the first upper regulating area 6311 of the upper regulating portion 631 and the second curved areas 512 of the first guide surface portions 51 becomes narrower in correspondence to the downward slope of the first upper regulating area 6311. A gap between the second upper regulating area 6312 of the upper regulating portion 631 and the third curved areas 513 of the first guide surface portions 51, on the other hand, becomes narrower in correspondence to the upward curved shapes of the third curved areas 513. In other words, the gap between the upper regulating portion 631 and the first guide surface portions 51 can be determined such that the gap becomes narrower as it extends from the upstream side to the downstream side in the tape send-off direction H1.

On a lower surface (surface counter to the first guide surface portions 51) of the second upper regulating area 6312 of the upper regulating portion 631, a pair of lifting extent adjusting auxiliary pieces 633 are formed as projections on a downstream end in the tape send-off direction H1, as shown in FIGS. 14, 15, and 19. The pair of lifting extent adjusting auxiliary pieces 633 are plate-like projections that project from downstream ends of the pair of lifting adjusting pieces 6121 and 6122 to approach the pair of guide walls 41, respectively, while extending from the upstream side to the downstream side in the tape send-off direction H1. A separation distance between the pair of lifting extent adjusting auxiliary pieces 633 along the tape width direction H2 increases gradually as the lifting extent adjusting auxiliary pieces 633 extend from the upstream side to the downstream side in the tape send-off direction H1. A separation distance W4 between the pair of lifting extent adjusting auxiliary pieces 633 (FIG. 19) is larger than the separation distance W3 between the pair of lifting adjusting pieces 6121 and 6122 on their downstream side (FIG. 18). On the downstream side of the pair of lifting adjusting pieces 6121 and 6122, the pair of lifting extent adjusting auxiliary pieces 633 continuously increase the extent of lifting of the cover tape 102.

On the cover tape post-processing portion 63, the side regulating portions 632 are extended downward from both ends in the width direction of the upper regulating portion 631, respectively, such that the side regulating portions 632 face the side end faces of the component storage tape 100, respectively, from the outside of the pair of guide walls 41 in the tape width direction H2. The side regulating portions 632 carry out second post-processing of regulating the sidewise movement of the lifted parts of the cover tape 102, the lifted parts being pushed to outside of respective side edges in the tape width direction H2 of the component storage tape 100 by the upper regulating portion 632, while folding the lifted parts downward.

When the lifted parts of the cover tape 102 pushed outward by the upper regulating portion 631 are folded downward by the side regulating portions 632, the carrier tape 101 may possibly buckle or deform. To prevent such a case, the cover tape post-processing portion 63 is configured such that a side regulation starting point P3 (see FIGS. 14 and 15), which serves as a point of starting the downward folding of the lifted parts of the cover tape 102 by the side regulating portions 632, is located in the second upper regulating area 6312 of the upper regulating portion 631, the second upper regulating area 6312 extending horizontally in the tape send-off direction H1. This inhibits the buckling or deformation of the carrier tape 101 when the lifted parts of the cover tape 102 are folded downward from the side regulation starting point P3.

On the tip end 102T of the cover tape 102, the tip end 102T coming in contact with the side regulation starting point P3 of the side regulating portions 632, the triangular fold pieces 102F (see FIG. 4) are formed, as shown in FIG. 18. This allows the side regulating portions 632 to smoothly fold the lifted parts of the cover tape 102 downward, the lifted parts being pushed to outside of respective side edges in the tape width direction H2 of the component storage tape 100 by the upper regulating portion 631.

<Modifications of Cover Tape Post-Processing Portion>

Figure 20A:
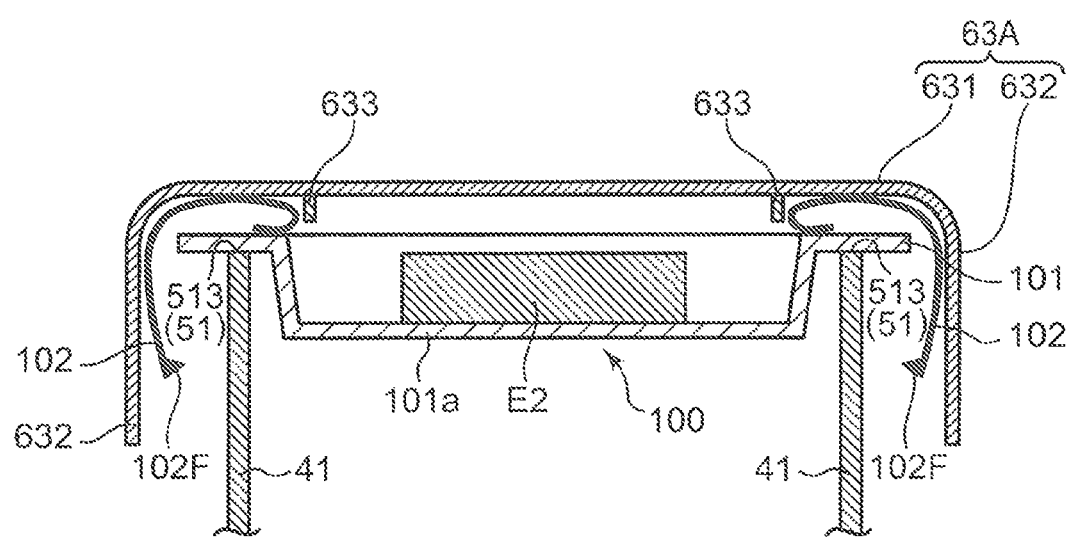
FIG. 20A is a sectional view of a modification of the cover tape post-processing portion.
Figure 20B:
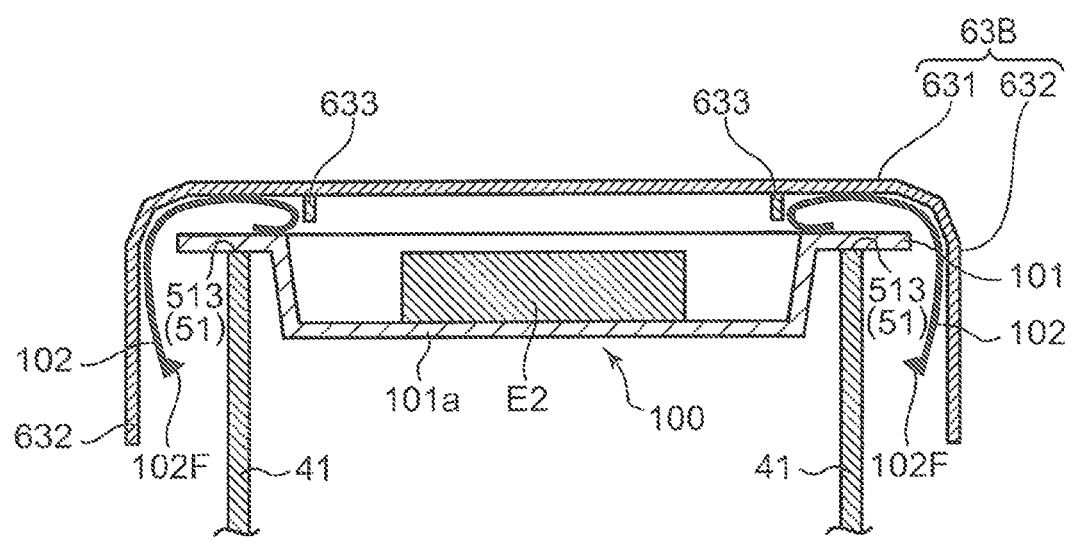
FIG. 20B is a sectional view of a modification of the cover tape post-processing portion.

FIGS. 20A and 20B are sectional views of modifications of the cover tape post-processing portion. Cover tape post-processing portions 63A and 63B shown in FIGS. 20A and 20B as modifications are different from the cover tape post-processing portion 63 in the shape of corners where the upper regulating portion 631 is connected to the side regulating portions 632. Except this respect, however, the cover tape post-processing portions 63A and 63B are the same in configuration as the cover tape post-processing portion 63.

On the cover tape post-processing portion 63A shown in FIG. 20A, the corners where the upper regulating portion 631 is connected to the side regulating portions 632 have curved shapes. These curved shapes are similar to the shapes of lifted parts of the cover tape 102 that are pushed outward and folded downward by the upper regulating portion 631 and the side regulating portions 632. By forming the corners, where the upper regulating portion 631 is connected to the side regulating portions 632, into the curved shapes, the lifted parts of the cover tape 102, the lifted parts being pushed outward by the upper regulating portion 631, can be folded downward smoothly by the side regulating portions 632.

On the cover tape post-processing portion 63B shown in FIG. 20B, the corners where the upper regulating portion 631 is connected to the side regulating portions 632 have polygonal shapes similar to the above curved shapes. By forming the corners, where the upper regulating portion 631 is connected to the side regulating portions 632, into the polygonal shapes similar to the curved shapes, the lifted parts of the cover tape 102, the lifted parts being pushed outward by the upper regulating portion 631, can be folded downward smoothly by the side regulating portions 632.

<Modifications of Component Exposing Unit>

(First Modification)

FIG. 21 is a side view of a principle part of a component exposing unit 6C provided as a first modification. The component exposing unit 6C includes a cover tape post-processing portion 63C that is different in configuration from the cover tape post-processing portion 63 of the above component exposing unit 6. Except this respect, the component exposing unit 6C is the same in configuration as the component exposing unit 6.

On the component exposing unit 6C shown in FIG. 21, the cover tape post-processing portion 63C is disposed on the upper side relative to the cover tape lifting portion 61. The cover tape post-processing portion 63C pushes lifted parts of the cover tape 102 lifted by the cover tape lifting portion 61 to outside of both side edges in the tape width direction H2 of the component storage tape 100 while folding the lifted parts downward to make the component storage portion 101a open to the outside. The cover tape post-processing portion 63C is disposed in the third curved areas 513 of the first guide surface portions 51.

Before description of a configuration of the cover tape post-processing portion 63C, the first guide surface portions 51 will be described. Each of the first guide surface portions 51 has the first curved area 511 on the uppermost upstream side in the tape send-off direction H1, the second curved area 512 continuous with the downstream side in the tape send-off direction H1 of the first curved area 511, and the third area 513 continuous with the downstream side in the tape send-off direction H1 of the second curved area 512. The first curved area 511 is formed into an upward curved shape in a view in the X-axis direction. The second curved area 512 is formed into a downward curved shape in a view in the X-axis direction. The third area 513 extends horizontally along the tape send-off direction H1, from a lowermost point of the second curved area 512.

The cover tape post-processing portion 63C includes an upper regulating portion 63CA and side regulating portions 63CB. On the cover tape post-processing portion 63C, the upper regulating portion 63CA is disposed above and facing the third curved areas 513 of the first guide surface portions 51 across a gap, the third curved areas 513 extending horizontally. The upper regulating portion 63CA carries out first post-processing of regulating the upward movement of lifted parts of the cover tape 102 lifted by the cover tape lifting portion 61 while pushing the lifted parts of the cover tape 102 to outside of respective side edges in the tape width direction H2 of the component storage tape 100 to make the component storage portion 101a open to the outside. The upper regulating portion 63CA starts regulating the upward movement of lifted parts of the cover tape 102, from the upper regulation starting point P2, thus pushing the lifted parts of the cover tape 102 outward. The upper regulating portion 63CA is formed into a curved shape sloping downward from the upstream side to the downstream side in the tape send-off direction H1.

A gap between the upper regulating portion 63CA of the curved shape sloping downward and the third curved areas 513 of the first guide surface portions 51, the third curved areas 513 extending horizontally, becomes narrower as the upper regulating portion 63CA slopes downward. In other words, the gap between the upper regulating portion 63CA and the third curved areas 513 of the first guide surface portions 51 is determined such that the gap becomes narrower as it extends from the upstream side to the downstream side in the tape send-off direction H1. In this configuration, the upper regulating portion 63CA can push the lifted parts of the cover tape 102 outward such that an extent of outward movement of the lifted parts toward respective side edges in the tape width direction H2 of the cover tape 102 increases in response to a continuous increase in an extent of lifting by the lifting extent adjusting portion 612 of the cover tape lifting portion 61. As a result, the component storage portion 101a can be opened to the outside effectively, which facilitates taking out the component E2 at the component take-out position 21.

On the cover tape post-processing portion 63C, the side regulating portions 63CB are extended downward from both ends in the width direction of the upper regulating portion 63CA, respectively, such that the side regulating portions 63CB face the side end faces of the component storage tape 100, respectively, from the outside of the pair of guide walls 41 in the tape width direction H2. The side regulating portions 63CB carry out second post-processing of regulating the sidewise movement of the lifted parts of the cover tape 102, the lifted parts being pushed to outside of respective side edges in the tape width direction H2 of the component storage tape 100 by the upper regulating portion 63CA, while folding the lifted parts downward. The side regulating portions 63CB starts regulating the sidewise movement of lifted parts of the cover tape 102, from the side regulation starting point P3, thus folding the lifted parts of the cover tape 102 downward.

(Second Modification and Third Modification)

Figure 23:
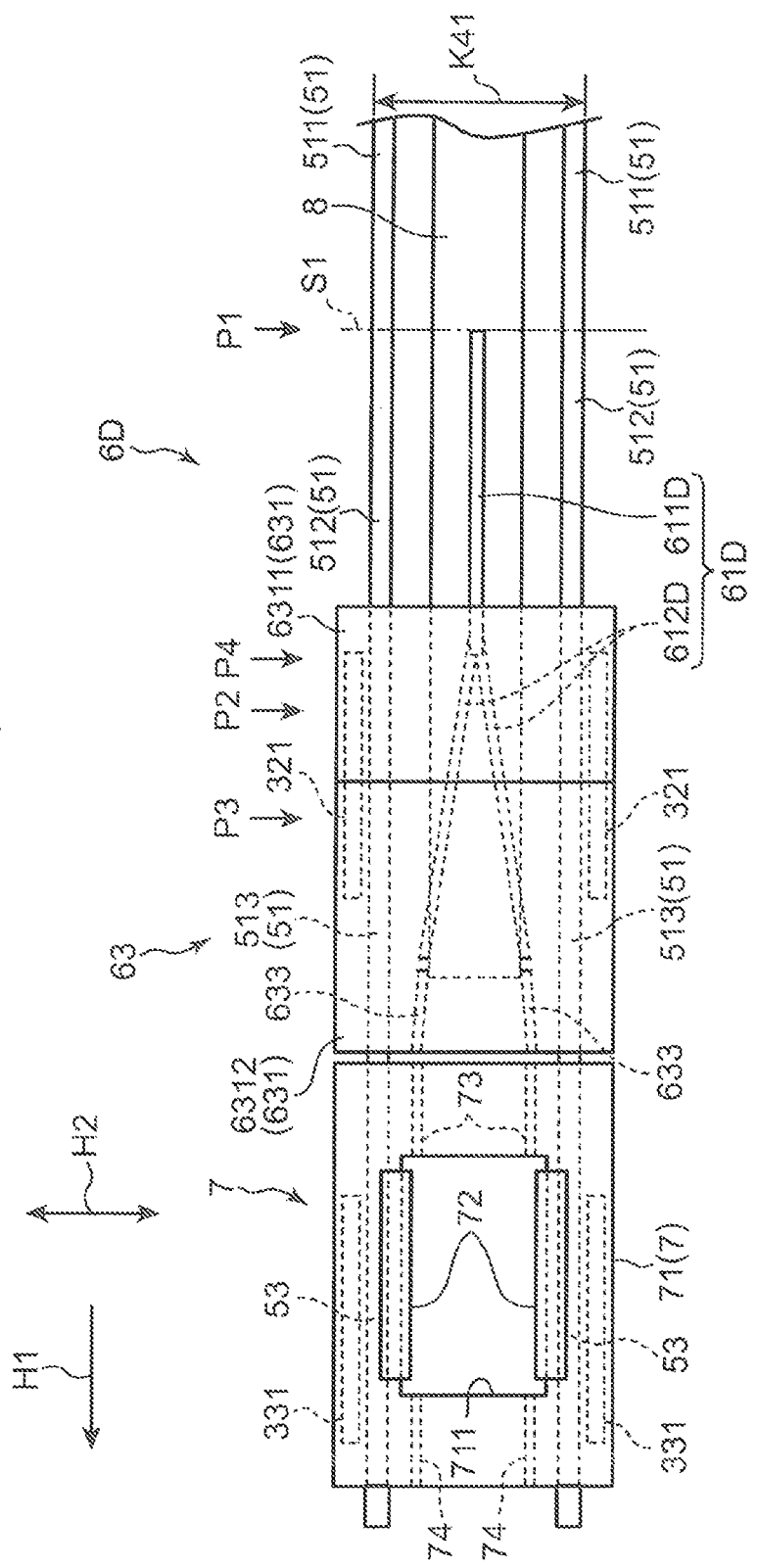
FIG. 23 is a plan view of the principle part of the component exposing unit provided as the second modification.
Figure 24:
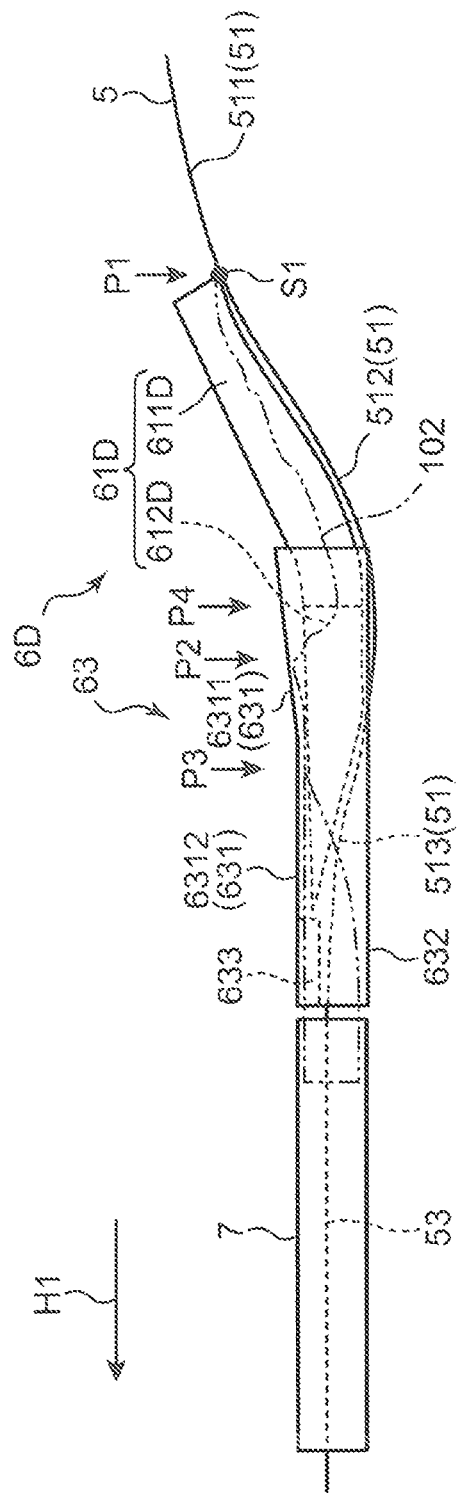
FIG. 24 is a diagram for explaining a state in which a cover tape is processed by the component exposing unit provided as the second modification.
Figure 25:
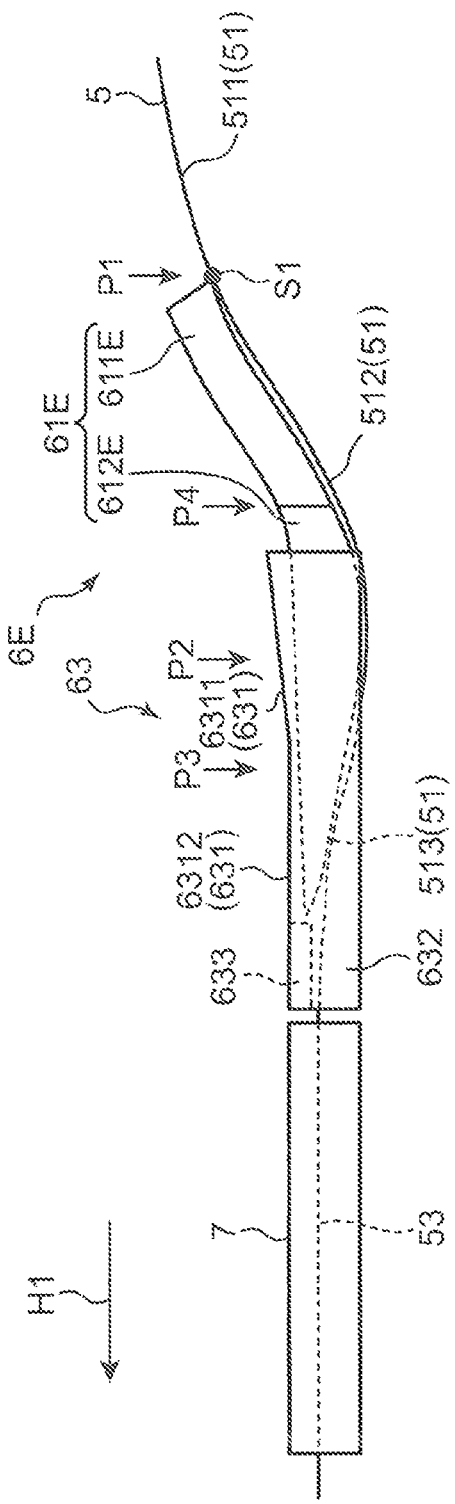
FIG. 25 is a side view of a principle part of a component exposing unit provided as a third modification.
Figure 26:
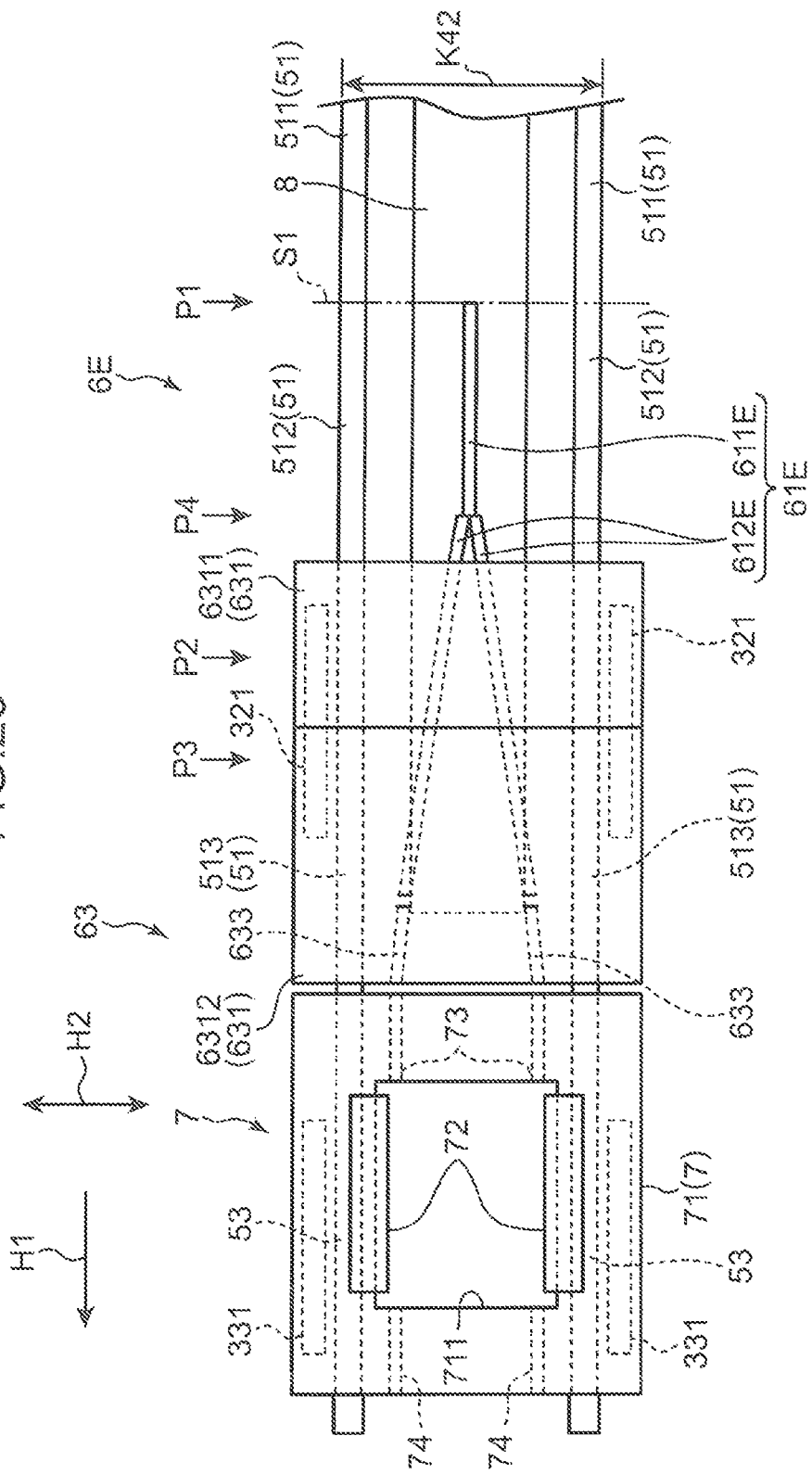
FIG. 26 is a plan view of the principle part of the component exposing unit provided as the third modification.
Figure 27:
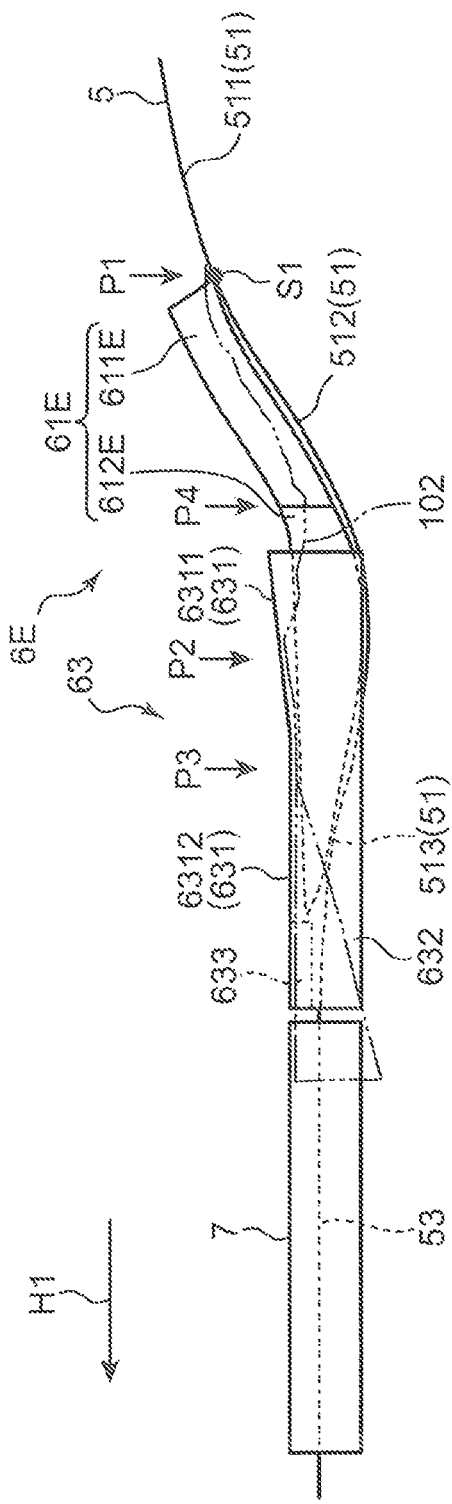
FIG. 27 is a diagram for explaining a state in which the cover tape is processed by the component exposing unit provided as the third modification.

FIGS. 22 to 24 depict a principle part of a component exposing unit 6D provided as a second modification. FIG. 22 is a side view of the principle part of the component exposing unit 6D, FIG. 23 is a plan view of the principle part of the component exposing unit 6D, and FIG. 24 is a diagram for explaining a state in which the cover tape 102 is processed by the component exposing unit 6D. FIGS. 25 to 27 depict a principle part of a component exposing unit 6E provided as a third modification. FIG. 25 is a side view of the principle part of the component exposing unit 6E, FIG. 26 is a plan view of the principle part of the component exposing unit 6E, and FIG. 27 is a diagram for explaining a state in which the cover tape 102 is processed by the component exposing unit 6E. The component exposing unit 6D and the component exposing unit 6E have a cover tape lifting portion 61D and a cover tape lifting portion 61E, respectively, and these cover tape lifting portion 61D and cover tape lifting portion 61E are each different in configuration from the cover tape lifting portion 61 of the above component exposing unit 6. Except this respect, each of the component exposing unit 6D and the component exposing unit 6E is the same in configuration as the component exposing unit 6.

A plurality of the component feeding devices 1 arranged in the component feeding section 10A of the component mounter 10 include component feeding devices fitted with component storage tapes 100 different in tape width from each other. In the following description, a component feeding device fitted with a component storage tape 100 with a first tape width is referred to as a "first component feeding device 1A", and a component feeding device fitted with a component storage tape 100 with a second tape width larger than the first tape width is referred to as a "second component feeding device 1B". The component exposing unit included in the first component feeding device 1A is the component exposing unit 6D shown in FIGS. 22 to 24. The component exposing unit included in the second component feeding device 1B is the component exposing unit 6E shown in FIGS. 25 to 27.

The pair of guide walls 41 included in the first component feeding device 1A and the same included in the second component feeding device 1B are different from each other in a separation distance between respective outer surfaces of the guide walls 41 because the component storage tape 100 in the first component feeding device 1A and the same in the second component feeding device 1B are different in tape width from each other. To put it another way, a separation distance K42 (FIG. 26) between respective outer surfaces of the pair of guide walls 41 of the second component feeding device 1B fitted with a component storage tape 100 with a large tape width is larger than a separation distance K41 (FIG. 23) between respective outer surfaces of the pair of guide walls 41 of the first component feeding device 1A. However, the curved shape of the first guide surface portions 51 of the first component feeding device 1A, in which the cover tape lifting portion 61D is placed on the first guide surface portions 51, is the same as the curved shape of the first guide surface portions 51 of the second component feeding device 1B, in which the cover tape lifting portion 61E is placed on the first guide surface portions 51 (see FIGS. 22 and 25).

The cover tape lifting portion 61D of the component exposing unit 6D included in the first component feeding device 1A will first be described with reference to FIGS. 22 to 24.

The cover tape lifting portion 61D is disposed between the pair of guide walls 41 such that the cover tape lifting portion 61D corresponds to the first guide surface portions 51. On the component storage tape 100 traveling on the first guide surface portions 51, the cover tape lifting portion 61D comes in contact with the cut part 102a of the cover tape 102 cut by the cover tape cutting portion 622 and lifts the cover tape 102 off the carrier tape 101. The cover tape lifting portion 61D includes a lifting start portion 611D and a lifting extent adjusting portion 612D.

The lifting start portion 611D makes up an upstream part in the tape send-off direction H1 of the cover tape lifting portion 61D. The lifting start portion 611D has the contact starting point P1 at which contact with the cover tape 102 starts, and starts lifting of the cover tape 102 off the carrier tape 101 from the contact starting point P1. As shown in FIG. 23, the lifting start portion 611D extends linearly along the tape send-off direction H1. The cover tape lifting portion 61D is disposed such that the contact starting point P1 of the lifting start portion 611D is located at the midpoint between the pair of guide walls 41. In other words, the contact starting point P1 of the lifting start portion 611D is on the cut part 102a of the cover tape 102 cut by the cover tape cutting portion 622. On the cover tape lifting portion 61D, the lifting start portion 611D is fixed to the lid member 8.

On the cover tape lifting portion 61D, the lifting extent adjusting portion 612D is continuous with a downstream end in the tape send-off direction H1 of the lifting start portion 611D. The lifting extent adjusting portion 612D continuously increases an extent of lifting of the cover tape 102 off the carrier tape 101 as the component storage tape 100 travels on the first guide surface portions 51.

On the cover tape lifting portion 61D, a boundary between the lifting start portion 611D and the lifting extent adjusting portion 612D serves as a point at which adjustment by the lifting extent adjusting portion 612D of an extent of lifting of the cover tape 102 starts (which will hereinafter be referred to as a "lifting extent adjustment starting point P4"). In the tape send-off direction H1, the lifting extent adjustment starting point P4 of the lifting extent adjusting portion 612D is located in the first upper regulating area 6311 of the upper regulating portion 631 of the cover tape post-processing portion 63.

A state in which the cover tape 102 is processed by the component exposing unit 6D will be described with reference to FIG. 24, as follows. When the tip end 102T of the cover tape 102 of the component storage tape 100, which travels on the first guide surface portions 51, comes in contact with the contact starting point P1 of the lifting start portion 611D, lifting of the cover tape 102 starts. The lifting extent adjusting portion 612D continuously increases an extent of lifting of the cover tape 102 off the carrier tape 101, from the lifting extent adjustment starting point P4. The upper regulating portion 631 pushes outward lifted parts of the cover tape 102 lifted by the lifting extent adjusting portion 612D, from the upper regulation starting point P2. The side regulating portions 632 fold downward the lifted parts of the cover tape 102 pushed outward by the upper regulating portion 631, from the side regulation starting point P3. In this manner, the component exposing unit 6D exposes the component E2 in the component storage portion 101a.

The cover tape lifting portion 61E of the component exposing unit 6E included in the second component feeding device 1B will then be described with reference to FIGS. 25 to 27.

The cover tape lifting portion 61E is disposed between the pair of guide walls 41 such that the cover tape lifting portion 61E corresponds to the first guide surface portions 51. On the component storage tape 100 traveling on the first guide surface portions 51, the cover tape lifting portion 61E comes in contact with the cut part 102a of the cover tape 102 cut by the cover tape cutting portion 622 and lifts the cover tape 102 off the carrier tape 101. The cover tape lifting portion 61E includes a lifting start portion 611E and a lifting extent adjusting portion 612E.

The lifting start portion 611E makes up an upstream part in the tape send-off direction H1 of the cover tape lifting portion 61E. The lifting start portion 611E has the contact starting point P1 at which contact with the cover tape 102 starts, and starts lifting of the cover tape 102 off the carrier tape 101 from the contact starting point P1. In the same manner as the above lifting start portion 611D, the lifting start portion 611E extends linearly along the tape send-off direction H1 (see FIG. 26). The cover tape lifting portion 61E is disposed such that the contact starting point P1 of the lifting start portion 611E is located at the midpoint between the pair of guide walls 41. In other words, the contact starting point P1 of the lifting start portion 611E is on the cut part 102a of the cover tape 102 cut by the cover tape cutting portion 622. On the cover tape lifting portion 61E, the lifting start portion 611E is fixed to the lid member 8.

On the cover tape lifting portion 61E, the lifting extent adjusting portion 612E is continuous with a downstream end in the tape send-off direction H1 of the lifting start portion 611E. The lifting extent adjusting portion 612E continuously increases an extent of lifting of the cover tape 102 off the carrier tape 101 as the component storage tape 100 travels on the first guide surface portions 51.

On the cover tape lifting portion 61E, a boundary between the lifting start portion 611E and the lifting extent adjusting portion 612E serves as a point at which adjustment by the lifting extent adjusting portion 612E of an extent of lifting of the cover tape 102 starts (lifting extent adjustment starting point P4). The lifting extent adjustment starting point P4 of the lifting extent adjusting portion 612E is located on the upstream side in the tape send-off direction H1 relative to the first upper regulating area 6311 of the upper regulating portion 631 of the cover tape post-processing portion 63. In other words, the lifting extent adjustment starting point P4 of the lifting extent adjusting portion 612E is located further upstream in the tape send-off direction H1 than the above lifting extent adjusting portion 612D.

A state in which the cover tape 102 is processed by the component exposing unit 6E will be described with reference to FIG. 27, as follows. When the tip end 102T of the cover tape 102 of the component storage tape 100, which travels on the first guide surface portions 51, comes in contact with the contact starting point P1 of the lifting start portion 611E, lifting of the cover tape 102 starts. The lifting extent adjusting portion 612E continuously increases an extent of lifting of the cover tape 102 off the carrier tape 101, from the lifting extent adjustment starting point P4. The upper regulating portion 631 pushes outward lifted parts of the cover tape 102 lifted by the lifting extent adjusting portion 612E, from the upper regulation starting point P2. The side regulating portions 632 fold downward the lifted parts of the cover tape 102 pushed outward by the upper regulating portion 631, from the side regulation starting point P3. In this manner, the component exposing unit 6E exposes the component E2 in the component storage portion 101a.

In the component feeding device 1 that feeds the component E2 using the component storage tape 100, an extent of lifting of the cover tape 102, the extent of lifting being required for making the component storage portion 101a open to the outside, gets larger as the tape width of the component storage tape 100 gets larger. In other words, comparing the first component feeding device 1A using the component storage tape 100 with the first tape width with the second component feeding device 1B using the component storage tape 100 with the second tape width larger than the first tape width reveals that the extent of lifting of the cover tape 102 needs to be larger in the second component feeding device 1B than in the first component feeding device 1A.

One method of increasing the extent of lifting of the cover tape 102 is, for example, to design the first guide surface portions 51, on which the cover tape lifting portion 61 is placed, in such a way as to give the first guide surface portions 51 a shape in which a traveling distance traveled by the component storage tape 100 when it passes the cover tape lifting portion 61 is increased. This means that the shape of the first guide surface portions 51 of the first component feeding device 1A and the same of the second component feeding device 1B are made different from each other such that the traveling distance on the first guide surface portions 51 in the second component feeding device 1B becomes longer than the same in the first component feeding device 1A. This method, however, leads to a case where because of the difference in the shape of the first guide surface portions 51 between the first component feeding device 1A and the second component feeding device 1B, the first component feeding device 1A and the second component feeding device 1B become different from each other in height or length in the tape send-off direction H1. In this case, therefore, the first component feeding device 1A and the second component feeding device 1B are no longer in a state of being uniformly arranged in the component feeding section 10A. In addition, because of the difference in the traveling distance traveled by the component storage tape 100 on the first guide surface portions 51, the first component feeding device 1A and the second component feeding device 1B become also different from each other in component feeding speed.

To deal with such problems, on the above cover tape lifting portions 61D and 61E included respectively in the first component feeding device 1A and the second component feeding device 1B, respective boundaries (lifting extent adjustment starting points P4) between the lifting start portions 611D and 611E and the lifting extent adjusting portions 612D and 612E are made different in location from each other. Specifically, the lifting extent adjustment starting point P4 in the second component feeding device 1B is located further upstream in the tape send-off direction H1 than the same in the first component feeding device 1A. In the second component feeding device 1B having the lifting extent adjustment starting point P4 located further upstream than the lifting extent adjustment starting point P4 of the first component feeding device 1A, a point of time of starting the continuous increase in the extent of lifting of the cover tape 102 arrives earlier than in the first component feeding device 1A. In this configuration, the extent of lifting of the cover tape 102, the extent of lifting being required for making the component storage portion 101a open to the outside, can be ensured, using the first guide surface portions 51 of a common shape, that is, without giving the first guide surface portions 51 different shapes in accordance with the different tape widths of the component storage tapes 100.

The component feeding device and the component mounter according to the embodiment of the present disclosure have been described above. The present disclosure is, however, not limited to these component feeding device and the component mounter but may be embodied as the following modified embodiments.

First Modified Embodiment

Figure 28:
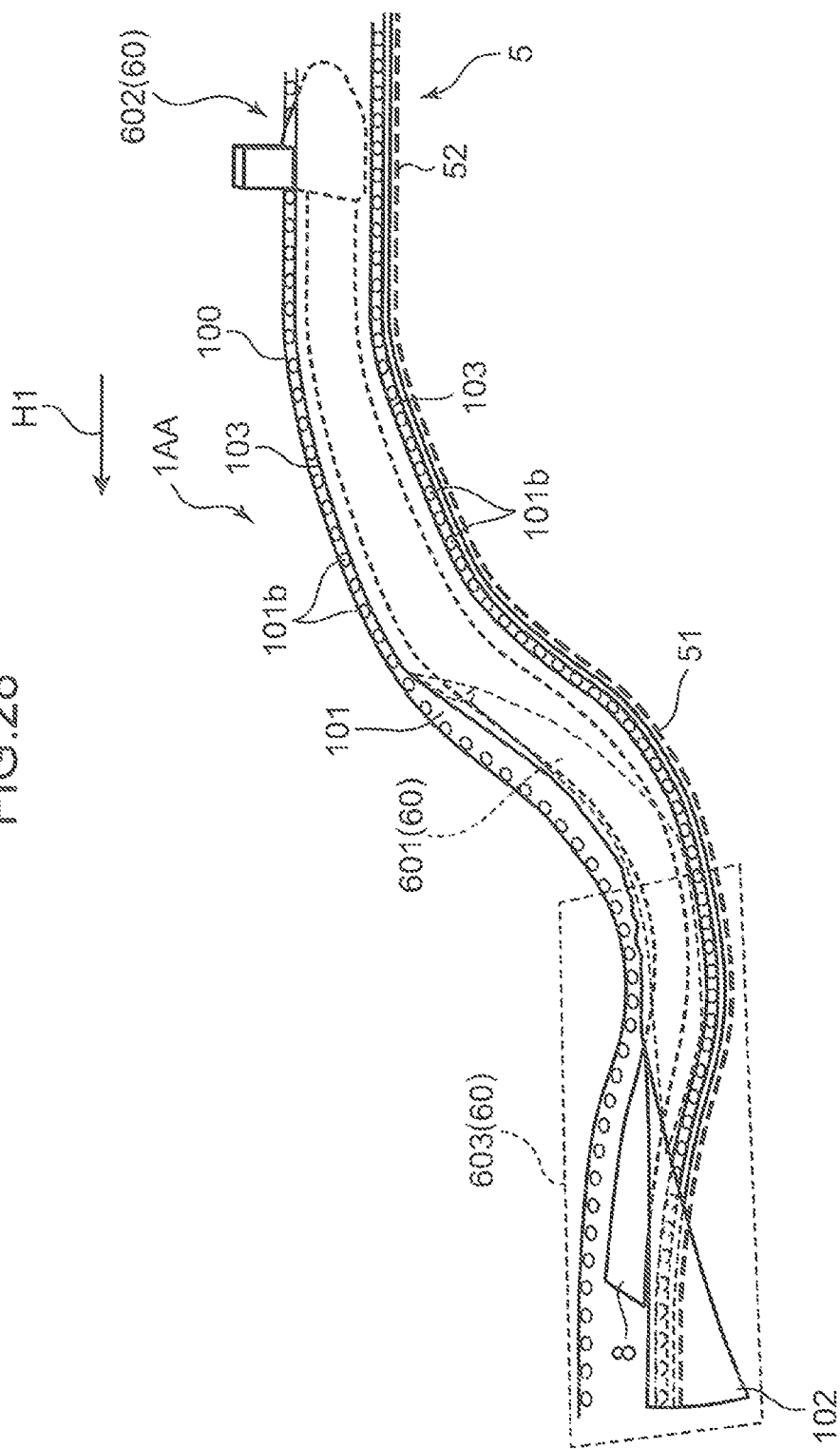
FIG. 28 is a perspective view of a component exposing unit of a cover tape separating type.

In the embodiment described above, the component exposing unit 6 of the component feeding device 1, the component exposing unit 6 being of the cover tape cutting type, includes the cover tape pre-processing portion 62 that cuts the cover tape 102 of the component storage tape 100. The present disclosure is, however, not limited to this configuration. As shown in FIG. 28, the component feeding device may be configured to include a component exposing unit 60 of a cover tape separating type. On a component feeding device 1AA shown in FIG. 28, the component exposing unit 60 lifts the cover tape 102 of the component storage tape 100, which travels as it is guided by the guide surfaces 5 of the pair of guide walls 41, along the joined portion 103 serving as a starting point, the joined portion 103 being on one end in the tape width direction, and pushes a lifted part of the cover tape 102 outward in the tape width direction while folding the lifted part downward to expose the component E2 in the component storage portion 101a.

The component exposing unit 60 of the cover tape separating type includes a cover tape lifting portion 601, a cover tape pre-processing portion 602, and a cover tape post-processing portion 603.

The cover tape lifting portion 601 is disposed between the pair of guide walls 41 such that the cover tape lifting portion 601 corresponds to the first guide surface portions 51 of the guide surfaces 5. The cover tape lifting portion 601 carries out a lifting process of lifting the cover tape 102 off the carrier tape 101 such that an extent of lifting the cover tape 102 off the carrier tape 101 increases continuously on the component storage tape 100, which travels as it is guided by the first guide surface portions 51. An upstream end in the tape send-off direction H1 of the cover tape lifting portion 601 is fixed to the lid member 8. The cover tape lifting portion 601 extends from the upstream side toward the downstream side in the tape send-off direction H1 in such a way as to head from one side to the other side in the tape width direction. In other words, on the cover tape lifting portion 601, a point of starting contact with the cover tape 102 is located on one end on one side in the tape width direction. On the cover tape lifting portion 601, a lowermost downstream end, which is a point of ending contact with the cover tape 102, is located on the other end on the other side in the tape width direction.

The cover tape pre-processing portion 602 is disposed between the pair of guide walls 41 such that the cover tape pre-processing portion 602 corresponds to the second guide surface portions 52 of the guide surfaces 5. Before the cover tape lifting portion 601 carries out the lifting process, the cover tape pre-processing portion 602 carries out pre-processing of separating the joined portion 103 where the cover tape 102 is joined to the carrier tape 101, the joined portion 103 being on the one end on the one side in the tape width direction of the cover tape 102.

The cover tape post-processing portion 603 is disposed on the upper side relative to the cover tape lifting portion 601 such that the cover tape post-processing portion 603 corresponds to the first guide surface portions 51 of the guide surfaces 5. The cover tape post-processing portion 603 carries out post-processing of pushing a lifted part of the cover tape 102 lifted by the cover tape lifting portion 601 to outside of a side edge in the tape width direction of the component storage tape 100, the side edge being on the side opposite to the side on which the cover tape 102 is separated by the cover tape pre-processing portion 602, while folding the lifted part downward to make the component storage portion 101a open to the outside.

According to the component exposing unit 60 of the cover tape separating type, the cover tape 102 of the component storage tape 100, which travels along the guide surfaces 5, is separated by the cover tape pre-processing portion 602, is lifted by the cover tape lifting portion 601, and is pushed outward by the cover tape post-processing portion 603. This exposes the component E2 in the component storage portion 101a of the component storage tape 100 so that the component E2 can be taken out.

Second Modified Embodiment

Figure 29:
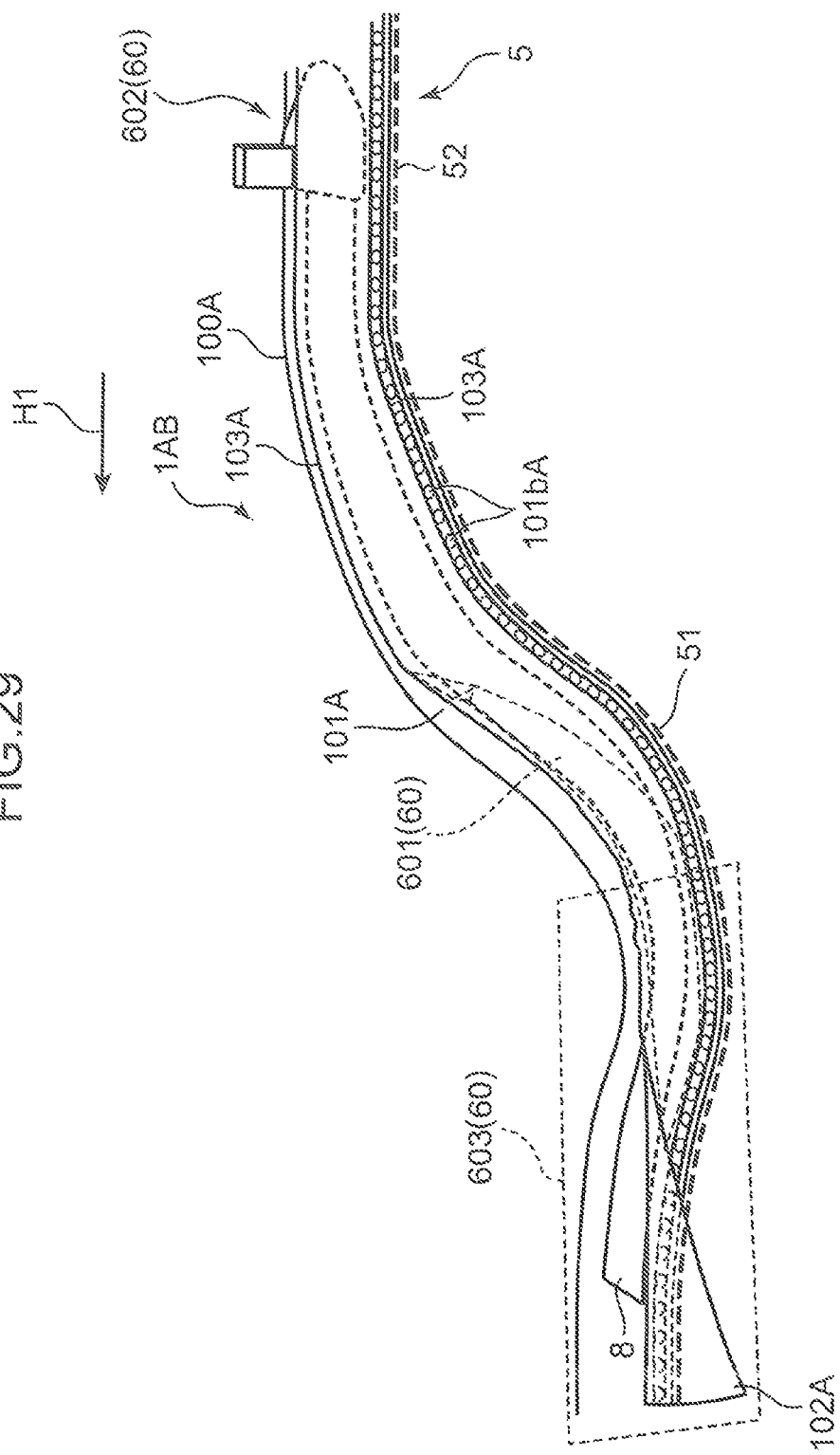
FIG. 29 is a perspective view of a component exposing unit used for a component storage tape with a small width.

In the embodiment described above, the component feeding device that feeds components using the component storage tape 100 with a large width of 32 mm or more has been described. According to the present disclosure, the configuration of the component feeding device is not limited to this. The component feeding device, for example, may be configured such that it feeds components using a component storage tape with a small width of less than 32 mm (e.g., 12 mm, 16 mm, or 24 mm). FIG. 29 is a perspective view of a component exposing unit included in a component feeding device 1AB that uses a component storage tape 100A with a small width.

The component storage tape 100A with a small width includes a carrier tape 101A and a cover tape 102A. The carrier tape 101A, which is similar to the carrier tape 101 of the component storage tape 100 with a large width, is a tape having a plurality of component storage portions in which components are stored, the component storage portions being arranged at given intervals. The carrier tape 101A has holes 101bA that are formed only on one end on one side in the width direction of the carrier tape 101A at given intervals. The cover tape 102A is a tape pasted on the carrier tape 101A in such a way as to cover the component storage portions. The cover tape 102A is pasted on the carrier tape 101A by joining both ends in the width direction of the cover tape 102A to the carrier tape 101A. As a result, on the component storage tape 100A, joined portions 103A, which result from the cover tape 102A being joined to the carrier tape 101A, are formed respectively on both ends in the width direction of an upper surface of the carrier tape 101A such that the joined portions 103A extend linearly along edges in the width direction of the cover tape 102A.

In the tape send-off unit 3 that is included in the above component feeding device 1 using the component storage tape 100 with a large width, the first tape send-off portion 31, the second tape send-off portion 32, and the third tape send-off portion 33 each include a pair of sprockets. In a tape send-off unit that is included in the component feeding device 1AB using the component storage tape 100A with a small width, in contrast, a first tape send-off portion, a second tape send-off portion, and a third tape send-off portion each include a sprocket that is disposed on the side on which the sprocket corresponds to the holes 101bA formed on the component storage tape 100A. Each sprocket of the first tape send-off portion, the second tape send-off portion, and the third tape send-off portion, which are included in the component feeding device 1AB, rotates as the teeth of the sprocket are fitted in the holes 101bA of the component storage tape 100A, thereby sending off the component storage tape 100A.

As shown in FIG. 29, the component feeding device 1AB using the component storage tape 100A with a small width includes the component exposing unit 60 of the cover tape separating type, which has been described above as the first modified embodiment. On the component exposing unit 60 of the component feeding device 1AB, the cover tape pre-processing portion 602 separates the cover tape 102A of the component storage tape 100A along the joined portion 103A opposite to the side on which the holes 101bA are formed. The cover tape lifting portion 601 lifts the separated cover tape 102A. Then, the cover tape post-processing portion 603 pushes the lifted part of the cover tape 102A to outside of the side edge opposite to the side on which the cover tape 102A is separated by the cover tape pre-processing portion 602 and folds the lifted part of the cover tape 102A downward. This exposes the component in the component storage portion of the component storage tape 100A so that the component can be taken out.

The width of the cover tape 102A of the component storage tape 100A with a small width is smaller than the width of the cover tape 102 of the component storage tape 100 with a large width. When the component exposing process is carried out on the component storage tape 100A with a tape width of 12 mm or 16 mm, using the component exposing unit 6 of the cover tape cutting type included in the component feeding device 1, it is difficult to push the lifted part of the cover tape 102A outward to an extent that the lifted part is located outside the carrier tape 101A. It is preferable, for this reason, that the component exposing unit 60 of the cover tape separating type be adopted as the component exposing unit that carries out the component exposing process on the component storage tape 100A with a small tape width of 12 mm or 16 mm. As the component exposing unit that carries out the component exposing process on the component storage tape 100A with a tape width of 24 mm, either the component exposing unit 6 of the cover tape cutting type or the component exposing unit 60 of the cover tape separating type may be used.

The above specific embodiments include aspects of the disclosure that offer various configurations in the following manner.

A component feeding device according to an aspect of the present disclosure is a component feeding device that transfers a component to a component take-out position, using a component storage tape including a carrier tape having a plurality of component storage portions each storing the component therein, the component storage portions being arranged at given intervals, and a cover tape having both ends in a width direction joined to the carrier tape such that the cover tape covers the component storage portions. The component feeding device includes: a tape send-off unit that sends off the component storage tape having the cover tape on an upper surface side of the component storage tape toward the component take-out position; a pair of guide walls including guide surfaces having sloped portions of curved shapes that guide both lower surface ends of the component storage tape sent off by the tape send-off unit, respectively, the lower surface ends being both ends of a lower surface of the component storage tape in a tape width direction perpendicular to a tape send-off direction, and that have lowermost downstream ends located on a lower side relative to uppermost upstream ends in the tape send-off direction; a lifting portion disposed between the pair of guide walls, the lifting portion coming in contact with the cover tape of the component storage tape that travels as the lower surface ends thereof are guided by the sloped portions of the guide surfaces, and carrying out a lifting process of lifting the cover tape off the carrier tape; and a post-processing portion that carries out post-processing on the cover tape lifted by the lifting portion. The lifting portion includes: a lifting start portion having a contact starting point at which contact with the cover tape starts, the lifting start portion starting lifting of the cover tape off the carrier tape, from the contact starting point; and a lifting extent adjusting portion continuous with a downstream end in the tape send-off direction of the lifting start portion, the lifting extent adjusting portion continuously increasing an extent of lifting of the cover tape off the carrier tape as the component storage tape travels. The post-processing portion includes an upper regulating portion disposed above and facing the sloped portions of the guide surfaces across a gap, the post-processing portion carrying out first post-processing of pushing a lifted part of the cover tape lifted by the lifting portion to outside of a side edge in the tape width direction of the component storage tape while regulating an upward movement of the lifted part to make the component storage portion open to the outside. The gap between the guide surfaces and the upper regulating portion is determined such that the gap becomes narrower as the gap extends from an upstream side to a downstream side in the tape send-off direction.

According to the component feeding device, the cover tape of the component storage tape, which travels along the sloped portions of the guide surfaces, is lifted off the carrier tape by the lifting process by the lifting portion. After being subjected to the lifting process by the lifting portion, the cover tape is subjected to the post-processing by the post-processing portion. The sloped portions of the guide surfaces are formed into curved shapes in which lowermost downstream ends are located on the lower side relative to uppermost upstream ends in the tape send-off direction. Because of this, compared with a case of placing the lifting portion on guide surfaces extending horizontally along the tape send-off direction, for example, a traveling distance traveled by the component storage tape when it travels along the sloped portions of the guide surfaces and passes the lifting portion is increased. Besides, on the sloped portions of the guide surfaces, the lowermost downstream ends are located on the lower side relative to the uppermost upstream ends in the tape send-off direction. As a result, on the cover tape having been subjected to the lifting process by the lifting portion, the development of a tensile stress acting in a direction of heading from the downstream end in the tape send-off direction to the contact starting point of the lifting start portion is inhibited. Thus, buckling or deformation of the carrier tape caused by the tensile stress of the cover tape is prevented when the lifting portion carries out the lifting process on the cover tape. As a result, smooth traveling of the component storage tape is maintained to allow efficient transfer of the component to the component take-out position.

On the lifting portion, the lifting extent adjusting portion continuously increases an extent of lifting of the cover tape off the carrier tape. The upper regulating portion of the post-processing portion is disposed above and facing the sloped portions of the guide surfaces across a gap, and pushes lifted parts of the cover tape having been subjected to the lifting process to outside of side edges in the tape width direction of the component storage tape while regulating the upward movement of the lifted parts, to make the component storage portion open to the outside. The gap between the upper regulating portion of the post-processing portion and the sloped portions of the guide surfaces is determined such that the gap becomes narrower as the gap extends from the upstream side to the downstream side in the tape send-off direction. In this configuration, the upper regulating portion of the post-processing portion can push the lifted parts of the cover tape outward such that an extent of outward spread of the lifted parts of the cover tape increases in response to the continuous increase in the extent of lifting. As a result, the component storage portion can be opened to the outside effectively, which facilitates taking out the component at the component take-out position.

In the component feeding device, each of the sloped portions of the guide surfaces includes: a first curved area of an upward curved shape; and a second curved area of a downward curved shape, the second curved area being continuous with a downstream side in the tape send-off direction of the first curved area. The lifting portion is disposed such that the contact starting point of the lifting start portion is located on a boundary between the first curved area and the second curved area or located close to the boundary.

In this aspect, on the sloped portions on which the lifting portion is placed, the direction of curve of the first curved areas and that of the second curved areas are different from each other in the vertical direction. The sign of a curvature, therefore, changes in these curved areas. When the component storage tape travels along such sloped portions, a force of causing the component storage tape to warp in the vertical direction acts on the component storage tape, and this force acts in opposite directions respectively in the first curved areas and the second curved areas when the component storage tape passes these curved areas. For this reason, for example, when the cover tape lifting portion is placed on the sloped portions to lie across the first curved areas and the second curved areas, it raises a possibility that the steadiness of the lifting process of lifting the cover tape by the cover tape lifting portion may drop.

To prevent such a case, the cover tape lifting portion is disposed such that the contact starting point of the lifting start portion is located on the boundary between the first curved areas and the second curved areas or located close to the boundary. In such a configuration, the cover tape lifting portion has the contact starting point located on the boundary between the first curved areas and the second curved areas or located close to the boundary, the contact starting point being the uppermost upstream end of the cover tape lifting portion. The cover tape lifting portion, therefore, does not lie across the first curved areas and the second curved areas but lies on the second curved areas. Thus, a drop in the steadiness of the lifting process of lifting the cover tape by the cover tape lifting portion is prevented.

In the above component feeding device, the lifting portion is disposed such that the contact starting point of the lifting start portion is located at a midpoint between the pair of guide walls. The lifting extent adjusting portion includes a pair of lifting adjusting pieces extending from a connection part where the lifting adjusting pieces are connected to the lifting start portion, such that the lifting adjusting pieces extend from an upstream side to a downstream side in the tape send-off direction to approach the pair of guide walls, respectively.

In this aspect, the pair of lifting adjusting pieces making up the lifting extent adjusting portion extend from the connection part, where the lifting adjusting pieces are connected to the lifting start portion, to approach the pair of guide walls, respectively. Such a pair of lifting adjusting pieces making up the lifting extent adjusting portion allow the continuous increase in the extent of lifting of the cover tape off the carrier tape.

In the above component feeding device, each of the sloped portions of the guide surfaces further includes a third curved area that is continuous with a downstream side in the tape send-off direction of the second curved area, the third curved area being an upward curved shape, and that has a lowermost downstream end in the tape send-off direction located on a lower side relative to an uppermost upstream end in the tape send-off direction of the first curved areas, the lowermost downstream end being at a same height in a vertical direction as a height of the component take-out position. The pair of lifting adjusting pieces extend across the second curved area and the third curved area of the sloped portion in the tape send-off direction. The upper regulating portion of the post-processing portion has: a first upper regulating area facing the second curved areas of the sloped portion, the first upper regulating area extending from an upstream side to a downstream side in the tape send-off direction, as a downward slope; and a second upper regulating area continuous with a downstream side in the tape send-off direction of the first upper regulating area, the second upper regulating area facing the third curved area of the sloped portion and extending horizontally along the tape send-off direction.

In this aspect, a gap between the first upper regulating area of the upper regulating portion and the second curved areas of the sloped portions becomes narrower in correspondence to the downward slope of the first upper regulating area. A gap between the second upper regulating area of the upper regulating portion and the third curved areas of the sloped portions, on the other hand, becomes narrower in correspondence to the upward curved shapes of the third curved areas. In other words, a gap between the upper regulating portion and the sloped portions can be determined such that the gap becomes narrower as it extends from the upstream side to the downstream side in the tape send-off direction.

In the component feeding device, the post-processing portion further includes side regulating portions extended downward respectively from both ends in a width direction of the upper regulating portion such that the side regulating portions face the side end faces of the component storage tape from outside of the pair of guide walls in the width direction. Each of the side regulating portions carries out second post-processing of regulating a sidewise movement of a lifted part of the cover tape, the lifted part being pushed outward in the tape width direction by the upper regulating portion, while folding the lifted part downward.

In this aspect, the lifted parts of the cover tape, the lifted parts being pushed outward by the upper regulating portion, can be folded downward by the side regulating portions.

In the component feeding device, the post-processing portion is configured such that in the tape send-off direction, a side regulation starting point, which is a point of starting the downward folding of the lifted parts of the cover tape by the side regulating portions, is located in the second upper regulating area of the upper regulating portion.

When the lifted parts of the cover tape pushed outward by the upper regulating portion are folded downward by the side regulating portions, the carrier tape may possibly buckle or deform. To prevent such a case, the side regulation starting point, which is the point of starting the downward folding of the lifted parts of the cover tape by the side regulating portions, is located in the second upper regulating area of the upper regulating portion, the second upper regulating area extending horizontally in the tape send-off direction. This inhibits the buckling or deformation of the carrier tape when the lifted parts of the cover tape are folded downward from the side regulation starting point.

In the component feeding device, the tape send-off unit starts sending off the component storage tape with a triangular folded piece of the cover tape formed on a tip end of the component storage tape as a result of lifting the cover tape off the carrier tape and folding a lifted part of the cover tape. The component feeding device further includes an insertion member that, between the pair of guide walls, is disposed on the upstream side in the tape send-off direction relative to the lifting portion and that is inserted between the cover tape and the carrier tape of the component storage tape sent off by the tape send-off unit.

In this aspect, the triangular folded pieces of the cover tape formed on the tip end of the component storage tape facilitate insertion of the insertion member between the cover tape and the carrier tape. The lifting start portion of the lifting portion comes in contact with the folded pieces of the cover tape on the tip end of the component storage tape. This helps the lifting start portion smoothly start the lifting of the cover tape. The upper regulating portion of the post-processing portion starts its contact with the cover tape lifted by the lifting portion, by coming in contact with the folded pieces formed on the tip end of the cover tape. This allows the upper regulating portion to smoothly push outward lifted parts of the cover tape lifted by the lifting portion.

A component feeding method according to another aspect of the present disclosure is a component feeding method of sending off a component storage tape having a cover tape on an upper surface side of the component storage tape, the component storage tape including a carrier tape having a plurality of component storage portions each storing the component therein, the component storage portions being arranged at given intervals, and the cover tape pasted to the carrier tape in such a way as to cover the component storage portions, to feed the components. The component feeding method includes: a tape send-off step of sending off the component storage tape toward a component take-out position while guiding both lower surface ends of the component storage tape, the lower surface ends being both ends in a tape width direction of a lower surface of the component storage tape, respectively, by guide surfaces having sloped portions of curved shapes that have lowermost downstream ends located on a lower side relative to uppermost upstream ends in a tape send-off direction; a lifting step of carrying out a lifting process of lifting the cover tape off the carrier tape, using a lifting portion, such that an extent of lifting of the cover tape off the carrier tape increases continuously on the component storage tape that is sent off as the lower surface ends of the component storage tape are guided by the sloped portions of the guide surfaces; and a post-processing step of carrying out post-processing of pushing a lifted part of the cover tape lifted by the lifting portion to outside of a side edge in the tape width direction of the component storage tape while regulating an upward movement of the lifted part by an upper regulating portion, to make the component storage portion open to outside, using a post-processing portion including the upper regulating portion disposed above and facing the sloped portions of the guide surfaces across a gap. The gap between the guide surfaces and the upper regulating portion is determined such that the gap becomes narrower as the gap extends from an upstream side to a downstream side in the tape send-off direction.

According to the component feeding method, at the lifting step, the cover tape of the component storage tape, which travels along the sloped portions of the guide surfaces, is lifted off the carrier tape. After being subjected to the lifting process, the cover tape is subjected to the post-processing at the post-processing step. The sloped portions of the guide surfaces are formed into curved shapes in which lowermost downstream ends are located on the lower side relative to uppermost upstream ends in the tape send-off direction. As a result, on the cover tape having been subjected to the lifting process at the lifting step, the development of a tensile stress acting in a direction of heading from the downstream end in the tape send-off direction to the contact starting point of the lifting portion is inhibited. Thus, buckling or deformation of the carrier tape caused by the tensile stress of the cover tape is prevented when the lifting process of lifting the cover tape is executed at the lifting step. As a result, smooth traveling of the component storage tape is maintained to allow efficient transfer of the component to the component take-out position.

At the lifting step, an extent of lifting of the cover tape off the carrier tape is increased continuously. At the post-processing step, the post-processing portion is used, the post-processing portion including the upper regulating portion disposed above and facing the sloped portions of the guide surfaces across a gap, to outwardly push lifted parts of the cover tape having been subjected to the lifting process while regulating the upward movement of the lifted parts, to make the component storage portion open to the outside. The gap between the upper regulating portion of the post-processing portion and the sloped portions of the guide surfaces is determined such that the gap becomes narrower as the gap extends from the upstream side to the downstream side in the tape send-off direction. As a result, at the post-processing step, the upper regulating portion can push the lifted part of the cover tape outward such that an extent of outward spread of the lifted parts of the cover tape increases in response to the continuous increase in the extent of lifting. As a result, the component storage portion can be opened to the outside effectively, which facilitates taking out the component at the component take-out position.

A component mounter according to still another aspect of the present disclosure includes: a component feeding section that feeds a component; and a head unit having a holding piece that holds the component fed by the component feeding section. In the component feeding section, a plurality of the above component feeding devices are arranged.

This component mounter includes the component feeding device that can transfer a component stored in the component storage tape efficiently to the component take-out position. A drop in the efficiency of production of component-carrying boards by the component mounter is, therefore, prevented.

In the above component mounter, the plurality of component feeding devices include a first component feeding device that feeds a component, using a component storage tape with a first tape width, and a second component feeding device that feeds a component, using a component storage tape with a second tape width larger than the first tape width. On the lifting portions included respectively in the first component feeding device and the second component feeding device, respective boundaries between the lifting start portions and the lifting extent adjusting portions are determined such that the boundary in the second component feeding device is located further upstream in the tape send-off direction than the boundary in the first component feeding device.

In the component feeding device that feeds components using the component storage tape, an extent of lifting of the cover tape, the extent of lifting being required for making the component storage portion open to the outside, gets larger as the tape width of the component storage tape gets larger. In other words, comparing the first component feeding device using the component storage tape with the first tape width with the second component feeding device using the component storage tape with the second tape width larger than the first tape width reveals that the extent of lifting of the cover tape needs to be larger in the second component feeding device than in the first component feeding device.

One method of increasing the extent of lifting of the cover tape is, for example, to design the sloped portions, on which the lifting portion is placed, in such a way as to give the sloped portions a shape in which a traveling distance traveled by the component storage tape when it passes the lifting portion is increased. This means that the shape of the sloped portions of the first component feeding device and the same of the second component feeding device are made different from each other such that the traveling distance on the sloped portions in the second component feeding device becomes longer than the same in the first component feeding device. This method, however, leads to a case where because of the difference in the shape of the sloped portions between the first component feeding device and the second component feeding device, the first component feeding device and the second component feeding device become different from each other in height or length in the tape send-off direction. In this case, therefore, the first component feeding device and the second component feeding device are no longer in a state of being uniformly arranged in the component feeding section. In addition, because of the difference in the traveling distance traveled by the component storage tape on the sloped portions, the first component feeding device and the second component feeding device become also different from each other in component feeding speed.

To deal with such problems, on the above lifting portions included respectively in the first component feeding device and the second component feeding device, respective boundaries between the lifting start portions and the lifting extent adjusting portions are made different in location from each other. Specifically, the boundary in the second component feeding device is located further upstream in the tape send-off direction than the same in the first component feeding device. In the second component feeding device having the boundary located further upstream than the boundary in the first component feeding device, the boundary being between the lifting start portion and the lifting extent adjusting portion, a point of time of starting the continuous increase in the extent of lifting of the cover tape arrives earlier than in the first component feeding device. In this configuration, the extent of lifting of the cover tape, the extent of lifting being required for making the component storage portion open to the outside, can be ensured, using the sloped portions of a common shape, that is, without giving the sloped portions different shapes in accordance with the different tape widths of the component storage tapes.

As described above, according to the present disclosure, it is possible to provide: a component feeding device capable of efficiently transferring a component stored in a component storage tape to a component take-out position, a component feeding method capable of efficiently feeding the component, and a component mounter having the component feeding device.

What is claimed is:

1. A component feeding device that transfers a component to a component take-out position, using a component storage tape including a carrier tape having a plurality of component storage portions each storing the component therein, the component storage portions being arranged at given intervals, and a cover tape having both ends in a width direction joined to the carrier tape such that the cover tape covers the component storage portions, the component feeding device comprising:
 a tape send-off unit configured to send off the component storage tape having the cover tape on an upper surface side of the component storage tape toward the component take-out position;
 a pair of guide walls including guide surfaces having sloped portions of curved shapes configured to guide both lower surface ends of the component storage tape sent off by the tape send-off unit, respectively, the lower surface ends being both ends of a lower surface of the component storage tape in a tape width direction perpendicular to a tape send-off direction, and that have lowermost downstream ends located on a lower side relative to uppermost upstream ends in the tape send-off direction;
 a lifting portion disposed between the pair of guide walls, the lifting portion being configured to contact the cover tape of the component storage tape that travels as the lower surface ends thereof are guided by the sloped portions of the guide surfaces, and perform a lifting process of lifting the cover tape off the carrier tape; and
 a post-processing portion configured to perform post-processing on the cover tape lifted by the lifting portion,
 wherein the lifting portion includes:
 a lifting start portion having a contact starting point at which contact with the cover tape starts, the lifting start portion being configured to start lifting of the cover tape off the carrier tape, from the contact starting point; and
 a lifting extent adjusting portion continuous with a downstream end in the tape send-off direction of the lifting start portion, the lifting extent adjusting portion continuously increasing an extent of lifting of the cover tape off the carrier tape as the component storage tape travels,
 wherein the post-processing portion includes an upper regulating portion disposed above and facing the sloped portions of the guide surfaces across a gap, the post-processing portion being configured to perform first post-processing of pushing a lifted part of the cover tape lifted by the lifting portion to outside of a side edge in the tape width direction of the component storage tape while regulating an upward movement of the lifted part to make the component storage portion open to outside, and
 wherein the gap between the guide surfaces and the upper regulating portion is determined such that the gap becomes narrower as the gap extends from an upstream side to a downstream side in the tape send-off direction.

2. The component feeding device according to claim 1,
 wherein each of the sloped portions of the guide surfaces includes:
 a first curved area of an upward curved shape; and
 a second curved area of a downward curved shape, the second curved area being continuous with a downstream side in the tape send-off direction of the first curved area, and
 wherein the lifting portion is disposed such that the contact starting point of the lifting start portion is located on a boundary between the first curved area and the second curved area or located close to the boundary.

3. The component feeding device according to claim 2,
 wherein the lifting portion is disposed such that the contact starting point of the lifting start portion is located at a midpoint between the pair of guide walls, and
 wherein the lifting extent adjusting portion includes a pair of lifting adjusting pieces extending from a connection part where the lifting adjusting pieces are connected to the lifting start portion, such that the lifting adjusting pieces extend from an upstream side to a downstream side in the tape send-off direction to approach the pair of guide walls, respectively.

4. The component feeding device according to claim 3,
 wherein each of the sloped portions of the guide surfaces further includes a third curved area that is continuous with a downstream side in the tape send-off direction of the second curved area, the third curved area being an upward curved shape, and that has a lowermost downstream end in the tape send-off direction located on a lower side relative to an uppermost upstream end in the tape send-off direction of the first curved area, the lowermost downstream end being at a same height in a vertical direction as a height of the component take-out position,
 wherein the pair of lifting adjusting pieces extend across the second curved area and the third curved area of the sloped portion in the tape send-off direction, and
 wherein the upper regulating portion of the post-processing portion has:
 a first upper regulating area facing the second curved area of the sloped portion, the first upper regulating area extending from an upstream side to a downstream side in the tape send-off direction, as a downward slope; and
 a second upper regulating area continuous with a downstream side in the tape send-off direction of the first upper regulating area, the second upper regulating area facing the third curved area of the sloped portion and extending horizontally along the tape send-off direction.

5. The component feeding device according to claim 4,
 wherein the post-processing portion further includes side regulating portions extended downward respectively from both ends in a width direction of the upper regulating portion such that the side regulating portions face side end faces of the component storage tape from outside of the pair of guide walls in the width direction, and
 wherein each of the side regulating portions is configured to perform second post-processing of regulating a sidewise movement of a lifted part of the cover tape, the lifted part being pushed outward in the tape width direction by the upper regulating portion, while folding the lifted part downward.

6. The component feeding device according to claim 5, wherein the post-processing portion is configured such that in the tape send-off direction, a side regulation starting point serving as a point of starting downward folding of a lifted part of the cover tape by the side regulating portion is located in the second upper regulating area of the upper regulating portion.

7. The component feeding device according to claim 1, wherein the tape send-off unit starts sending off the component storage tape with a triangular folded piece of the cover tape formed on a tip end of the component storage tape as a result of lifting the cover tape off the carrier tape and folding a lifted part of the cover tape, and wherein the component feeding device further comprises an insertion member that, between the pair of guide walls, is disposed on an upstream side in the tape send-off direction relative to the lifting portion and that is inserted between the cover tape and the carrier tape of the component storage tape sent off by the tape send-off unit.

8. A component feeding method of sending off a component storage tape having a cover tape on an upper surface side of the component storage tape, the component storage tape including a carrier tape having a plurality of component storage portions each storing the component therein, the component storage portions being arranged at given intervals, and the cover tape pasted to the carrier tape in such a way as to cover the component storage portions, to feed the components, the component feeding method comprising:

sending off the component storage tape toward a component take-out position while guiding both lower surface ends of the component storage tape, the lower surface ends being both ends in a tape width direction of a lower surface of the component storage tape, respectively, by guide surfaces having sloped portions of curved shapes that have lowermost downstream ends located on a lower side relative to uppermost upstream ends in a tape send-off direction;

lifting the cover tape off the carrier tape, using a lifting portion, such that an extent of lifting of the cover tape off the carrier tape increases continuously on the component storage tape that is sent off as the lower surface ends of the component storage tape are guided by the sloped portions of the guide surfaces; and pushing a lifted part of the cover tape lifted by the lifting portion to outside of a side edge in the tape width direction of the component storage tape while regulating an upward movement of the lifted part by an upper regulating portion to make the component storage portion open to outside, using a post-processing portion including the upper regulating portion disposed above and facing the sloped portions of the guide surfaces across a gap, and wherein the gap between the guide surfaces and the upper regulating portion is determined such that the gap becomes narrower as the gap extends from an upstream side to a downstream side in the tape send-off direction.

9. A component mounter comprising:

a component feeding section that feeds a component; and
a head unit having a holding piece that holds the component fed by the component feeding section, wherein a plurality of the component feeding devices according to claim 1 are arranged in the component feeding section.

10. The component mounter according to claim 9, wherein the plurality of component feeding devices include:

a first component feeding device configured to feed a component, using a component storage tape with a first tape width; and a second component feeding device configured to feed a component, using a component storage tape with a second tape width larger than the first tape width, and wherein on the lifting portions included respectively in the first component feeding device and the second component feeding device, respective boundaries between the lifting start portions and the lifting extent adjusting portions are determined such that the boundary in the second component feeding device is located further upstream in the tape send-off direction than the boundary in the first component feeding device.

11. The component feeding device according to claim 2, wherein the tape send-off unit starts sending off the component storage tape with a triangular folded piece of the cover tape formed on a tip end of the component storage tape as a result of lifting the cover tape off the carrier tape and folding a lifted part of the cover tape, and wherein the component feeding device further comprises an insertion member that, between the pair of guide walls, is disposed on an upstream side in the tape send-off direction relative to the lifting portion and that is inserted between the cover tape and the carrier tape of the component storage tape sent off by the tape send-off unit.

12. The component feeding device according to claim 3, wherein the tape send-off unit starts sending off the component storage tape with a triangular folded piece of the cover tape formed on a tip end of the component storage tape as a result of lifting the cover tape off the carrier tape and folding a lifted part of the cover tape, and wherein the component feeding device further comprises an insertion member that, between the pair of guide walls, is disposed on an upstream side in the tape send-off direction relative to the lifting portion and that is inserted between the cover tape and the carrier tape of the component storage tape sent off by the tape send-off unit.

13. The component feeding device according to claim 4, wherein the tape send-off unit starts sending off the component storage tape with a triangular folded piece of the cover tape formed on a tip end of the component storage tape as a result of lifting the cover tape off the carrier tape and folding a lifted part of the cover tape, and wherein the component feeding device further comprises an insertion member that, between the pair of guide walls, is disposed on an upstream side in the tape send-off direction relative to the lifting portion and that is inserted between the cover tape and the carrier tape of the component storage tape sent off by the tape send-off unit.

14. The component feeding device according to claim 5, wherein the tape send-off unit starts sending off the component storage tape with a triangular folded piece of the cover tape formed on a tip end of the component storage tape as a result of lifting the cover tape off the carrier tape and folding a lifted part of the cover tape, and wherein the component feeding device further comprises an insertion member that, between the pair of guide walls, is disposed on an upstream side in the tape send-off direction relative to the lifting portion and that is inserted between the cover tape and the carrier tape of the component storage tape sent off by the tape send-off unit.

15. The component feeding device according to claim 6, wherein the tape send-off unit starts sending off the component storage tape with a triangular folded piece of the cover tape formed on a tip end of the component storage tape as a result of lifting the cover tape off the carrier tape and folding a lifted part of the cover tape, and wherein the component feeding device further comprises an insertion member that, between the pair of guide walls, is disposed on an upstream side in the tape send-off direction relative to the lifting portion and that is inserted between the cover tape and the carrier tape of the component storage tape sent off by the tape send-off unit.

16. A component mounter comprising:

a component feeding section that feeds a component; and a head unit having a holding piece that holds the component fed by the component feeding section, wherein a plurality of the component feeding devices according to claim 2 are arranged in the component feeding section.

17. A component mounter comprising:

a component feeding section that feeds a component; and a head unit having a holding piece that holds the component fed by the component feeding section, wherein a plurality of the component feeding devices according to claim 3 are arranged in the component feeding section.

18. A component mounter comprising:

a component feeding section that feeds a component; and a head unit having a holding piece that holds the component fed by the component feeding section, wherein a plurality of the component feeding devices according to claim 4 are arranged in the component feeding section.

19. A component mounter comprising:

a component feeding section that feeds a component; and a head unit having a holding piece that holds the component fed by the component feeding section, wherein a plurality of the component feeding devices according to claim 5 are arranged in the component feeding section.

20. A component mounter comprising:

a component feeding section that feeds a component; and a head unit having a holding piece that holds the component fed by the component feeding section, wherein a plurality of the component feeding devices according to claim 6 are arranged in the component feeding section.

* * * * *